United States Patent
Takahashi et al.

(10) Patent No.: US 8,803,785 B2
(45) Date of Patent: Aug. 12, 2014

(54) SCANNING SIGNAL LINE DRIVE CIRCUIT AND DISPLAY DEVICE HAVING THE SAME

(75) Inventors: Yoshihisa Takahashi, Osaka (JP); Yasuaki Iwase, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 180 days.

(21) Appl. No.: 13/636,148

(22) PCT Filed: Jan. 18, 2011

(86) PCT No.: PCT/JP2011/050781
§ 371 (c)(1),
(2), (4) Date: Sep. 20, 2012

(87) PCT Pub. No.: WO2011/129126
PCT Pub. Date: Oct. 20, 2011

(65) Prior Publication Data
US 2013/0009856 A1  Jan. 10, 2013

(30) Foreign Application Priority Data

Apr. 12, 2010 (JP) ................. 2010-091076

(51) Int. Cl.
*G09G 3/36* (2006.01)
*G11C 19/28* (2006.01)
*H01L 27/32* (2006.01)
*H03K 3/356* (2006.01)
*G11C 19/18* (2006.01)

(52) U.S. Cl.
CPC ........... *G11C 19/28* (2013.01); *H01L 27/32* (2013.01); *H03K 3/356026* (2013.01); *G11C 19/184* (2013.01); *G09G 3/3677* (2013.01)
USPC ............................... 345/100; 345/82

(58) Field of Classification Search
USPC ............ 345/87, 92, 204, 98–100, 211–214; 377/64–81
See application file for complete search history.

(56) References Cited

U.S. PATENT DOCUMENTS

2003/0002615 A1   1/2003   Morosawa et al.
2006/0071890 A1   4/2006   Kikuchi
(Continued)

FOREIGN PATENT DOCUMENTS

| JP | 2001-052494 A | 2/2001 |
|---|---|---|
| JP | 2003-016794 A | 1/2003 |
| JP | 2005-094335 A | 4/2005 |
| JP | 2006-106394 A | 4/2006 |

(Continued)

OTHER PUBLICATIONS

Official Communication issued in International Patent Application No. PCT/JP2011/050781, mailed on Apr. 12, 2011.

*Primary Examiner* — Abbas Abdulselam
(74) *Attorney, Agent, or Firm* — Keating & Bennett, LLP

(57) ABSTRACT

Stability of a circuit operation in a monolithic gate driver is improved. A bistable circuit is provided with a charge replenishment circuit (71) including: a capacitor (CAP2); a thin-film transistor (MA) having a first electrode supplied with a first clock for charge replenishment (CKA), a second electrode connected to a third-node (N3) connected to one end of the capacitor (CAP2), and a third electrode connected to a second-node (N2) to be maintained at the high level during a normal operation period; and a thin-film transistor (MB) having a first electrode supplied with a second clock for charge replenishment (CKB), a second electrode supplied with a high-level DC power supply potential (VDD), and a third electrode connected to the third-node (N3). The first clock for charge replenishment (CKA) and the second clock for charge replenishment (CKB) are alternately driven to the high level so as to eliminate a period in which "the first clock for charge replenishment (CKA) is at the high level and the second clock for charge replenishment (CKB) is at the high level".

28 Claims, 44 Drawing Sheets

(56) References Cited

U.S. PATENT DOCUMENTS

| | | |
|---|---|---|
| 2006/0071923 A1 | 4/2006 | Lee et al. |
| 2008/0187089 A1* | 8/2008 | Miyayama et al. ............ 377/79 |
| 2010/0141641 A1 | 6/2010 | Furuta et al. |

FOREIGN PATENT DOCUMENTS

| | | |
|---|---|---|
| JP | 2006-107692 A | 4/2006 |
| JP | 2006-127630 A | 5/2006 |
| WO | 2009/034749 A1 | 3/2009 |

* cited by examiner

SCANNING SIGNAL LINE DRIVE CIRCUIT AND DISPLAY DEVICE HAVING THE SAME

TECHNICAL FIELD

The present invention relates to a display device and a drive circuit of the display device, and in particular to a scanning signal line drive circuit configured by a plurality of shift registers for driving scanning signal lines which are arrayed in a display unit of the display device.

BACKGROUND ART

In recent years, as for liquid crystal display devices, a gate driver (scanning signal line drive circuit) for driving gate bus lines (scanning signal lines) have become increasingly monolithic. Conventionally, a gate driver has mostly been mounted as an IC (Integrated Circuit) chip on a peripheral part of a substrate that constitutes a liquid crystal panel. However, in recent years, it has gradually become more common to provide a gate driver directly on a substrate. Such a gate driver is called such as a "monolithic gate driver". In a liquid crystal display device provided with a monolithic gate driver, a thin-film transistor using amorphous silicon (a-Si) (hereinafter referred to as an "a-SiTFT") has been conventionally employed as a drive element. However, a thin-film transistor using microcrystalline silicon (μc-Si) or oxide semiconductor (e.g., IGZO) has become commonly employed in recent years. Mobility of microcrystalline silicon and oxide semiconductor is greater than that of amorphous silicon. Therefore, it is possible to achieve reduction of a picture-frame area and improved resolution by employing a thin-film transistor using microcrystalline silicon or oxide semiconductor as the drive element.

A display unit of an active matrix-type liquid crystal display device includes a plurality of source bus lines (video signal lines), a plurality of gate bus lines, and a plurality of pixel formation portions provided respectively corresponding to intersections between the plurality of source bus lines and the plurality of gate bus lines. These pixel formation portions are arranged in matrix to constitute a pixel array. Each pixel formation portion includes a thin-film transistor as a switching element having a gate terminal connected to a gate bus line that passes through the corresponding intersection and a source terminal connected to a source bus lines that passes through this intersection, a pixel capacitance for storing a pixel voltage value, and so on. Such an active matrix-type liquid crystal display device is also provided with the above-described gate driver, and a source driver (video signal line drive circuit) for driving the source bus lines.

Although video signals indicating pixel voltage values are transmitted through the source bus lines, the source bus lines cannot transmit video signals indicating pixel voltage values for more than one line at one time (simultaneously). Therefore, writing (charging) of the video signals to the pixel capacitances in the pixel formation portions arranged in matrix is performed sequentially line by line. Thus, the gate driver is configured by a shift register having a plurality of stages so that the plurality of gate bus lines are sequentially selected for a predetermined period. Each stage of the shift register constitutes a bistable circuit that takes one of two states (a first state and a second state) at one time point, and outputs a signal indicating this state (hereinafter referred to as a "state signal") as a scanning signal. Then, the writing of the video signals to the pixel capacitances is sequentially performed line by line, as described above, based on sequential output of active scanning signals from a plurality of bistable circuits within the shift register.

In a conventional display device, the bistable circuit is configured as illustrated in FIG. 50 (FIG. 1 of Japanese Patent Application Laid-Open No. 2006-107692) or in FIG. 51 (FIG. 14 of Japanese Patent Application Laid-Open No. 2006-107692). In such a bistable circuit, when a scanning signal Gn-1 supplied from a previous stage is driven to a high level, a transistor group TG1 is turned to an ON state, and therefore a potential of a second-node N2 is turned to a low level. With this, transistors TG3 and TR4 are turned to an OFF state. Accordingly, by the scanning signal Gn-1 being driven to the high level, a potential of a first-node N1 is turned to the high level, and an output capacitor Cb is charged. In this state, a potential of a clock CK appears in the gate bus lines. As described above, by turning the potential of the clock CK given to each bistable circuit to the high level after the scanning signal Gn-1 supplied from the previous stage is driven to the high level in the each bistable circuit, active scanning signals are outputted sequentially from the plurality of bistable circuits within the shift register. With this, the plurality of gate bus lines are driven sequentially line by line. In each bistable circuit, the potential of the second-node N2 is maintained at the high level so that the potential of the first-node N1 is maintained at the low level during a period (a "normal operation period" that will be later described) other than a period in which the operation for outputting an active scanning signal is carried out.

Further, Japanese Patent Application Laid-Open No. 2001-52494, Japanese Patent Application Laid-Open No. 2003-16794, Japanese Patent Application Laid-Open No. 2005-94335, Japanese Patent Application Laid-Open No. 2006-106394, and Japanese Patent Application Laid-Open No. 2006-127630 also disclose a configuration of a shift register (bistable circuit) provided for a display device and such.

PRIOR ART DOCUMENTS

Patent Documents

[Patent Document 1] Japanese Patent Application Laid-Open No. 2006-107692
[Patent Document 2] Japanese Patent Application Laid-Open No. 2001-52494
[Patent Document 3] Japanese Patent Application Laid-Open No. 2003-16794
[Patent Document 4] Japanese Patent Application Laid-Open No. 2005-94335
[Patent Document 5] Japanese Patent Application Laid-Open No. 2006-106394
[Patent Document 6] Japanese Patent Application Laid-Open No. 2006-127630

SUMMARY OF THE INVENTION

Problems to be Solved by the Invention

However, according to the conventional configuration, a circuit operation lacks stability as described below. According to the configurations illustrated in FIG. 50 and FIG. 51, a capacitance Ccharge is used in order to maintain the potential of the second-node N2 at the high level during the normal operation period. Here, in the case where the normal operation period is extended due to such as low-frequency driving, the potential of the second-node N2 may decrease during the normal operation period due to a current leakage at a transistor connected to the second-node N2. When the potential of the second-node N2 decreases, transistors TG3 and TR4 are not fully turned to the ON state, and the potential of the first-node N1 is not maintained at the low level. As a result, it is not possible to suppress an influence of noises occurring in the first-node N1 and an outputted signal Gn during the normal operation period, and the circuit operation becomes unstable. In particular, in a case of a large-sized panel or a high-definition panel, a gate driver needs a large driving force, and therefore a size of the transistors is enlarged. Accordingly, the current leakage in the transistors also become large, and there is a concern about an abnormal operation attributed to a decrease of the potential of the second-node N2.

Thus, an object of the present invention is to improve stability of a circuit operation in a monolithic gate driver.

Means for Solving the Problems

A first aspect of the present invention is directed to a scanning signal line drive circuit of a display device, that drives a plurality of scanning signal lines which are arrayed in a display unit, the circuit comprising:
 a shift register having a plurality of bistable circuits connected in series with each other, outputted signals from the plurality of bistable circuits being sequentially driven active based on a plurality of clock signals that are externally inputted and cyclically repeat a first level and a second level, wherein
 each bistable circuit includes:
 a first-input-node configured to receive an outputted signal from a bistable circuit of a stage before the each bistable circuit as a set signal;
 a first-output-node connected to the scanning signal line and configured to output an outputted signal from the each bistable circuit as a scanning signal for driving the scanning signal line;
 a first output control switching element having a second electrode supplied with one of the plurality of clock signals as a first clock for operation control and a third electrode connected to the first-output-node;
 a first-node turnon switching element configured to change a level of a first-node to an ON level based on the set signal, the first-node being connected to a first electrode of the first output control switching element;
 at least one of a first first-node turnoff switching element and a first first-output-node turnoff switching element, the first first-node turnoff switching element having a second electrode connected to the first-node and being configured to change the level of the first-node to an OFF level, the first first-output-node turnoff switching element having a second electrode connected to the first-output-node, having a third electrode supplied with an OFF level potential, and being configured to change a level of the first-output-node to the OFF level;
 a second-node turnoff switching element having a second electrode connected to a second-node, having a third electrode supplied with an OFF level potential, and configured to turn the second-node to the OFF level during a period in which the first-node is to be maintained at the ON level, the second-node being connected to a first electrode of at least one of the first first-node turnoff switching element and the first first-output-node turnoff switching element;
 a first charge replenishment switching element having a first electrode supplied with one of the plurality of clock signals as a first clock for charge replenishment and having a third electrode connected to the second-node;
 a capacitative element having one end connected to a third-node connected to a second electrode of the first charge replenishment switching element; and
 a second charge replenishment switching element having a third electrode connected to the third-node, having a first electrode supplied with one of the plurality of clock signals as a second clock for charge replenishment, and configured to charge the capacitative element based on the second clock for charge replenishment,
 the first charge replenishment switching element is turned to an ON state when the first clock for charge replenishment is at the first level,
 the second charge replenishment switching element is turned to an ON state when the second clock for charge replenishment is at the first level, and
 when the first clock for charge replenishment is at the first level, the second clock for charge replenishment is at the second level.

According to a second aspect of the present invention, in the first aspect of the present invention,
 each bistable circuit includes, as the second-node turnoff switching element:
 a first second-node turnoff switching element having a first electrode connected to the first-input-node, a second electrode connected to the second-node, and a third electrode supplied with an OFF level potential; and
 a second second-node turnoff switching element having a first electrode connected to the first-output-node, a second electrode connected to the second-node, and a third electrode supplied with an OFF level potential.

According to a third aspect of the present invention, in the first aspect of the present invention,
 each bistable circuit includes, as the second-node turnoff switching element, a third second-node turnoff switching element having a first electrode connected to the first-node, a second electrode connected to the second-node, and a third electrode supplied with an OFF level potential.

According to a fourth aspect of the present invention, in the first aspect of the present invention,
 each bistable circuit further includes:
 a second-input-node configured to receive an outputted signal from a bistable circuit of a stage after the each bistable circuit as a reset signal; and
 a first second-node turnon switching element configured to change a level of the second-node to the ON level based on the reset signal.

According to a fifth aspect of the present invention, in the first aspect of the present invention,
 in each bistable circuit, a potential of the second-node is maintained at a substantially constant potential based on a high-level DC power supply potential during a period in which the first-node is to be maintained at the OFF level.

According to a sixth aspect of the present invention, in the first aspect of the present invention,
 each bistable circuit includes the first first-node turnoff switching element, and
 a third electrode of the first first-node turnoff switching element is connected to the first-output-node.

According to a seventh aspect of the present invention, in the first aspect of the present invention,
 each bistable circuit further includes:
 a second-input-node configured to receive an outputted signal from a bistable circuit of a stage after the each bistable circuit as a reset signal; and
 a second first-output-node turnoff switching element having a first electrode connected to the second-input-node, a second electrode connected to the first-output-node, and a third electrode supplied with an OFF level potential.

According to an eighth aspect of the present invention, in the first aspect of the present invention, each bistable circuit further includes:

a second-input-node configured to receive an outputted signal from a bistable circuit of a stage after the each bistable circuit as a reset signal; and a second first-node turnoff switching element having a first electrode connected to the second-input-node, a second electrode connected to the first-node, and a third electrode supplied with an OFF level potential.

According to a ninth aspect of the present invention, in the first aspect of the present invention, the first-node turnon switching element is a thin-film transistor having a multichannel structure.

According to a tenth aspect of the present invention, in the first aspect of the present invention, each bistable circuit includes the first first-node turnoff switching element, and the first first-node turnoff switching element is a thin-film transistor having a multichannel structure.

According to an eleventh aspect of the present invention, in the first aspect of the present invention, each bistable circuit further includes:

a second-input-node configured to receive an outputted signal from a bistable circuit of a stage after the each bistable circuit as a reset signal;

a second-output-node configured to output an outputted signal from the each bistable circuit as a different stage control signal for controlling an operation of a bistable circuit other than the each bistable circuit; and a second output control switching element having a first electrode connected to the first-node, a second electrode connected to the second electrode of the first output control switching element, and a third electrode connected to the second-output-node, wherein the different stage control signal outputted from each bistable circuit is supplied to a bistable circuit of a stage before the each bistable circuit as the reset signal.

According to a twelfth aspect of the present invention, in the first aspect of the present invention, each bistable circuit further includes:

a second-output-node configured to output an outputted signal from the each bistable circuit as a different stage control signal for controlling an operation of a bistable circuit other than the each bistable circuit; and a second output control switching element having a first electrode connected to the first-node, a second electrode connected to the second electrode of the first output control switching element, and a third electrode connected to the second-output-node, wherein the different stage control signal outputted from each bistable circuit is supplied to a bistable circuit of a stage after the each bistable circuit as the set signal.

According to a thirteenth aspect of the present invention, in the eleventh aspect of the present invention, each bistable circuit further includes:

a second-input-node configured to receive an outputted signal from a bistable circuit of a stage after the each bistable circuit as a reset signal; and a first second-node turnon switching element configured to change a level of the second-node to the ON level based on the reset signal, wherein a second electrode of the first second-node turnon switching element is supplied with one of the plurality of clock signals that is different from a signal supplied to the second electrode of the first output control switching element.

According to a fourteenth aspect of the present invention, in the eleventh aspect of the present invention, the second electrode of the first output control switching element is supplied with a DC power supply potential in place of one of the plurality of clock signals.

According to a fifteenth aspect of the present invention, in the fourteenth aspect of the present invention, the following expression is satisfied, where an amplitude voltage of the plurality of clock signals is VCK, and a voltage of the scanning signal when the scanning signal line is driven taking a potential on a low level side of the plurality of clock signals as a reference is VGH.

$$VGH \geq VCK \geq VGH/2$$

According to a sixteenth aspect of the present invention, in the first aspect of the present invention, each bistable circuit further includes:

a third-input-node configured to receive a signal externally supplied as a clear signal; and a second second-node turnon switching element configured to change a level of the second-node to the ON level based on the clear signal.

According to a seventeenth aspect of the present invention, in the sixteenth aspect of the present invention, each bistable circuit further includes:

a second-input-node configured to receive an outputted signal from a bistable circuit of a stage after the each bistable circuit as a reset signal; and a first second-node turnon switching element configured to change the level of the second-node to the ON level based on the reset signal, wherein a last stage bistable circuit out of the plurality of bistable circuits is supplied with the clear signal as the reset signal.

According to an eighteenth aspect of the present invention, in the sixteenth aspect of the present invention, each bistable circuit further includes:

a fourth-input-node configured to receive a signal externally supplied as a refresh signal; and a second-node level lowering switching element configured to change the level of the second-node to a level lower than the OFF level based on the refresh signal.

According to a nineteenth aspect of the present invention, in the first aspect of the present invention, each bistable circuit further includes:

a third-input-node configured to receive a signal externally supplied as a clear signal;

a second second-node turnon switching element configured to change a level of the second-node to the ON level based on the clear signal; and a second-node level lowering switching element configured to change the level of the second-node to a level lower than the OFF level based on the clear signal.

According to a twentieth aspect of the present invention, in the first aspect of the present invention, depending on the clock signal inputted to each bistable circuit as the first clock for operation control, the clock signal inputted to the each bistable circuit as the first clock for charge replenishment and the clock signal inputted to the each bistable circuit as the second clock for charge replenishment are determined.

According to a twenty-first aspect of the present invention, in the twentieth aspect of the present invention, the clock signal inputted to each bistable circuit as the first clock for operation control is inputted to the each bistable circuit as the second clock for charge replenishment, and a clock signal out of phase with the first clock for operation control by 180 degrees is inputted to the each bistable circuit as the first clock for charge replenishment.

According to a twenty-second aspect of the present invention, in the first aspect of the present invention, the plurality of bistable circuits are configured by a plurality of bistable-circuit pairs connected in series with each other, each bistable-circuit pair being constituted by two consecutive stages of bistable circuits, and in the bistable-circuit pair, the second electrode of the first charge replenishment switching element included in the bistable circuit of a previous stage is connected to the second electrode of the first charge replenishment switching element in the bistable circuit of a next stage, the capacitative element and the second charge replenishment switching element are shared between the previous stage bistable circuit and the next stage bistable circuit.

According to a twenty-third aspect of the present invention, in the twenty-second aspect of the present invention, the previous stage bistable circuit in the bistable-circuit pair includes, as the second-node turnoff switching element, a first second-node turnoff switching element having a first electrode connected to the first-input-node, a second electrode connected to the second-node, and a third electrode supplied with an OFF level potential, the next stage bistable circuit in the bistable-circuit pair includes, as the second-node turnoff switching element, a second second-node turnoff switching element having a first electrode connected to the first-output-node, a second electrode connected to the second-node, and a third electrode supplied with an OFF level potential, and the bistable-circuit pair includes a fourth second-node turnoff switching element having a first electrode connected to the first-output-node of the previous stage bistable circuit, a second electrode connected to the third-node, and a third electrode supplied with an OFF level potential.

According to a twenty-fourth aspect of the present invention, in the twenty-third aspect of the present invention, in the previous stage bistable circuit, a level of the second-node changes to the OFF level by the first charge replenishment switching element and the fourth second-node turnoff switching element being turned to the ON state during a period in which an outputted signal from this bistable circuit is active, and in the next stage bistable circuit, the level of the second-node changes to the OFF level by the first charge replenishment switching element and the fourth second-node turnoff switching element being turned to the ON state during the period in which an outputted signal from the previous stage bistable circuit is active.

According to a twenty-fifth aspect of the present invention, in the first aspect of the present invention, all of the switching elements included in each bistable circuit are respectively constituted by thin-film transistors of an identical channel.

A twenty-sixth aspect of the present invention is directed to a display device, comprising:

the display unit; and the scanning signal line drive circuit according to the first aspect of the present invention.

A twenty-seventh aspect of the present invention is directed to a method of driving a plurality of scanning signal lines which are arrayed in a display unit by a scanning signal line drive circuit including a shift register, outputted signals from the plurality of bistable circuits being sequentially driven active based on a plurality of clock signals that are externally inputted and cyclically repeat a first level and a second level, the method comprising:

a first switching element control step of changing a state of a first switching element included in each bistable circuit; and a second switching element control step of changing a state of a second switching element included in each bistable circuit, wherein each bistable circuit includes:

a first-input-node configured to receive an outputted signal from a bistable circuit of a stage before the each bistable circuit as a set signal;

a first-output-node connected to the scanning signal line and configured to output an outputted signal from the each bistable circuit as a scanning signal for driving the scanning signal line;

a first output control switching element having a second electrode supplied with one of the plurality of clock signals as a first clock for operation control and a third electrode connected to the first-output-node;

a first-node turnon switching element configured to change a level of a first-node to an ON level based on the set signal, the first-node being connected to a first electrode of the first output control switching element;

at least one of a first first-node turnoff switching element and a first first-output-node turnoff switching element, the first first-node turnoff switching element having a second electrode connected to the first-node and being configured to change the level of the first-node to the OFF level, the first first-output-node turnoff switching element having a second electrode connected to the first-output-node, having a third electrode supplied with an OFF level potential, and being configured to change a level of the first-output-node to the OFF level;

a second-node turnoff switching element having a second electrode connected to a second-node, having a third electrode supplied with an OFF level potential, and configured to turn the second-node to the OFF level during a period in which the first-node is to be maintained at the ON level, the second-node being connected to a first electrode of at least one of the first first-node turnoff switching element and the first first-output-node turnoff switching element;

the first switching element having a first electrode supplied with one of the plurality of clock signals as a first clock for charge replenishment and a third electrode connected to the second-node;

a capacitative element having one end connected to a third-node connected to a second electrode of the first switching element; and the second switching element having a third electrode connected to the third-node, having a first electrode supplied with one of the plurality of clock signals as a second clock for charge replenishment, and configured to charge the capacitative element based on the second clock for charge replenishment, the first switching element control step includes:

a first switching element turnon step of turning the first switching element to an ON state by turning the first clock for charge replenishment to the first level; and a first switching element turnoff step of turning the first switching element to an OFF state by turning the first clock for charge replenishment to the second level, the second switching element control step includes:
- a second switching element turnon step of turning the second switching element to an ON state by turning the second clock for charge replenishment to the first level; and
- a second switching element turnoff step of turning the second switching element to an OFF state by turning the second clock for charge replenishment to the second level, during a period after the first switching element turnon step is performed until the first switching element turnoff step is performed, the second switching element turnon step and the second switching element turnoff step are not performed, and during a period after the second switching element turnon step is performed until the second switching element turnoff step is performed, the first switching element turnon step and the first switching element turnoff step are not performed.

Effects of the Invention

According to the first aspect of the present invention, each of bistable circuits included in a shift register that constitutes a scanning signal line drive circuit is provided with: a first charge replenishment switching element having a first electrode supplied with one of a plurality of clock signals as a first clock for charge replenishment, a second electrode connected to a third-node, and a third electrode connected to a second-node; a capacitative element having one end connected to the third-node; and a second charge replenishment switching element having a first electrode supplied with one of the plurality of clock signals as a second clock for charge replenishment and a third electrode connected to the third-node, and configured to charge the capacitative element based on the second clock for charge replenishment. Further, the first charge replenishment switching element and the second charge replenishment switching element are alternately turned to the ON state. When the second charge replenishment switching element is in the ON state, the capacitative element is charged. When the first charge replenishment switching element is in the ON state, an electric charge accumulated in the capacitative element is supplied to the second-node. In this manner, an electric charge is supplied to the second-node every predetermined period. Accordingly, even when a current leakage occurs in a switching element (e.g., a thin-film transistor) connected to the second-node in a period in which the second-node is to be maintained at an ON level, the potential of the second-node is reliably maintained at an ON level by the supply of an electric charge. In this case, as the first charge replenishment switching element and the second charge replenishment switching element are not turned to the ON state at the same time, a flow-through current may not occur. With this, stability of a circuit operation is improved as compared to the conventional configuration.

According to the second aspect of the present invention, the first electrode of the first second-node turnoff switching element is supplied with a potential of the first-input-node, and the first electrode of the second second-node turnoff switching element is supplied with a potential of the first-output-node. Accordingly, the first second-node turnoff switching element is turned to the ON state during a set period, and the second second-node turnoff switching element is turned to the ON state during a selection period. With this, the second-node is reliably turned to the OFF level in the set period and the selection period, and the stability of the circuit operation is improved.

According to the third aspect of the present invention, the first electrode of the third second-node turnoff switching element is supplied with a potential of the first-node. Accordingly, the third second-node turnoff switching element is turned to the ON state during the set period and the selection period. With this, the second-node is reliably turned to the OFF level during the set period and the selection period, and the stability of the circuit operation is improved.

According to the fourth aspect of the present invention, regardless of the timing at which the level of the first clock for charge replenishment supplied to the first electrode of the first charge replenishment switching element changes and each sizes of the switching elements provided in within the bistable circuit, the level of the second-node quickly changes to the ON level in the period in which the level of the second-node is to be changed from the OFF level to the ON level.

According to the fifth aspect of the present invention, it is possible to realize a scanning signal line drive circuit suitable for a configuration in which a thin-film transistor having a small threshold shift (such as microcrystalline silicon or oxide semiconductor) is used as the switching element.

According to the sixth aspect of the present invention, the third electrode of the first first-node turnoff switching element is supplied with the outputted signal from the bistable circuit. Accordingly, a voltage between the second electrode and the third electrode of the first first-node turnoff switching element during the selection period becomes relatively small. With this, an outflow of an electric charge from the first-node via the first first-node turnoff switching element is suppressed. As a result, the potential of the first-node is reliably maintained at the high level during the selection period, and the stability of the circuit operation is effectively improved. Further, as the timing of turn-off of the first-node comes after the timing of turn-off of the first-output-node, an action of the first output control switching element to turn off the first-output-node becomes stronger, and it is possible to turn off the first-output-node more quickly. With this, it is possible to operate the circuit at high speed.

According to the seventh aspect of the present invention, each bistable circuit of the shift register that constitutes the scanning signal line drive circuit includes the second first-output-node turnoff switching element configured to change the level of the first-output-node to the OFF level based on the reset signal. Accordingly, by the potential of the reset signal changing (by the potential of the reset signal changing from the low level to the high level, for example, when a thin-film transistor of an n-channel type is employed as a switching element), the potential of the first-output-node directly changes to the OFF level. Further, during a period in which the potential of the first-output-node should be changed from the ON level to the OFF level (reset period), the two switching elements (the first first-output-node turnoff switching element and the second first-output-node turnoff switching element) function so that the potential of the first-output-node decreases. Accordingly, even when a load capacitance of the scanning signal line is large, it is possible to quickly turn the potential of the first-output-node to the OFF level during the reset period, and therefore outputting an abnormal pulse from the first-output-node is suppressed.

According to the eighth aspect of the present invention, each bistable circuit of the shift register that constitutes the scanning signal line drive circuit includes the second first-node turnoff switching element configured to change the level of the first-node to the OFF level based on the reset signal. Accordingly, the potential of the first-node directly changes to the OFF level by the potential of the reset signal changing. Further, during the reset period, the two switching elements (the first first-node turnoff switching element and the second first-node turnoff switching element) function so that the potential of the first-node decreases. Accordingly, it is possible to reliably turn the potential of the first-node to the OFF level during the reset period even in a case in which the circuit is operated at high speed, and the stability of the circuit operation is improved.

According to the ninth aspect of the present invention, an increase of the potential of the first-node during the set period becomes relatively small, and an OFF current of the first-node turnon switching element becomes relatively small. Accordingly, the potential of the first-node at a time point when the selection period ends is relatively low while maintaining the potential required for output control. With this, a voltage supplied to the first electrode of the first output control switching element decreases, and breakdown of the first output control switching element is suppressed. In addition, as the current leakage from the first-node is suppressed, the stability of the circuit operation is improved.

According to the tenth aspect of the present invention, the OFF current of the first first-node turnoff switching element becomes relatively small. Accordingly, even when a thin-film transistor having a large leak current is employed as the switching element, it is possible to sufficiently increase the potential of the first-output-node during the selection period, and to quickly decrease the potential of the first-output-node during the reset period.

According to the eleventh aspect of the present invention, for each bistable circuit of the shift register, the signal for driving a scanning signal line corresponding to the each bistable circuit and the signal for controlling an operation of a bistable circuit of a previous stage of the each bistable circuit are different. Accordingly, it is possible to make waveform bluntness of the reset signal small in each bistable circuit. With this, even when a load capacitance of the scanning signal line is large, the operation based on the reset signal is quickly performed in each bistable circuit, and the reliability of the circuit operation is improved.

According to the twelfth aspect of the present invention, for each bistable circuit of the shift register, the signal for driving a scanning signal line corresponding to the each bistable circuit and the signals for controlling operations of bistable circuits of a previous stage and a next stage of the each bistable circuit are different. Accordingly, it is possible to make waveform bluntness of the set signal in each bistable circuit. With this, even when a load capacitance of the scanning signal line is large, the operation based on the set signal is quickly performed in each bistable circuit, and the stability of the circuit operation is improved.

According to the thirteenth aspect of the present invention, as the second electrode of the first second-node turnon switching element is supplied with the clock signal, the power supply voltage becomes an electric charge supply source of the first second-node turnon switching element. Further, a load applied to the second-input-node is reduced. Accordingly, a flow of an electric charge from the second-input-node to the second-node is prevented, and the potential of the second-input-node quickly changes. Moreover, a period in which a negative voltage is applied between the first electrode and the second electrode of the first second-node turnon switching element is reduced. Accordingly, deterioration of the first second-node turnon switching element is suppressed. Furthermore, similarly to the eleventh aspect of the present invention, the waveform bluntness of the reset signal becomes small. With this, a decrease of the potential of the second-node in the period after the reset period ends is suppressed.

According to the fourteenth aspect of the present invention, as the second electrode of the first output control switching element is supplied with the DC power supply potential, the change of the potential of the first-output-node from the OFF level to the ON level starts in the set period. Accordingly, the scanning signal line is quickly turned to the selected state in the selection period, and charging time of the pixel capacitance is sufficiently ensured. Further, as compared to the configuration in which the second electrode of the first output control switching element is supplied with the clock signal, a load applied to the wiring for the clock signal is reduced. Accordingly, an occurrence of the waveform bluntness in the clock signal is suppressed, and the power consumption is reduced.

According to the fifteenth aspect of the present invention, the potential of the scanning signal is sufficiently turned to the ON level in the selection period, and it is possible to obtain an effect of power consumption reduction.

According to the sixteenth aspect of the present invention, by turning the second second-node turnon switching element to the ON state based on the clear signal before the shift register starts to operate, the potential of the first-node and the potential of the first-output-node are turned to the OFF level in all the bistable circuits at a time point at which the shift register starts to operate, and therefore the stability of the circuit operation is improved.

According to the seventeenth aspect of the present invention, it is possible to obtain the same effect as that in the sixteenth aspect of the present invention while reducing a number of signals.

According to the eighteenth aspect of the present invention, by turning the second-node level lowering switching element to the ON state based on the refresh signal, it is possible to decrease the level of the second-node to a level lower than the OFF level. Accordingly, it is possible to suppress the threshold shift of the switching element whose first electrode is connected to the second-node (the first first-node turnoff switching element and the first first-output-node turnoff switching element).

According to the nineteenth aspect of the present invention, it is possible to obtain the same effect as that in the eighteenth aspect of the present invention without using the refresh signal.

According to the twentieth aspect of the present invention, waveforms of the first clock for charge replenishment in all of the bistable circuits become identical and waveforms of the second clock for charge replenishment in all of the bistable circuits become identical. With this, an electric charge is supplied to the second-node in the same manner in all of the bistable circuits, and it is possible to suppress an occurrence of display unevenness.

According to the twenty-first aspect of the present invention, the clock signal supplied to the second electrode of the first output control switching element and the clock signal supplied to the first electrode of the second charge replenishment switching element are shared. Accordingly, it is possible to reduce a number of clock signals required for driving the shift register. In addition, during the selection period in which the first first-node turnoff switching element should be reliably turned to the OFF state so as to maintain the potential of the first-node at the ON level, as the clock signal supplied to the first electrode of the first charge replenishment switching element as the first clock for charge replenishment is turned to the OFF level, the first charge replenishment switching element is turned to the OFF state. Accordingly, during the selection period, supply of an electric charge to the second-node via the first charge replenishment switching element is not performed. With this, during the selection period, the potential of the second-node is reliably maintained at the OFF level, and the first first-node turnoff switching element is reliably maintained at the OFF state. As a result, it is possible to suppress the potential of the first-node to be turned to the OFF level during the selection period, and the stability of the circuit operation is improved.

According to the twenty-second aspect of the present invention, the bistable-circuit pair is constituted by two consecutive stages of bistable circuits, and the capacitative element and the second charge replenishment switching element are shared between the previous stage bistable circuit and the next stage bistable circuit. Accordingly, it is possible to supply an electric charge to the second-node every predetermined period, and to improve the stability of the circuit operation, with a relatively smaller number of elements. Further, as the number of elements required is reduced, it is possible to obtain effects such as an improvement of a yield ratio and reduction of an area for mounting.

According to the twenty-third aspect of the present invention, only by providing the fourth second-node turnon switching element in addition to the components of the bistable-circuit pair, stability of the potential of the second-node can be improved, without providing the second second-node turnoff switching element for the previous stage bistable circuit, and without providing the first second-node turnoff switching element for the next stage bistable circuit.

According to the twenty-fourth aspect of the present invention, as for the previous stage bistable circuit, the second-node can be turned off during a period in which the outputted signal from this bistable circuit is active without providing the second second-node turnoff switching element, and as for the next stage bistable circuit, the second-node can be turned off during a period in which the outputted signal from the previous stage bistable circuit is active without providing the first second-node turnoff switching element.

According to the twenty-fifth aspect of the present invention, it is possible to reduce production cost of the scanning signal line drive circuit.

According to the twenty-sixth aspect of the present invention, it is possible to realize a display device including a scanning signal line drive circuit obtaining the same effect as that in the first aspect of the present invention.

MODES FOR CARRYING OUT THE INVENTION

Hereinafter, embodiments according to the present invention will be described with reference to the accompanying drawings. It should be noted that in the following description, a gate terminal (gate electrode), a drain terminal (drain electrode), and a source terminal (source electrode) of a thin-film transistor respectively correspond to a first electrode, a second electrode, and a third electrode. Further, the description is given assuming that all thin-film transistors provided within a bistable circuit are of an N-channel type.

1. First Embodiment 1.1 Overall Configuration and Operation

Figure 2:
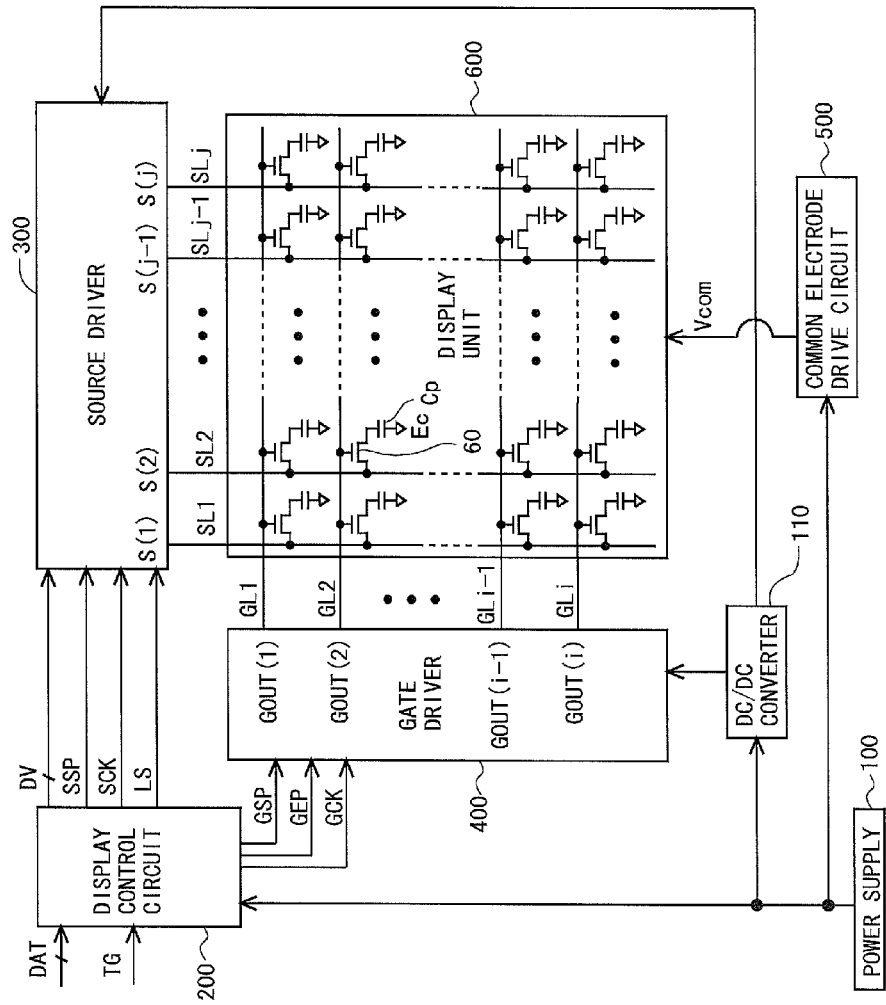
FIG. 2 is a block diagram for illustration of an overall configuration of the liquid crystal display device according to the first embodiment.

FIG. 2 is a block diagram for illustration of an overall configuration of an active matrix-type liquid crystal display device according to a first embodiment of the present invention. As illustrated in FIG. 2, this liquid crystal display device is provided with a power supply 100, a DC/DC converter 110, a display control circuit 200, a source driver (video signal line drive circuit) 300, a gate driver (scanning signal line drive circuit) 400, a common electrode drive circuit 500, and a display unit 600. Here, the gate driver 400 is formed using such as amorphous silicon, polycrystalline silicon, microcrystalline silicon, or oxide semiconductor (e.g., IGZO) on a display panel including the display unit 600. Specifically, in this embodiment, the gate driver 400 and the display unit 600 are formed on the same substrate (an array substrate that is one of two substrates that constitute a liquid crystal panel).

The display unit 600 is provided with a pixel circuit having a plurality of (j) source bus lines (video signal lines) SL1-SLj, a plurality of (i) gate bus lines (scanning signal lines) GL1-GLi, and a plurality of (i×j) pixel formation portions provided respectively corresponding to intersections between the source bus lines SL1-SLj and the gate bus lines GL1-GLi. The plurality of pixel formation portions are arranged in matrix and constitute a pixel array. Each of the pixel formation portions is configured by a thin-film transistor (TFT) 60 as a switching element having a gate terminal connected to a gate bus line that passes a corresponding intersection and a source terminal connected to a source bus line that passes this intersection, a pixel electrode connected to a drain terminal of the thin-film transistor 60, a common electrode Ec that is an opposite electrode provided in common to the plurality of pixel formation portions, and a liquid crystal layer provided in common to the plurality of pixel formation portions and sandwiched between the pixel electrodes and the common electrode Ec. Further, a liquid crystal capacitance constituted by the pixel electrode and the common electrode Ec constitutes a pixel capacitance Cp. While an auxiliary capacitance is generally provided in parallel with the liquid crystal capacitance in order to reliably maintain a voltage in the pixel capacitance Cp, a description and illustration of the auxiliary capacitance is omitted as the auxiliary capacitance is not directly related to the present invention.

The power supply 100 supplies a predetermined power supply voltage to the DC/DC converter 110, the display control circuit 200, and the common electrode drive circuit 500. The DC/DC converter 110 generates a predetermined direct voltage for operating the source driver 300 and the gate driver 400 based on the power supply voltage, and supplies it to the source driver 300 and the gate driver 400. The common electrode drive circuit 500 supplies a predetermined potential Vcom to the common electrode Ec.

The display control circuit 200 receives an externally supplied image signal DAT and an externally supplied timing signal group TG including such as a horizontal synchronizing signal and a vertical synchronizing signal, and outputs a digital video signal DV, and a source start pulse signal SSP, a source clock signal SCK, a latch strobe signal LS, a gate start pulse signal GSP, a gate end pulse signal GEP, and a gate clock signal GCK that are for controlling display of images in the display unit 600. It should be noted that in this embodiment, the gate clock signal GCK is configured by four-phase clock signals GCK1 (hereinafter referred to as a "first gate clock signal"), GCK2 (hereinafter referred to as a "second gate clock signal"), GCK3 (hereinafter referred to as a "third gate clock signal"), and GCK4 (hereinafter referred to as a "fourth gate clock signal") as will be described later. Further, the gate clock signal GCK is generated from the power supply voltage, and its high-level side potential is VDD and its low-level side potential is VSS.

The source driver 300 receives the digital video signal DV, the source start pulse signal SSP, the source clock signal SCK, and the latch strobe signal LS that are outputted from the display control circuit 200, and applies driving video signals S(1)-S(j) respectively to the source bus lines SL1-SLj.

Based on the gate start pulse signal GSP, the gate end pulse signal GEP, and the gate clock signal GCK that are outputted from the display control circuit 200, the gate driver 400 repeats application of active scanning signals GOUT(1)-GOUT (i) respectively to the gate bus lines GL1-GLi with a cycle of single vertical scanning period. The gate driver 400 will be described later in detail.

In the above described manner, an image based on the image signal DAT externally supplied is displayed in the display unit 600, by applying the driving video signals S(1)-S(j) respectively to the source bus lines SL1-SLj, and by applying the scanning signals GOUT(1)-GOUT (i) respectively to the gate bus lines GL1-GLi.

1.2 Configuration and Operation of Gate Driver

Figure 3:
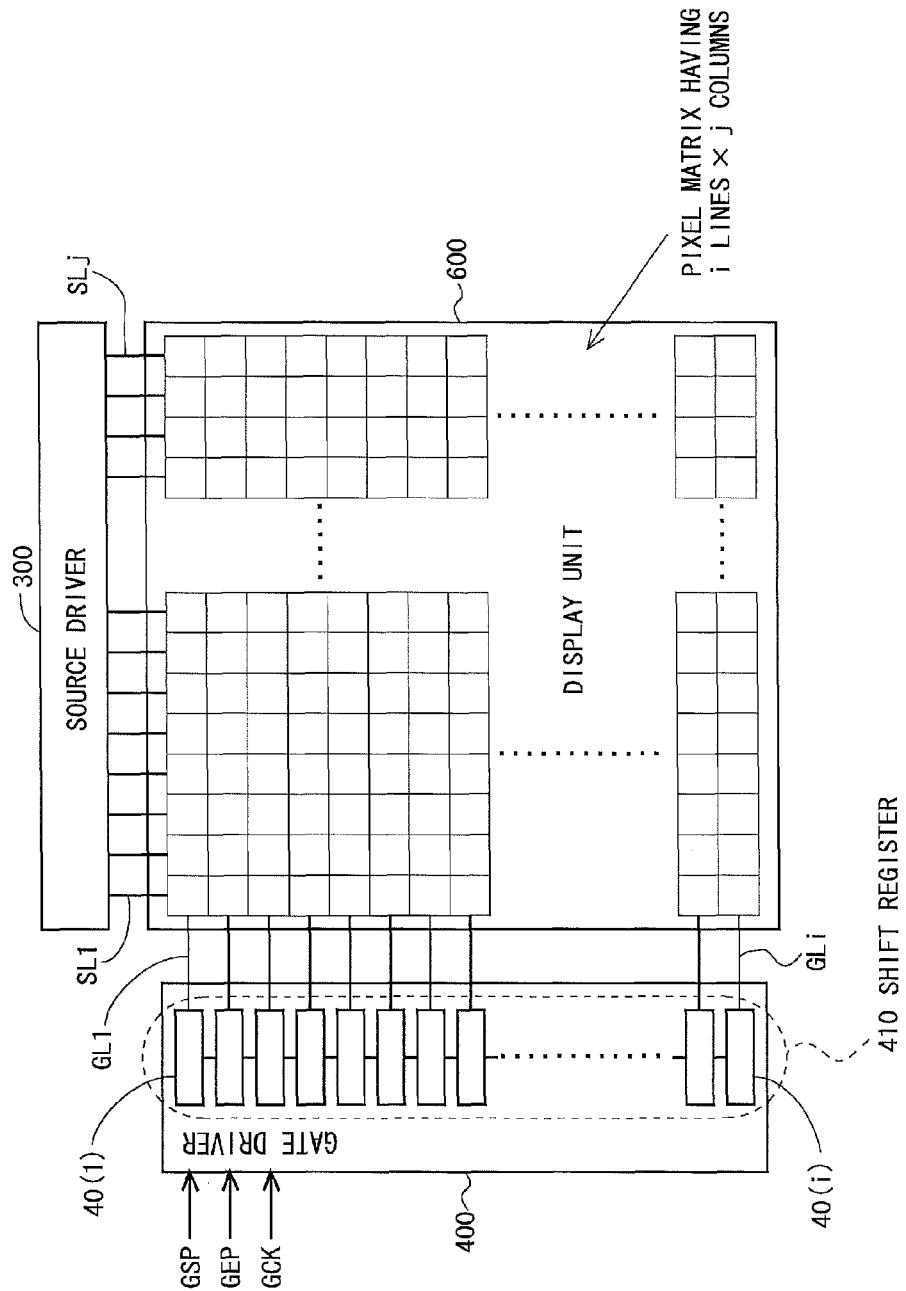
FIG. 3 is a block diagram for illustration of a configuration of the gate driver according to the first embodiment.

Next, an outline of a configuration and an operation of the gate driver 400 according to this embodiment will be described with reference to FIG. 3 to FIG. 5. As illustrated in FIG. 3, the gate driver 400 is configured by a shift register 410 having a plurality of stages. A pixel matrix having i lines×j columns is formed in the display unit 600. The stages of the shift register 410 are provided so as to correspond to the lines of the pixel matrix respectively one on one. Each stage of the shift register 410 is configured as a bistable circuit that takes one of two states (a first state and a second state) at one time point, and outputs a signal indicating this state (hereinafter referred to as a "state signal"). As described above, the shift register 410 is configured by i bistable circuits 40(1)-40(i). Here, in this embodiment, when a bistable circuit is in the first state, this bistable circuit outputs a state signal at a high level (H level), and when a bistable circuit is in the second state, this bistable circuit outputs a state signal at a low level (L level). In the following description, a period in which a state signal at the high level is outputted from a bistable circuit and a scanning signal at the high level is applied to a gate bus line corresponding to this bistable circuit is referred to as a "selection period".

Figure 4:
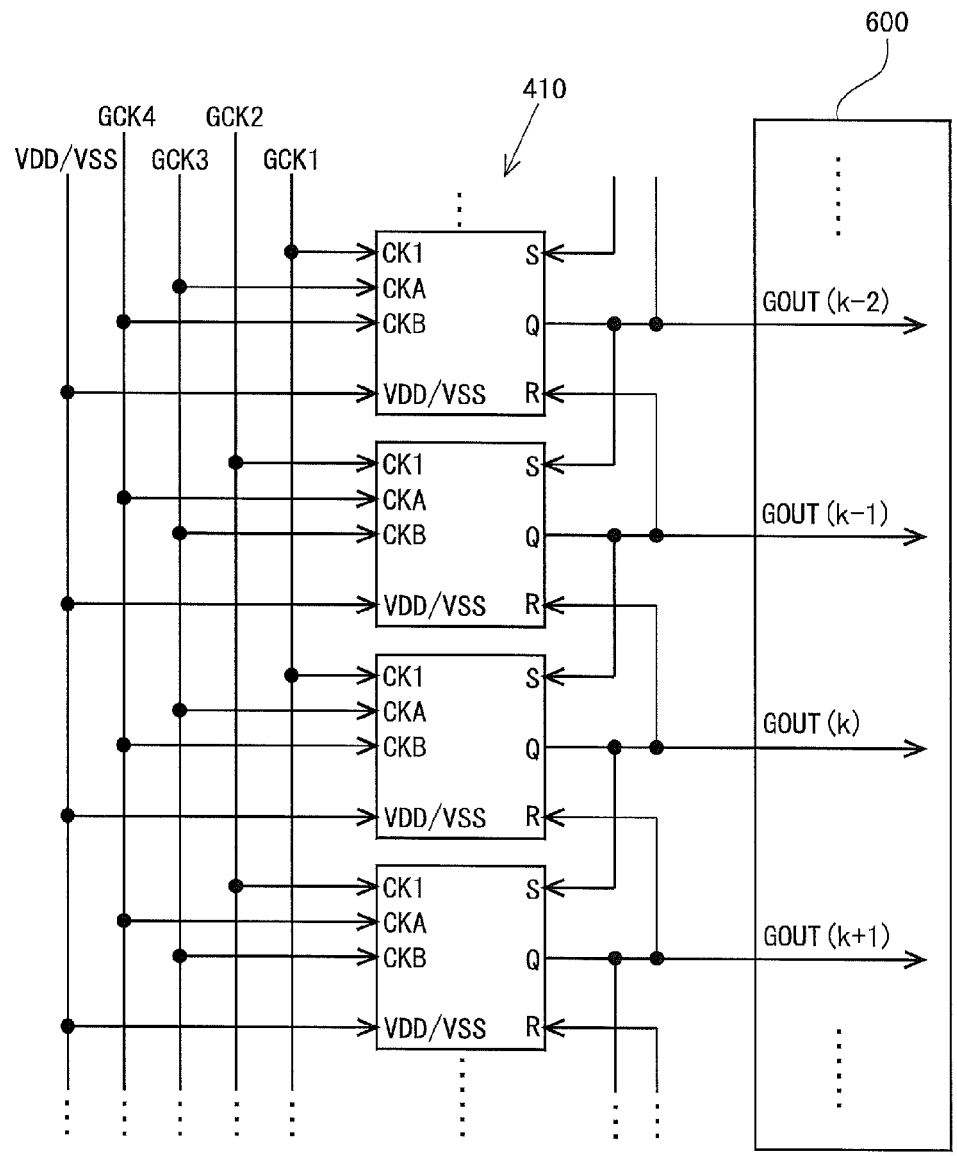
FIG. 4 is a block diagram showing a configuration of the shift register within the gate driver according to the first embodiment.
Figure 5:
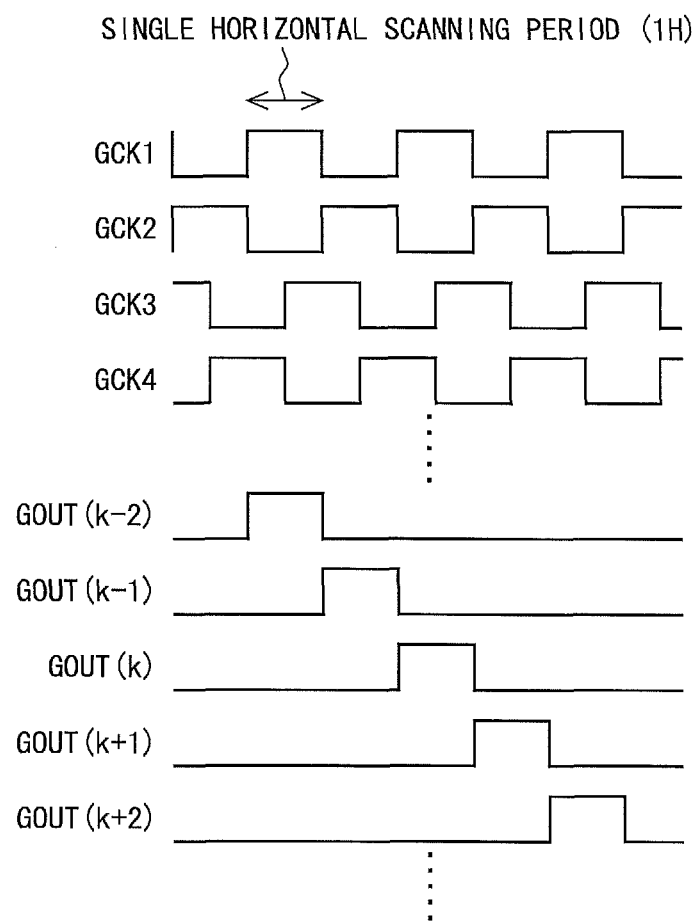
FIG. 5 is a signal waveform diagram for illustration of an operation of the gate driver according to the first embodiment.

FIG. 4 is a block diagram showing a configuration of the shift register 410 within the gate driver 400. As described above, the shift register 410 is configured by the i bistable circuits 40(1)-40(i). Here, FIG. 4 shows the bistable circuits of a (k−2)th stage to a (k+1)th stage. Each bistable circuit includes an input terminal for receiving a clock signal CK1, an input terminal for receiving a clock signal CKA, an input terminal for receiving a clock signal CKB, an input terminal for receiving a high-level DC power supply potential VDD (a magnitude of this potential is also referred to as a "VDD potential"), an input terminal for receiving a low-level DC power supply potential VSS (a magnitude of this potential is also referred to as a "VSS potential"), an input terminal for receiving a set signal S, an input terminal for receiving a reset signal R, and an output terminal for outputting a state signal Q. In the following description, focusing on functions of the signals, the clock signal CK1 is referred to as a "first clock for operation control", the clock signal CKA is referred to as a "first clock for charge replenishment", and the clock signal CKB is referred to as a "second clock for charge replenishment".

The shift register 410 is supplied with, as the gate clock signal GCK, a first gate clock signal GCK1, a second gate clock signal GCK2, a third gate clock signal GCK3, and a fourth gate clock signal GCK4 that are four-phase clock signals. As illustrated in FIG. 5, the first gate clock signal GCK1 and the second gate clock signal GCK2 are out of phase with each other by a single horizontal scanning period, and are driven to the high level (H level) only for a single horizontal scanning period in two horizontal scanning periods. Likewise, as illustrated in FIG. 5, the third gate clock signal GCK3 and the fourth gate clock signal GCK4 are out of phase with each other by a single horizontal scanning period, and are driven to the high level (H level) only for a single horizontal scanning period in two horizontal scanning periods. Here, relation between the phases of the first gate clock signal GCK1 and the third gate clock signal GCK3 is not particularly limited.

Signals supplied to the input terminals of each stage (each bistable circuit) of the shift register 410 are as described below. As used herein, k is assumed to be an even number. An odd-numbered stage is supplied with the second gate clock signal GCK2 as the first clock for operation control CK1, the fourth gate clock signal GCK4 as the first clock for charge replenishment CKA, and the third gate clock signal GCK3 as the second clock for charge replenishment CKB. An even-numbered stage is supplied with the first gate clock signal GCK1 as the first clock for operation control CK1, the third gate clock signal GCK3 as the first clock for charge replenishment CKA, and the fourth gate clock signal GCK4 as the second clock for charge replenishment CKB. Further, each of the odd-numbered and even-numbered stages is supplied with the state signal Q outputted from a previous stage as the set signal S, and the state signal Q outputted from a next stage as the reset signal R. However, the first stage is supplied with the gate start pulse signal GSP as the set signal S, and the i-th stage (final stage) is supplied with the gate end pulse signal GEP as the reset signal R. Here, the high-level DC power supply potential VDD and the low-level DC power supply potential VSS are supplied to all of the bistable circuits in common.

In the configuration described above, when the gate start pulse signal GSP is supplied as the set signal S to the first stage 40(1) of the shift register 410, a pulse included in the gate start pulse signal GSP (this pulse is included in the state signal Q outputted from each stage) is transferred sequentially from the first stage 40(1) to the i-th stage 40(i) based on the first to the fourth gate clock signals GCK1-4. Corresponding to the transferring of the pulses, the state signal Q outputted from each of the stages 40(1)-40(i) is sequentially driven to the high level. The state signals Q outputted from the stages 40(1)-40(i) are respectively supplied to the gate bus lines GL1-GLi as the scanning signals GOUT(1)-GOUT(i). In this manner, as illustrated in FIG. 5, the scanning signals that are sequentially driven to the high level (active) by a single horizontal scanning period are supplied to the gate bus lines within the display unit 600.

1.3 Configuration of Bistable Circuit

Figure 1:
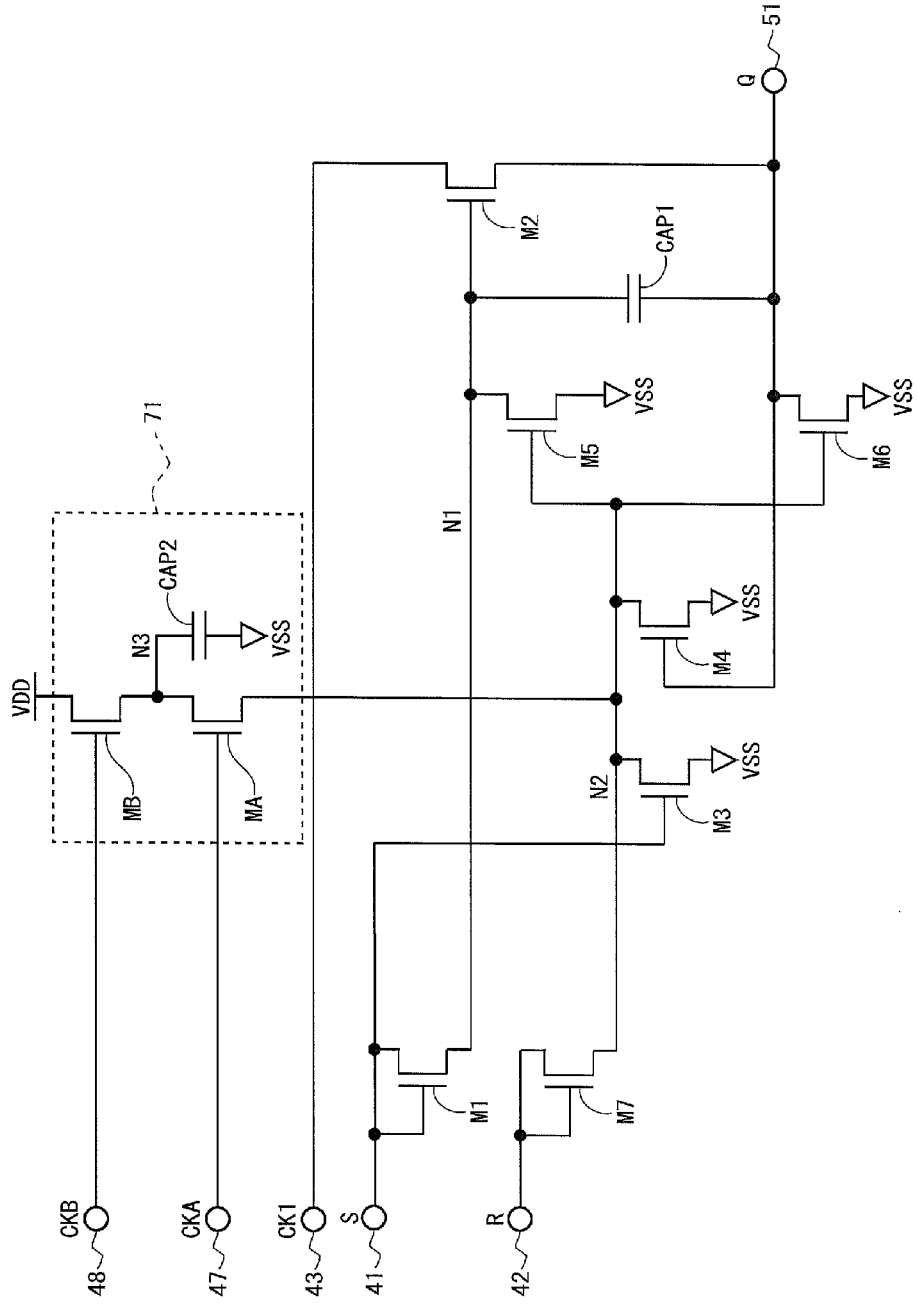
FIG. 1 is a circuit diagram showing a configuration of a bistable circuit included in a shift register within a gate driver of a liquid crystal display device according to a first embodiment of the present invention.

FIG. 1 is a circuit diagram showing a configuration of a bistable circuit (a configuration of a single stage in the shift register 410) according to this embodiment. As illustrated in FIG. 1, this bistable circuit is provided with nine thin-film transistors M1-M7, MA, and MB, and two capacitors CAP1 and CAP2. Additionally, this bistable circuit includes five input terminals 41-43, 47, and 48 and a single output terminal 51, in addition to the input terminal for the high-level DC power supply potential VDD and the input terminal for the low-level DC power supply potential VSS. Here, the input terminal for receiving the set signal S is indicated by a reference numeral 41, the input terminal for receiving the reset signal R is indicated by a reference numeral 42, the input terminal for receiving the first clock for operation control CK1 is indicated by a reference numeral 43, the input terminal for receiving the first clock for charge replenishment CKA is indicated by a reference numeral 47, and the input terminal for receiving the second clock for charge replenishment CKB is indicated by a reference numeral 48. The output terminal for outputting the state signal Q is indicated by a reference numeral 51.

Next, connecting relation among components within the bistable circuit is described. A source terminal of the thin-film transistor M1, a gate terminal of the thin-film transistor M2, a drain terminal of the thin-film transistor M5, and one end of the capacitor CAP1 are connected to each other. Here, a region (wiring) in which these components are connected to each other is referred to as a "first-node" for convenience sake. A drain terminal of the thin-film transistor M3, a drain terminal of the thin-film transistor M4, a gate terminal of the thin-film transistor M5, a gate terminal of the thin-film transistor M6, a source terminal of the thin-film transistor T7, and a source terminal of the thin-film transistor MA are connected to each other. Here, a region (wiring) in which these components are connected to each other is referred to as a "second-node" for convenience sake. A drain terminal of the thin-film transistor MA, a source terminal of the thin-film transistor MB, and one end of the capacitor CAP2 are connected to each other. Here, a region (wiring) in which these components are connected to each other is referred to as a "third-node" for convenience sake. The first-node is indicated by a reference numeral N1, the second-node is indicated by a reference numeral N2, and the third-node is indicated by a reference numeral N3.

For the thin-film transistor M1, a gate terminal and a drain terminal are connected to the input terminal 41 (that is, diode-connected), and the source terminal is connected to the first-node N1. For the thin-film transistor M2, the gate terminal is connected to the first-node N1, a drain terminal is connected to the input terminal 43, and a source terminal is connected to the output terminal 51. For the thin-film transistor M3, a gate terminal is connected to the input terminal 41, the drain terminal is connected to the second-node N2, and a source terminal is connected to the input terminal for the DC power supply potential VSS. For the thin-film transistor M4, a gate terminal is connected to the output terminal 51, the drain terminal is connected to the second-node N2, and a source terminal is connected to the input terminal for the DC power supply potential VSS. For the thin-film transistor M5, the gate terminal is connected to the second-node N2, the drain terminal is connected to the first-node N1, and a source terminal is connected to the input terminal for the DC power supply potential VSS. For the thin-film transistor M6, the gate terminal is connected to the second-node N2, a drain terminal is connected to the output terminal 51, and a source terminal is connected to the input terminal for the DC power supply potential VSS. For the thin-film transistor M7, a gate terminal and a drain terminal are connected to the input terminal 42 (that is, diode-connected), and the source terminal is connected to the second-node N2. For the thin-film transistor MA, a gate terminal is connected to the input terminal 47, the drain terminal is connected to the third-node N3, and the source terminal is connected to the second-node N2. For the thin-film transistor MB, a gate terminal is connected to the input terminal 48, a drain terminal is connected to the input terminal for the DC power supply potential VDD, and the source terminal is connected to the third-node N3. For the capacitor CAP1, the one end is connected to the first-node N1, and the other end is connected to the output terminal 51. For the capacitor CAP2, the one end is connected to the third-node N3, and the other end is connected to the input terminal for the DC power supply potential VSS.

Next, functions of the components in the bistable circuit are described. The thin-film transistor M1 changes a potential of the first-node N1 to the high level when the set signal S is at the high level. The thin-film transistor M2 supplies a potential of the first clock for operation control CK1 to the output terminal 51 when the potential of the first-node N1 is at the high level. The thin-film transistor M3 changes a potential of the second-node N2 to the VSS potential when the set signal S is at the high level. The thin-film transistor M4 changes the potential of the second-node N2 to the VSS potential when a potential of the state signal Q (a potential of the output terminal 51) is at the high level. The thin-film transistor M5 changes the potential of the first-node N1 to the VSS potential when the potential of the second-node N2 is at the high level. The thin-film transistor M6 changes a potential of the output terminal 51 to the VSS potential when the potential of the second-node N2 is at the high level. The thin-film transistor M7 changes the potential of the second-node N2 to the high level when the reset signal R is at the high level. The thin-film transistor MA supplies an electric charge from the third-node N3 to the second-node N2 when the first clock for charge replenishment CKA is at the high level. The thin-film transistor MB changes a potential of the third-node N3 to the VDD potential when the second clock for charge replenishment CKB is at the high level. The capacitor CAP1 functions as a compensation capacitance for maintaining the potential of the first-node N1 at the high level during a period in which a gate bus line connected to this bistable circuit is in a selected state. The capacitor CAP2 is charged with an electric charge to be supplied to the second-node N2.

In this embodiment, the thin-film transistor MA, the thin-film transistor MB, and the capacitor CAP2 constitute a charge replenishment circuit 71 for supplying an electric charge to the second-node N2 every predetermined period. While the gate terminal of the thin-film transistor MA is supplied with the first clock for charge replenishment CKA and the gate terminal of the thin-film transistor MB is supplied with the second clock for charge replenishment CKB, there is no period in which "the first clock for charge replenishment CKA is at the high level and the second clock for charge replenishment CKB is at the high level". Accordingly, the thin-film transistor MB is in an OFF state when the thin-film transistor MA is in an ON state, and the thin-film transistor MA is in the OFF state when the thin-film transistor MB is in the ON state. For the thin-film transistor MB, the drain terminal is connected to the input terminal for the DC power supply potential VDD and the source terminal is connected to the third-node N3, and therefore the capacitor CAP2 is charged and the potential of the third-node N3 increases when the thin-film transistor MB is in the ON state. For the thin-film transistor MA, the drain terminal is connected to the third-node N3 and the source terminal is connected to the second-node N2, and therefore, when the thin-film transistor MA is in the ON state, an electric charge accumulated in the third-node N3 by the capacitor CAP2 is supplied to the second-node N2 if the potential of the second-node N2 is lower than the potential of the third-node N3.

It should be noted that in this embodiment, the thin-film transistor M1 realizes a first-node turnon switching element, the thin-film transistor M2 realizes a first output control switching element, the thin-film transistor M3 realizes a first second-node turnoff switching element, the thin-film transistor M4 realizes a second second-node turnoff switching element, the thin-film transistor M5 realizes a first first-node turnoff switching element, the thin-film transistor M6 realizes a first first-output-node turnoff switching element, the thin-film transistor M7 realizes a first second-node turnon switching element, the thin-film transistor MA realizes a first charge replenishment switching element, and the thin-film transistor MB realizes a second charge replenishment switching element. Further, the input terminal 41 realizes a first-input-node, the input terminal 42 realizes a second-input-node, and the output terminal 51 realizes a first-output-node.

1.4 Operation of Bistable Circuit

Figure 6:
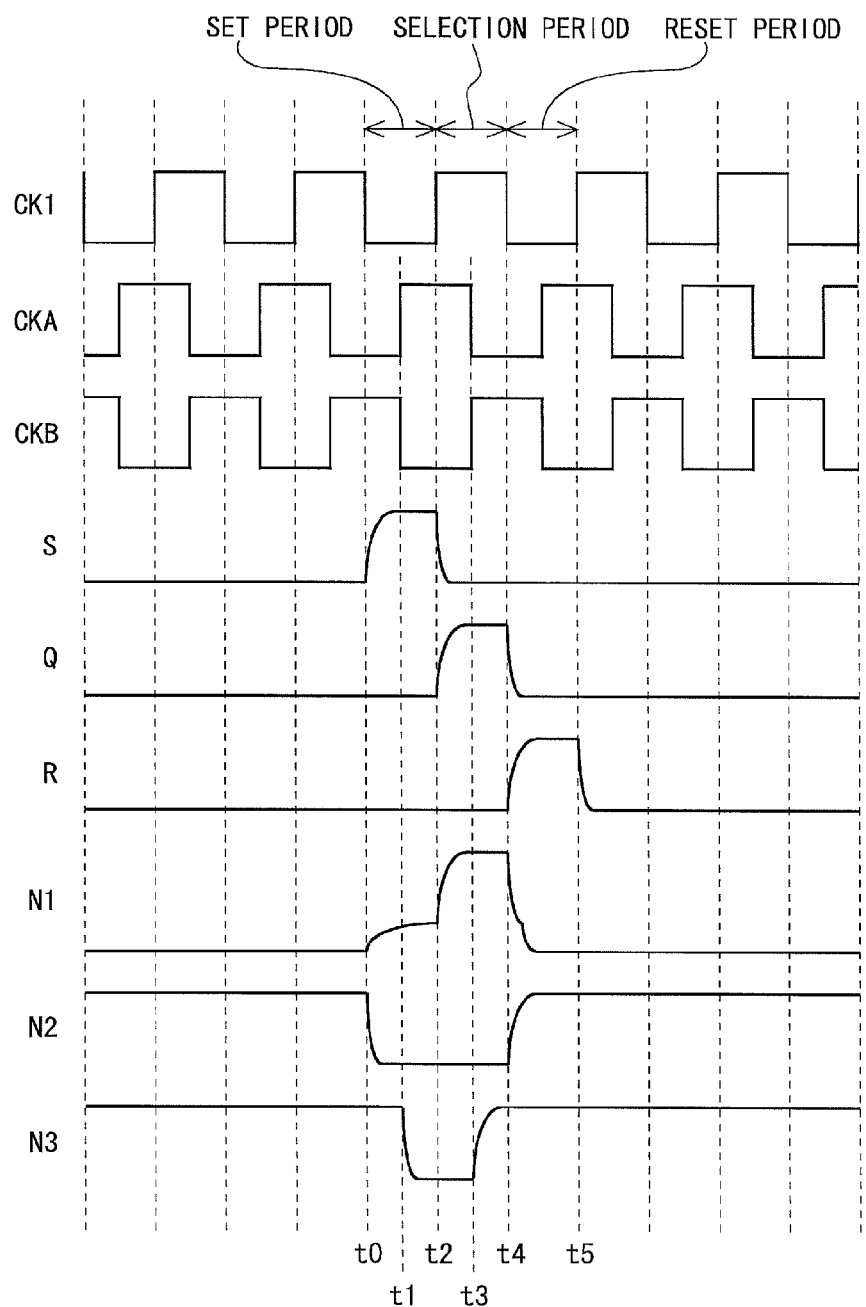
FIG. 6 is a signal waveform diagram for illustration of an operation of the bistable circuit according to the first embodiment.

Next, an operation of the bistable circuit according to this embodiment will be described with reference to FIG. 1 and FIG. 6. In FIG. 6, a period from time t2 to time t4 corresponds to the selection period. It should be noted that in the following description, a single horizontal scanning period immediately before the selection period is referred to as a "set period", and, a single horizontal scanning period immediately after the selection period is referred to as a "reset period". A period other than the selection period, the set period, and the reset period is referred to as a "normal operation period".

In the normal operation period (periods before time t0 and after time t5), the potential of the second-node N2 is maintained at the high level. Accordingly, the thin-film transistors M5 and M6 are in the ON state. As there is a parasitic capacitance between the gate and the drain of the thin-film transistor M2, a noise is generated at the first-node N1 due to fluctuation of a waveform of the first clock for operation control CK1 (see FIG. 6). However, as the thin-film transistor M5 is in the ON state, the potential of the first-node N1 is pulled to the low level. Further, a noise also occurs in the state signal Q (the output terminal 51) due to the noise generated at the first-node N1 or fluctuation of a video signal voltage. However, as the thin-film transistor M6 is in the ON state, a potential of the state signal Q is pulled to the low level. Thus, the potential of the first-node N1 and the potential of the state signal Q are maintained at the low level during this period.

Further, in the normal operation period, the first clock for charge replenishment CKA and the second clock for charge replenishment CKB are turned to the high level alternately every single horizontal scanning period. With this, the thin-film transistor MA and the thin-film transistor MB are alternately turned to the ON state. When the thin-film transistor MB is in the ON state, the capacitor CAP2 is charged. By contrast, when the thin-film transistor MA is in the ON state, the electric charge accumulated in the capacitor CAP2 is supplied to the second-node N2. Accordingly, even when the potential of the second-node N2 decreases due to a current leakage of a thin-film transistor (e.g., the thin-film transistor M3), the potential of the second-node N2 increases during a period in which the first clock for charge replenishment CKA is at the high level. Therefore, in the normal operation period, the potential of the second-node N2 is reliably maintained at the high level.

In the set period (at time t0), the set signal S changes from the low level to the high level. As the thin-film transistor M1 is diode-connected as illustrated in FIG. 1, the thin-film transistor M1 is turned to the ON state by the set signal S driven to the high level, and the capacitor CAP1 is charged (pre-charged, in this case). With this, the potential of the first-node N1 changes from the low level to the high level, and the thin-film transistor M2 is turned to the ON state. However, in the set period, as the first clock for operation control CK1 is at the low level, the potential of the state signal Q is maintained at the low level. Further, the thin-film transistor M3 is turned to the ON state by the set signal S driven to the high level, and the potential of the second-node N2 is turned to the low level. With this, the thin-film transistors M5 and M6 are turned to the OFF state. At time t1, as the first clock for charge replenishment CKA changes from the low level to the high level, the thin-film transistor MA is turned to the ON state. At this time, as the thin-film transistor M3 is in the ON state, the capacitor CAP2 is fully discharged and the potential of the third-node N3 decreases down to the low level, unlike the normal operation period.

In the selection period (at time t2), the set signal S changes from the high level to the low level. At this time, as the potential of the second-node N2 is at the low level, the thin-film transistor M5 is in the OFF state. Thus, the first-node N1 is turned to a floating state. Here, at time t2, the first clock for operation control CK1 changes from the low level to the high level. As described above, because there is a parasitic capacitance between the gate and the drain of the thin-film transistor M2, the potential of the first-node N1 increases as a potential of the input terminal 43 increases (the first-node N1 is bootstrapped). As a result, the thin-film transistor M2 is fully turned to the ON state, and the potential of the state signal Q increases up to a level sufficient for turning a gate bus line connected to the output terminal 51 of this bistable circuit to the selected state. Further, in a period from time t2 to time t3, the thin-film transistor MA is in the ON state. However, as the potential of the state signal Q is turned to the high level and the thin-film transistor M4 is turned to the ON state, the potential of the third-node N3 is maintained at the low level. At time t3, the thin-film transistor MA is turned to the OFF state by the first clock for charge replenishment CKA changing from the high level to the low level, and the thin-film transistor MB is turned to the ON state by the second clock for charge replenishment CKB changing from the low level to the high level. Consequently, the capacitor CAP2 is charged and the potential of the third-node N3 increases up to the high level.

In the reset period (at time t4), the first clock for operation control CK1 changes from the high level to the low level. At time t4, the thin-film transistor M2 is in the ON state, and therefore the potential of the state signal Q decreases as the potential of the input terminal 43 decreases. By the potential of the state signal Q decreasing in this manner, the potential of the first-node N1 also decreases via the capacitor CAP1. Further, the reset signal R changes from the low level to the high level during this period. Accordingly, the thin-film transistor M7 is turned to the ON state, and the potential of the second-node N2 is turned to the high level. With this, the thin-film transistors M5 and M6 are turned to the ON state. As a result, the potential of the first-node N1 and the potential of the state signal Q decrease down to the low level in the reset period.

1.5 Effect

Next, an effect of this embodiment will be described. According to the conventional configuration, the potential of the second-node N2 may decrease during the normal operation period due to such as a current leakage at a thin-film transistor connected to the second-node N2. As a result, the potential of the first-node N1 cannot be maintained at the low level during the normal operation period, and the circuit operation becomes unstable. By contrast, according to this embodiment, each bistable circuit is provided with the charge replenishment circuit 71 for supplying an electric charge to the second-node N2 every predetermined period. Further, during the normal operation period, an electric charge is supplied to the second-node N2 every other horizontal scanning period. Accordingly, even when a current leakage occurs in a thin-film transistor connected to the second-node N2, the potential of the second-node N2 is reliably maintained at the high level by the supply of an electric charge. With this, stability of the circuit operation is improved as compared to the conventional configuration.

Figure 7:
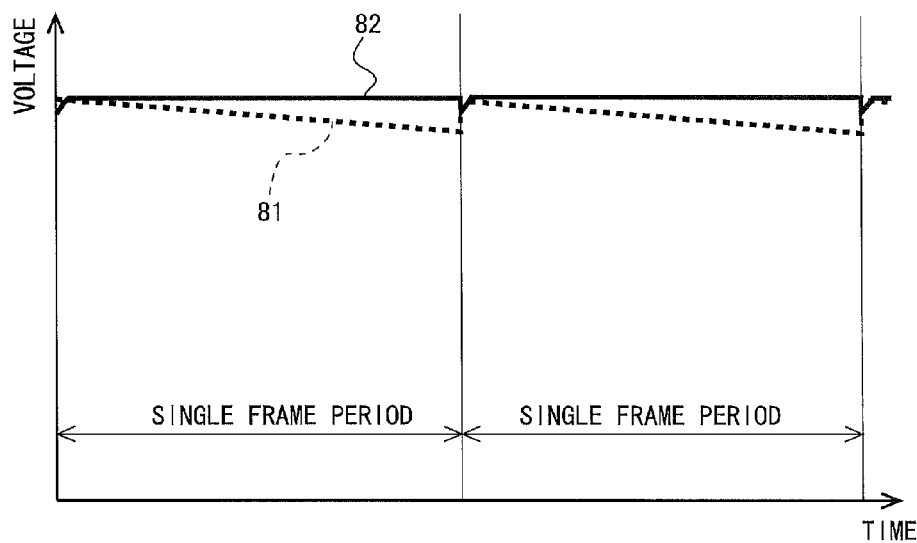
FIG. 7 is a signal waveform diagram for illustration of an effect according to the first embodiment.

FIG. 7 is a signal waveform diagram for illustration of the effect according to this embodiment. Referring to FIG. 7, a waveform shown in a dotted line indicated by a reference numeral 81 represents fluctuation of the potential of the second-node N2 according to the conventional configuration, and a waveform shown in a solid line indicated by a reference numeral 82 represents fluctuation of the potential of the second-node N2 according to this embodiment. Here, these waveforms are based on results of simulations. According to the conventional configuration, the potential of the second-node N2 gradually decreases in a single frame period. By contrast, according to this embodiment, the potential of the second-node N2 is maintained at the high level through a single frame period. Here, when a drive frequency is made low in order to reduce power consumption, for example, the length of a single frame period is extended. According to the conventional configuration, the longer the length of a single frame period becomes, the more the potential of the second-node N2 decreases. By contrast, according to this embodiment, as an electric charge is supplied to the second-node N2 every predetermined period, the potential of the second-node N2 can be maintained at the high level regardless of the length of a single frame period. As described above, according to this embodiment, particularly when low-frequency driving is performed, an occurrence of an abnormal operation due to the decrease of the potential of the second-node N2 is effectively suppressed.

1.6 Modified Examples

Next, modified examples of the first embodiment will be described.

1.6.1 Modified Examples for Configuration near Thin-Film Transistor M1

Figure 8:
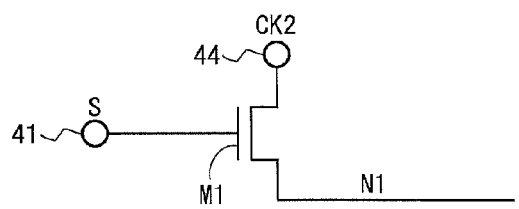
FIG. 8 is a diagram showing a configuration near a thin-film transistor M1 according to a first modified example of the first embodiment.
Figure 9:
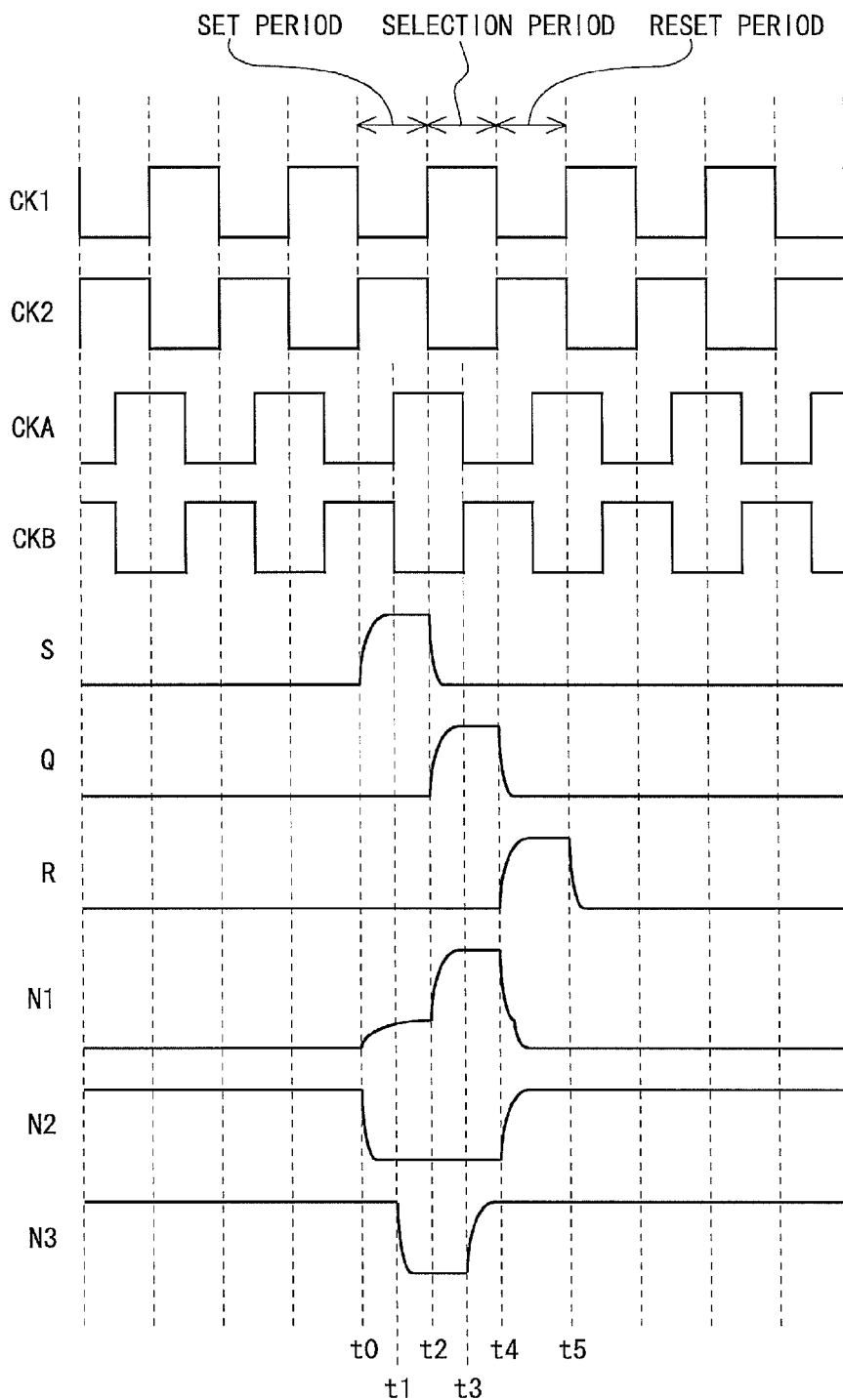
FIG. 9 is a signal waveform diagram for illustration of an operation of a bistable circuit according to the first modified example of the first embodiment.
Figure 10:
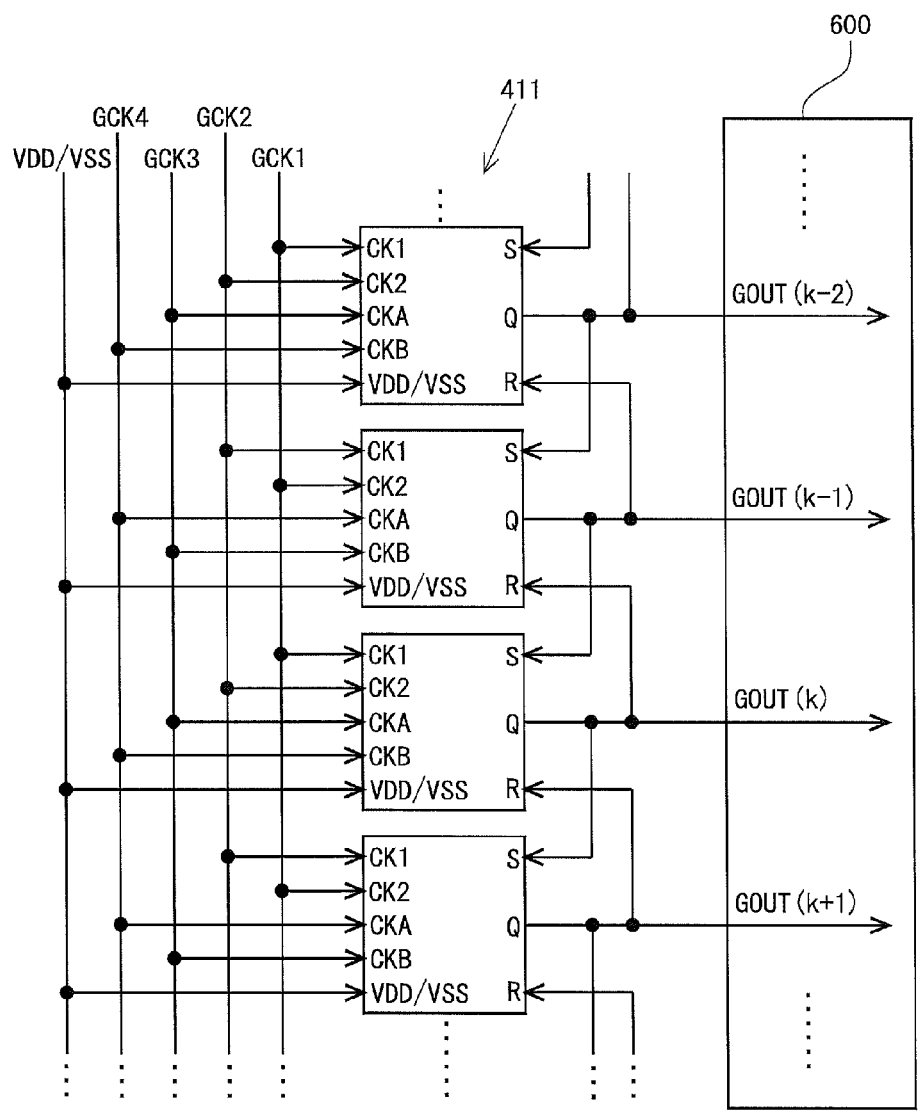
FIG. 10 is a block diagram showing a configuration of a shift register within a gate driver according to the first modified example of the first embodiment.

In the first embodiment, for the thin-film transistor M1, the gate terminal and the drain terminal are connected to the input terminal 41, and the source terminal is connected to the first-node N1. However, the present invention is not limited to this. As illustrated in FIG. 8, the thin-film transistor M1 can be configured such that the gate terminal is connected to the input terminal 41, the drain terminal is connected to an input terminal 44 for receiving a clock signal CK2 (hereinafter referred to as a "second clock for operation control") (hereinafter, the input terminal for receiving the second clock for operation control CK2 is indicated by the reference numeral 44), and the source terminal is connected to the first-node N1 (first modified example). When this configuration is employed, a shift register 411 is configured as illustrated in FIG. 10 so that the bistable circuits are supplied with the first clock for operation control CK1 and the second clock for operation control CK2 that are alternately turned to the high level every other single horizontal scanning period as illustrated in FIG. 9. Specifically, in the first modified example, assuming that k in FIG. 10 is an even number, an odd-numbered stage of the shift register 411 is supplied with the second gate clock signal GCK2 as the first clock for operation control CK1 and the first gate clock signal GCK1 as the second clock for operation control CK2. An even-numbered stage of the shift register 411 is supplied with the first gate clock signal GCK1 as the first clock for operation control CK1 and the second gate clock signal GCK2 as the second clock for operation control CK2.

According to the first modified example, the drain terminal of the thin-film transistor M1 is supplied with the second clock for operation control CK2. As illustrated in FIG. 10, each bistable circuit is supplied with one of the first gate clock signal GCK1 and the second gate clock signal GCK2 as the second clock for operation control CK2. The first gate clock signal GCK1 and the second gate clock signal GCK2 are generated from the power supply voltage as described above. Therefore, according to the first modified example, the power supply voltage is an electric charge supply source for the first-node N1. Accordingly, unlike the first embodiment, a flow of the electric charge from the input terminal 41 to the first-node N1 is prevented, and a potential of the input terminal 41 quickly increases. It should be noted that with a configuration in which the drain terminal of the thin-film transistor M1 is connected to an input terminal for receiving a high-level DC power supply potential VDD, it is possible to achieve the same effect as that of the configuration illustrated in FIG. 8.

Figure 11:
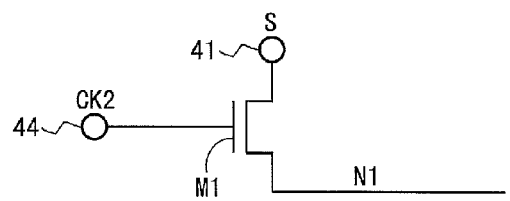
FIG. 11 is a diagram showing a configuration near a thin-film transistor M1 according to a second modified example of the first embodiment.

Further, as illustrated in FIG. 11, the thin-film transistor M1 can be configured such that the gate terminal is connected to the input terminal 44, the drain terminal is connected to the input terminal 41, and the source terminal is connected to the first-node N1 (second modified example). According to the second modified example, the thin-film transistor M1 is turned to the ON state based on the power supply voltage. Accordingly, the thin-film transistor M1 is quickly turned to the ON state in the set period, and the potential of the first-node N1 quickly increases.

1.6.2 Modified Examples for Configuration near Thin-Film Transistor M7

Figure 12:
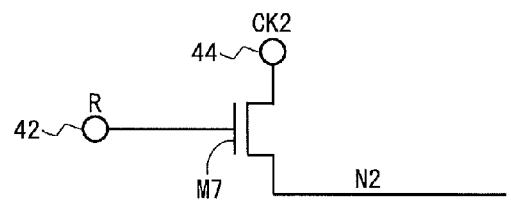
FIG. 12 is a diagram showing a configuration near a thin-film transistor M7 according to a third modified example of the first embodiment.

In the first embodiment, for the thin-film transistor M7, the gate terminal and the drain terminal are connected to the input terminal 42, and the source terminal is connected to the second-node N2. However, the present invention is not limited to this. As illustrated in FIG. 12, the thin-film transistor M7 can be configured such that the gate terminal is connected to the input terminal 42, the drain terminal is connected to the input terminal 44, and the source terminal is connected to the second-node N2 (third modified example). In the third modified example, the shift register 411 is configured as illustrated in FIG. 10. According to the third modified example, as the drain terminal of the thin-film transistor M7 is supplied with the second clock for operation control CK2, the power supply voltage is an electric charge supply source for the second-node N2. Accordingly, unlike the first embodiment, a flow of the electric charge from the input terminal 42 to the second-node N2 is prevented, and a potential of the input terminal 42 quickly increases. It should be noted that with a configuration in which the drain terminal of the thin-film transistor M7 is connected to the input terminal for the high-level DC power supply potential VDD, it is possible to achieve the same effect as that of the configuration illustrated in FIG. 12.

Figure 13:
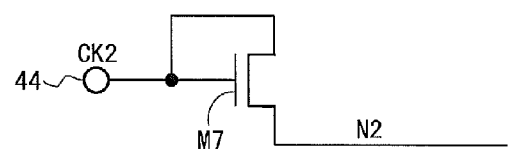
FIG. 13 is a diagram showing a configuration near a thin-film transistor M7 according to a fourth modified example of the first embodiment.
Figure 14:
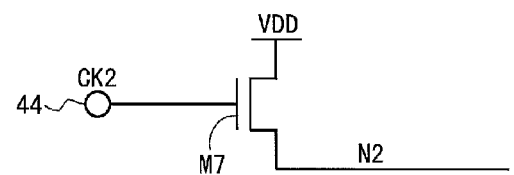
FIG. 14 is a diagram showing a configuration near a thin-film transistor M7 according to a fifth modified example of the first embodiment.

Further, as illustrated in FIG. 13, the thin-film transistor M7 can be configured such that the gate terminal and the drain terminal are connected to the input terminal 44, and the source terminal is connected to the second-node N2 (fourth modified example). Moreover, as illustrated in FIG. 14, the thin-film transistor M7 can be configured such that the gate terminal is connected to the input terminal 44, the drain terminal is connected to the input terminal for the high-level DC power supply potential VDD, and the source terminal is connected to the second-node N2 (fifth modified example). In the fourth modified example and the fifth modified example, the shift register 411 is configured as illustrated in FIG. 10. In the configuration illustrated in FIG. 1 (the configuration of the first embodiment), the thin-film transistor M7 is turned to the ON state only once in a single vertical scanning period. However, according to the fourth modified example and the fifth modified example, the thin-film transistor M7 is turned to the ON state every two horizontal scanning periods, and therefore the electric charge is supplied to the second-node N2 with a short cycle. Accordingly, the potential of the second-node N2 is reliably maintained at the high level during the normal operation period. In the meantime, as the set signal S and the second clock for operation control CK2 are driven to the high level during the set period (see the period from time t0 to time t2 in FIG. 9), there is a possibility that the thin-film transistor M3 and the thin-film transistor M7 are turned to the ON state substantially at the same timing and thus the circuit operation possibly becomes unstable. Therefore, it is preferable that a transistor size (channel width/channel length) of the thin-film transistor M7 be sufficiently smaller than a transistor size of the thin-film transistor M3. With this, a driving force of the thin-film transistor M7 becomes smaller than a driving force of the thin-film transistor M3, and the potential of the second-node N2 decreases even when the thin-film transistor M3 and the thin-film transistor M7 are turned to the ON state substantially at the same timing during the set period, and the circuit operation becoming unstable is suppressed.

1.6.3 Modified Examples for Configuration Near Thin-Film Transistor M3

Figure 15:
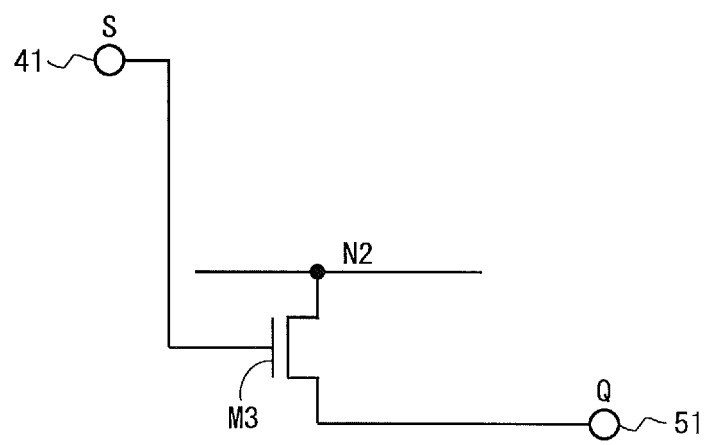
FIG. 15 is a diagram showing a configuration near a thin-film transistor M3 according to a sixth modified example of the first embodiment.
Figure 16:
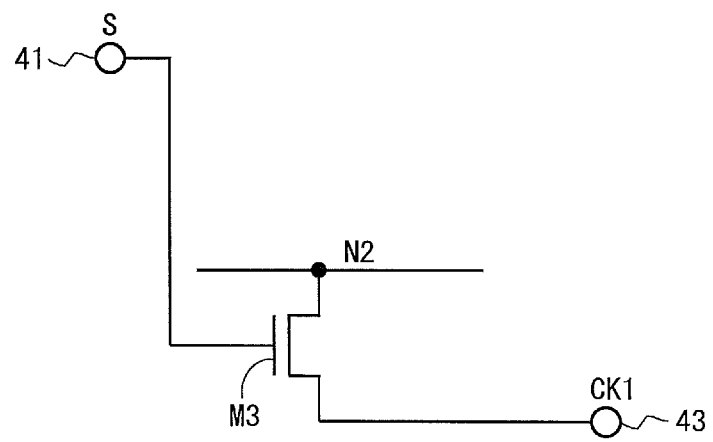
FIG. 16 is a diagram showing a configuration near a thin-film transistor M3 according to a seventh modified example of the first embodiment.

In the first embodiment, for the thin-film transistor M3, the gate terminal is connected to the input terminal 41, the drain terminal is connected to the second-node N2, and the source terminal is connected to the input terminal for the DC power supply potential VSS. However, the present invention is not limited to this. As illustrated in FIG. 15 the source terminal of the thin-film transistor M3 can be connected to the output terminal 51 (sixth modified example). Alternatively, as illustrated in FIG. 16, the source terminal of the thin-film transistor M3 can be connected to the input terminal 43 (seventh modified example). Reasons for these are described below. During the set period, the potential of the second-node N2 should be maintained at the low level as the potential of the first-node N1 is required to increase. Further, as can be seen from FIG. 6, the potential of the output terminal 51 (the potential of the state signal Q) and the potential of the input terminal 43 (the potential of the first clock for operation control CK1) are at the low level during the set period. Thus, for the thin-film transistor M3 in which the gate terminal is supplied with the set signal S and the drain terminal is connected to the second-node N2, the potential of the second-node N2 is turned to the low level during the set period even when the source terminal is connected to the output terminal 51 or the input terminal 43.

1.6.4 Modified Examples for Configuration Near Thin-Film Transistor M4

Figure 17:
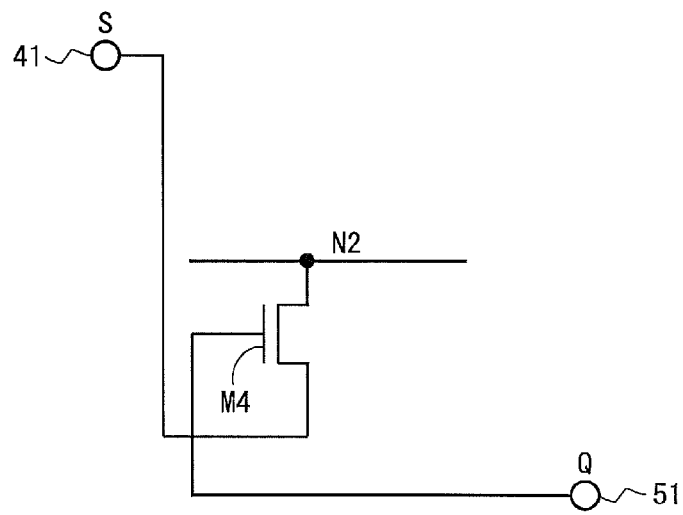
FIG. 17 is a diagram showing a configuration near a thin-film transistor M4 according to an eighth modified example of the first embodiment.
Figure 18:
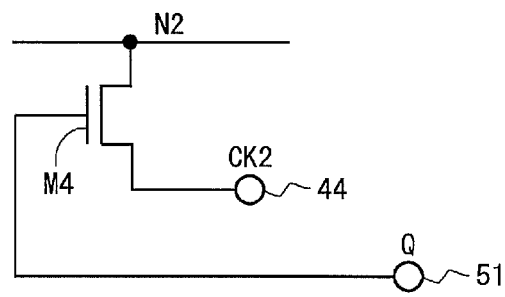
FIG. 18 is a diagram showing a configuration near the thin-film transistor M4 according to a ninth modified example of the first embodiment.

In the first embodiment, for the thin-film transistor M4, the gate terminal is connected to the output terminal 51, the drain terminal is connected to the second-node N2, and the source terminal is connected to the input terminal for the DC power supply potential VSS. However, the present invention is not limited to this. As illustrated in FIG. 17, the source terminal of the thin-film transistor M4 can be connected to the input terminal 41 (eighth modified example). Alternatively, as illustrated in FIG. 18, the source terminal of the thin-film transistor M4 can be connected to the input terminal 44 (ninth modified example). Reasons for these are described below. During the selection period, the potential of the second-node N2 should be maintained at the low level as the potential of the first-node N1 is required to be maintained at the low level. Further, as can be seen from FIG. 9, the potential of the input terminal 41 (the potential of the set signal S) and the potential of the input terminal 44 (the potential of the second clock for operation control CK2) are at the low level during the selection period. Thus, for the thin-film transistor M4 in which the gate terminal is connected to the output terminal 51 and the drain terminal is connected to the second-node N2, the potential of the second-node N2 is turned to the low level during the selection period even when the source terminal is connected to the input terminal 41 or the input terminal 44.

1.6.5 Modified Example for Configuration Near Thin-Film Transistor MB

Figure 19:
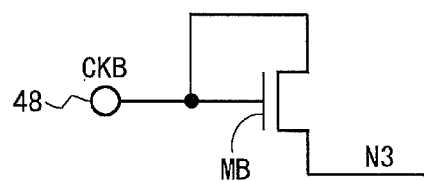
FIG. 19 is a diagram showing a configuration near a thin-film transistor MB according to a tenth modified example of the first embodiment.

In the first embodiment, for the thin-film transistor MB, the gate terminal is connected to the input terminal 48, the drain terminal is connected to the input terminal for the DC power supply potential VDD, and the source terminal is connected to the third-node N3. However, the present invention is not limited to this. As illustrated in FIG. 19, the thin-film transistor MB can be configured such that the gate terminal and the drain terminal are connected to the input terminal 48 and the source terminal is connected to the third-node N3 (tenth modified example). According to the tenth modified example, the second charge replenishment switching element can be realized without using the DC power supply potential VDD. Accordingly, it is possible to reduce a number of signals required for driving the shift register as compared to the first embodiment.

1.6.6 Clock Signal for Charge Replenishment

Figure 20:
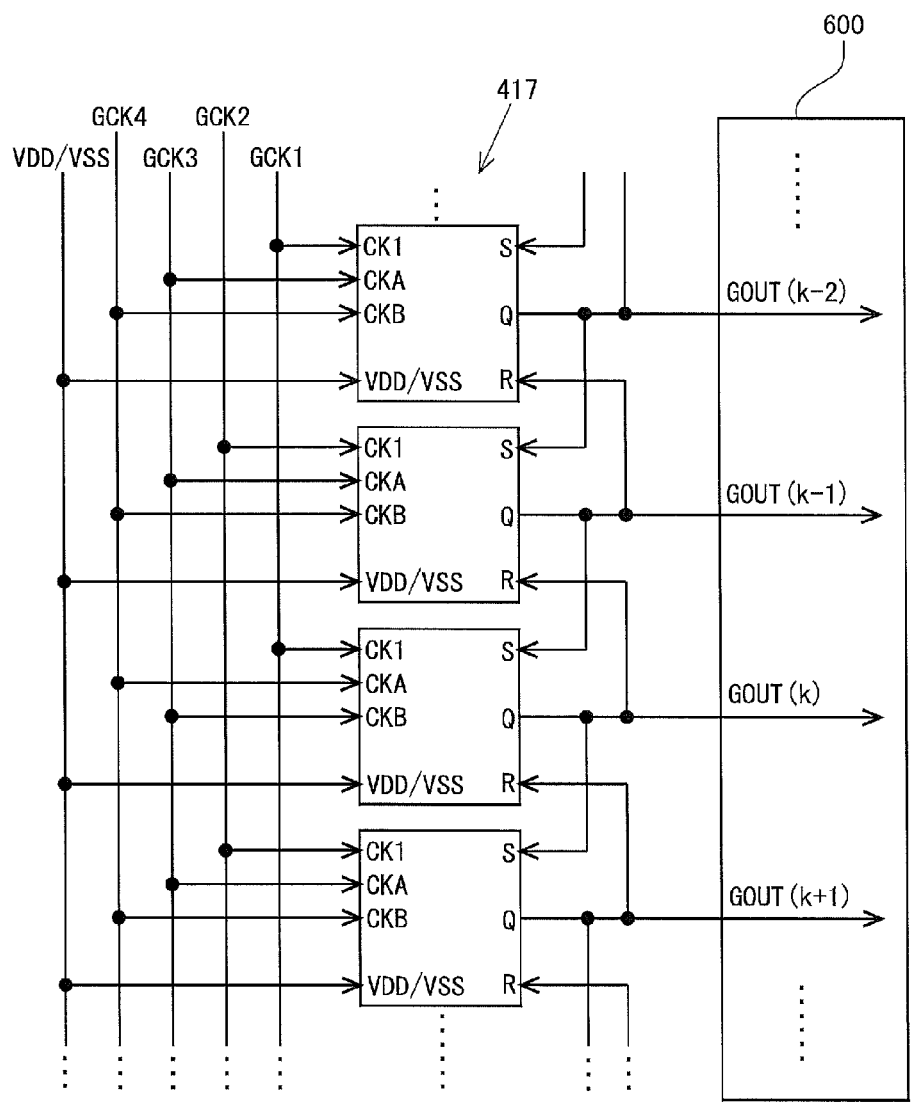
FIG. 20 is a block diagram showing a configuration of a shift register within a gate driver according to an eleventh modified example of the first embodiment.

In the first embodiment, on the basis of the gate clock signal inputted to each bistable circuit as the first clock for operation control CK1, the gate clock signal inputted to the each bistable circuit as the first clock for charge replenishment CKA and the gate clock signal inputted to the each bistable circuit as the second clock for charge replenishment CKB are determined. Specifically, according to the first embodiment, to the bistable circuit to which the first gate clock signal GCK1 is inputted as the first clock for operation control CK1, the third gate clock signal GCK3 is inputted as the first clock for charge replenishment CKA and the fourth gate clock signal GCK4 is inputted as the second clock for charge replenishment CKB. Additionally, to the bistable circuit to which the second gate clock signal GCK2 is inputted as the first clock for operation control CK1, the fourth gate clock signal GCK4 is inputted as the first clock for charge replenishment CKA and the third gate clock signal GCK3 is inputted as the second clock for charge replenishment CKB. However, the present invention is not limited to this. As long as two gate clock signals that are at the high level during different periods are inputted to each bistable circuit as the first clock for charge replenishment CKA and the second clock for charge replenishment CKB, the correspondence relation between "the third gate clock signal GCK3 and the fourth gate clock signal GCK4" and "the first clock for charge replenishment CKA and the second clock for charge replenishment CKB" may be an irregular pattern in the plurality of bistable circuits, as illustrated in FIG. 20, for example (eleventh modified example).

However, by determining the gate clock signal inputted to each bistable circuit as the first clock for charge replenishment CKA and the gate clock signal inputted to the each bistable circuit as the second clock for charge replenishment CKB on the basis of the gate clock signal inputted the each bistable circuit as the first clock for operation control CK1, waveforms of the first clock for charge replenishment CKA in all of the bistable circuits become identical and waveforms of the second clock for charge replenishment CKB in all of the bistable circuits become identical. With this, an electric charge is supplied to the second-node N2 in the same manner in all of the bistable circuits, and it is possible to suppress an occurrence of display unevenness.

Figure 21:
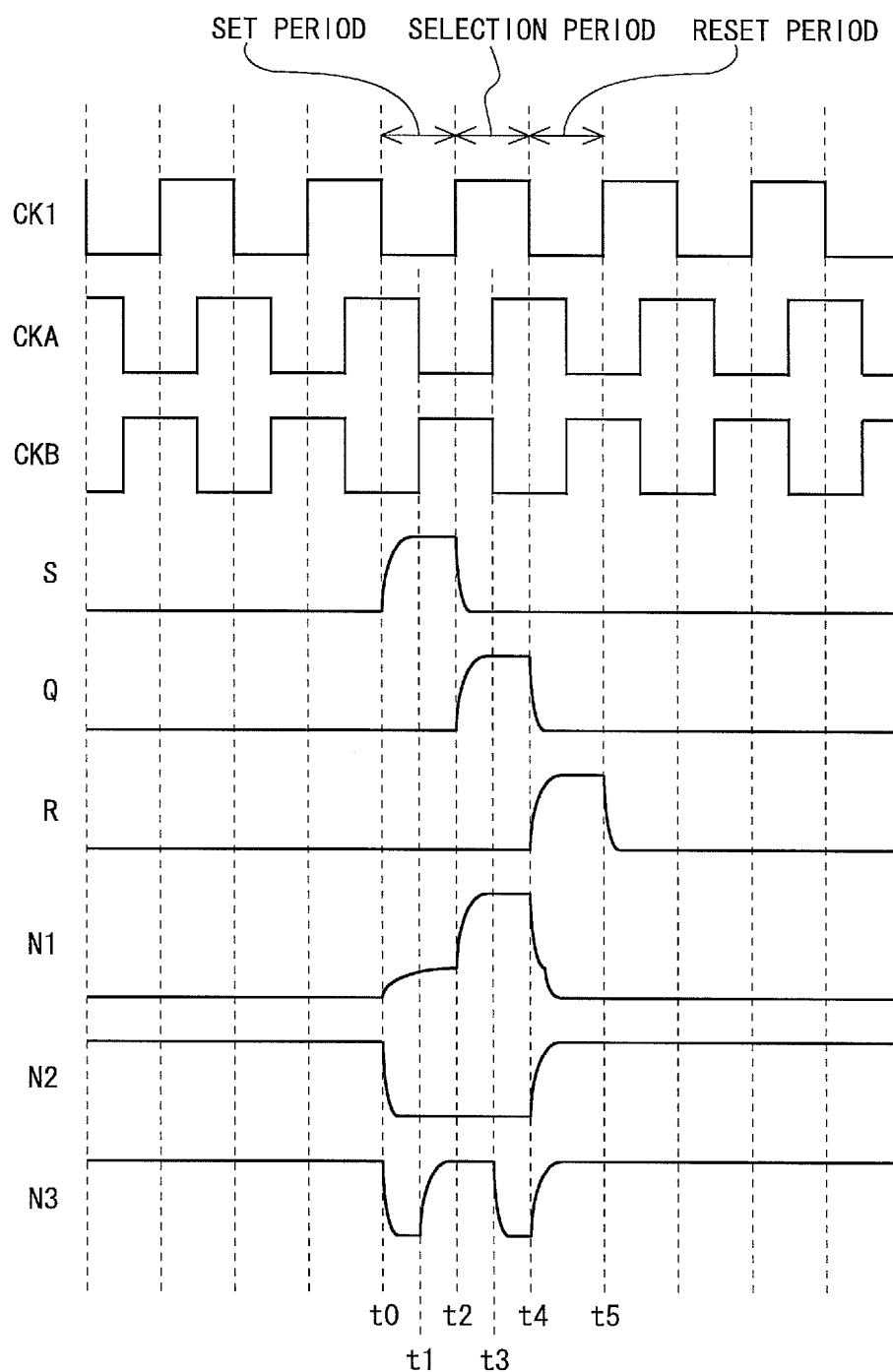
FIG. 21 is a signal waveform diagram for illustration of an operation of a bistable circuit according to a twelfth modified example of the first embodiment.
Figure 22:
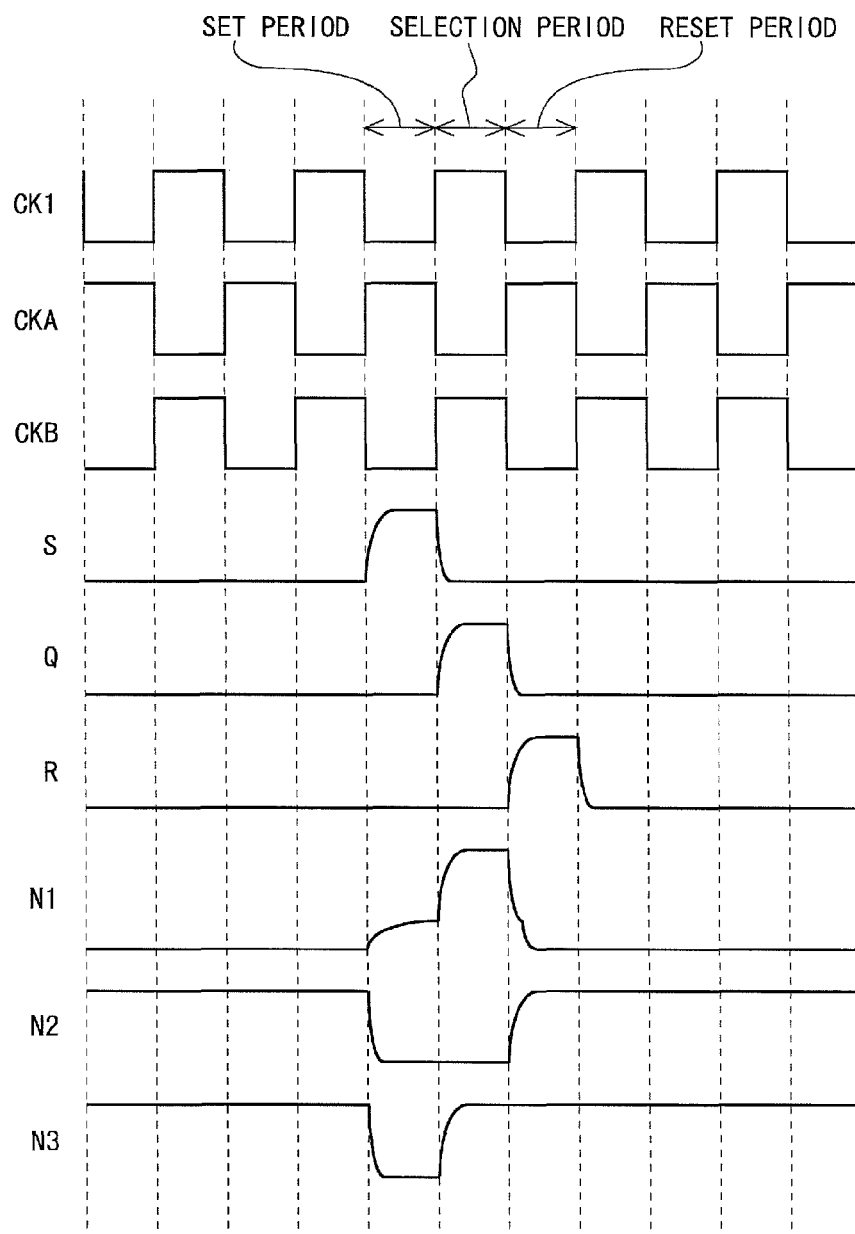
FIG. 22 is a signal waveform diagram for illustration of an operation of a bistable circuit according to a thirteenth modified example of the first embodiment.

Further, relation in phases between the first clock for charge replenishment CKA and the second clock for charge replenishment CKB, and the first clock for operation control CK1 is not particularly limited. FIG. 21 is a signal waveform diagram in a case in which the first clock for charge replenishment CKA and the second clock for charge replenishment CKB are inversed from the case of the first embodiment (twelfth modified example). FIG. 22 is a signal waveform diagram in a case in which the phase of the second clock for charge replenishment CKB is set to be the same as that of the first clock for operation control CK1 (thirteenth modified example). In these cases, the period in which the thin-film transistor MA is in the ON state is different from the first embodiment, and therefore a period in which the potential of the third-node N3 decreases down to the low level out of the set period and the selection period is different from that in the first embodiment. However, in either case, in the normal operation period in which the potential of the second-node N2 should be maintained at the high level, the potential of the third-node N3 is maintained at the high level and an electric charge is reliably supplied to the second-node N2 every predetermined period. Accordingly, regardless of the relation in phases between the first clock for charge replenishment CKA and the second clock for charge replenishment CKB, and the first clock for operation control CK1, similarly to the first embodiment, the stability of the circuit operation is improved as compared to the conventional configuration.

2. Second Embodiment

2.1 Configuration of Bistable Circuit

Figure 23:
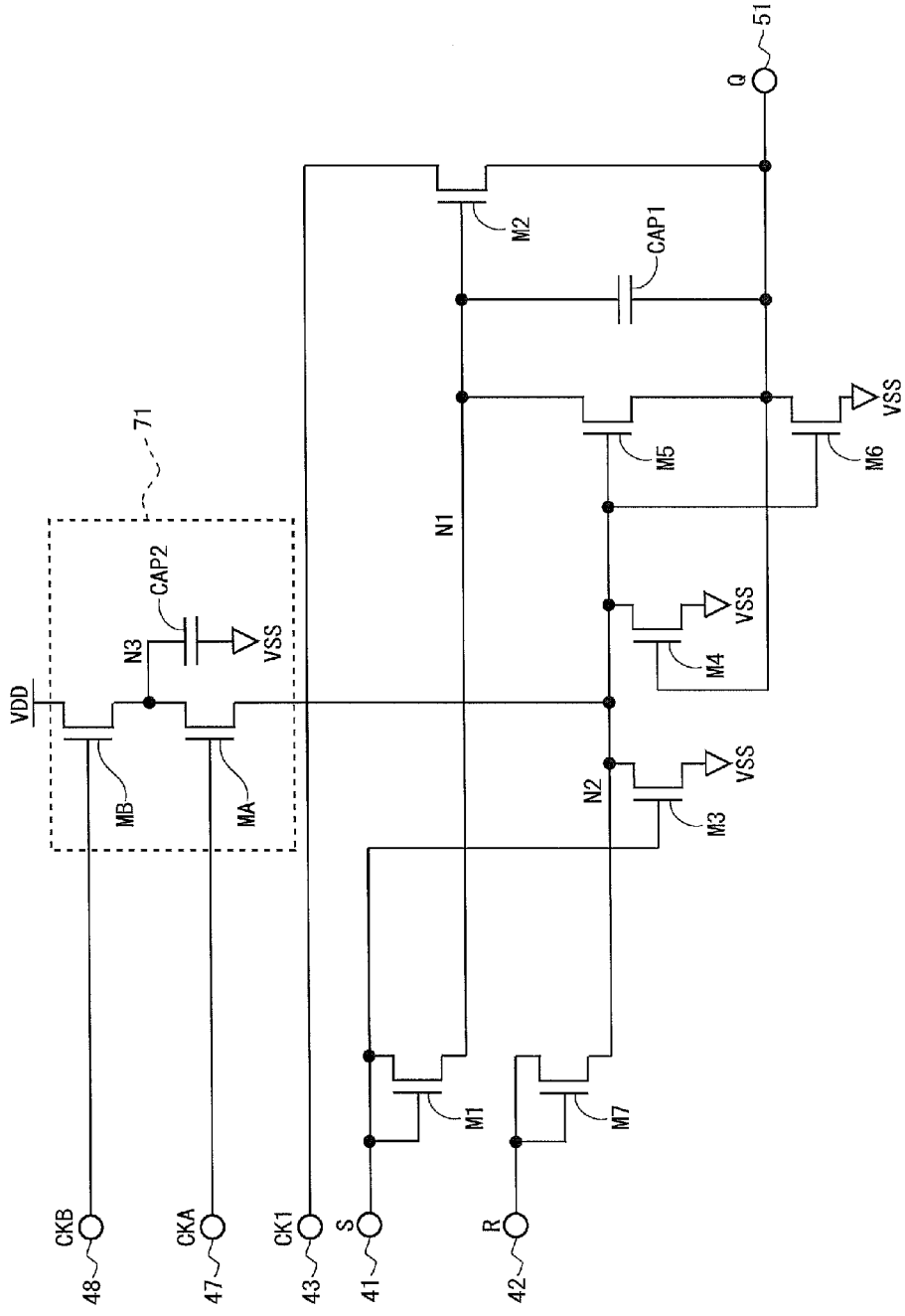
FIG. 23 is a circuit diagram showing a configuration of a bistable circuit according to a second embodiment of the present invention.

FIG. 23 is a circuit diagram showing a configuration of a bistable circuit according to a second embodiment of the present invention. Here, an overall configuration and an operation of a liquid crystal display device and a configuration and an operation of a gate driver are the same as those in the first embodiment, and therefore descriptions for these are omitted.

In the first embodiment, for the thin-film transistor M5, the gate terminal is connected to the second-node N2, the drain terminal is connected to the first-node N1, and the source terminal is connected to the input terminal for the DC power supply potential VSS. However, the present invention is not limited to this. As illustrated in FIG. 23, the source terminal of the thin-film transistor M5 can be connected to the output terminal 51.

2.2 Effects

According to this embodiment, the source terminal of the thin-film transistor M5 is supplied with the potential of the state signal Q. Here, in the selection period, the potential of the first-node N1 connected to the drain terminal of the thin-film transistor M5 is at the high level, and the state signal Q is at the high level (see FIG. 6). Accordingly, as compared to the first embodiment employing the configuration in which the source terminal of the thin-film transistor M5 is supplied with the DC power supply potential VSS, a voltage between the drain and the source of the thin-film transistor M5 during the selection period is reduced. With this, during the selection period, an outflow of an electric charge from the first-node N1 via the thin-film transistor M5 is suppressed. As a result, the potential of the first-node N1 is reliably maintained at the high level during the selection period, and the stability of the circuit operation is effectively improved. Further, as the potential of the first-node N1 decreases more slowly than the potential of the state signal Q, an action of the thin-film transistor M2 to decrease the potential of the state signal Q becomes stronger, and it is possible to decrease the potential of the state signal Q down to the low level more quickly.

3. Third Embodiment

3.1 Configuration of Bistable Circuit

Figure 24:
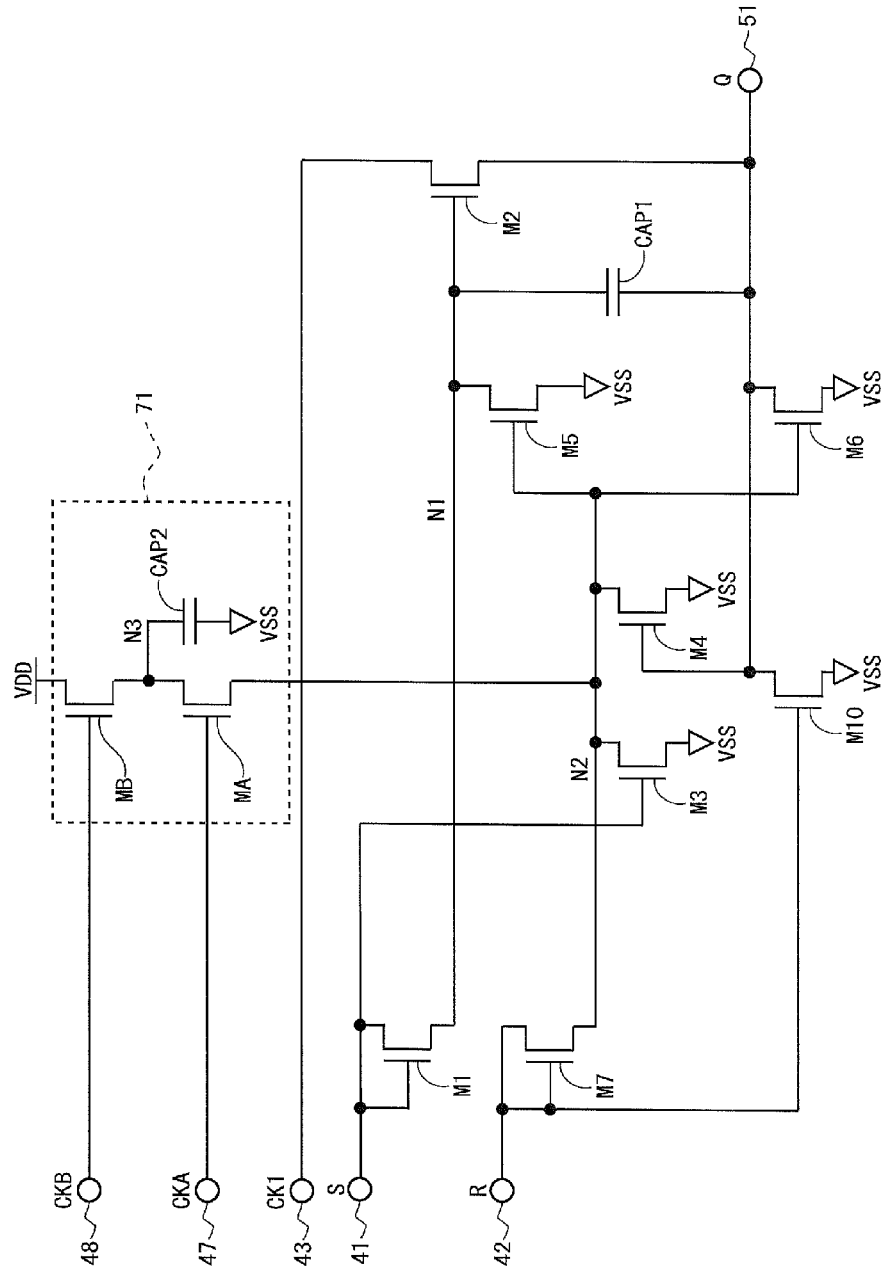
FIG. 24 is a circuit diagram showing a configuration of a bistable circuit according to a third embodiment of the present invention.

FIG. 24 is a circuit diagram showing a configuration of a bistable circuit according to a third embodiment of the present invention. Here, an overall configuration and an operation of a liquid crystal display device and a configuration and an operation of a gate driver are the same as those in the first embodiment, and therefore descriptions for these are omitted.

According to this embodiment, the bistable circuit is provided with a thin-film transistor M10, in addition to the components of the first embodiment illustrated in FIG. 1. For the thin-film transistor M10, a gate terminal is connected to the input terminal 42, a drain terminal is connected to the output terminal 51, and a source terminal is connected to the input terminal for the DC power supply potential VSS. The thin-film transistor M10 functions so as to change the potential of the state signal Q to the VSS potential when the reset signal R is at the high level. The thin-film transistor M10 realizes a second first-output-node turnoff switching element.

3.2 Effects

In the first embodiment and the second embodiment, in the reset period, the potential of the second-node N2 changes from the low level to the high level by the reset signal R changing from the low level to the high level and the thin-film transistor M7 being turned to the ON state. Then, the potential of the state signal Q decreases by the potential of the second-node N2 changing from the low level to the high level and the thin-film transistor M6 being turned to the ON state. By contrast, in this embodiment, the thin-film transistor M10 is turned to the ON state by the reset signal R changing from the low level to the high level. Accordingly, the potential of the state signal Q decreases directly by the reset signal R changing from the low level to the high level. In addition, in this embodiment, during the reset period, the two thin-film transistors M6 and M10 function so as to decrease the potential of the state signal Q. Accordingly, it is possible to quickly decrease the potential of the state signal Q down to the low level during the reset period even when a load capacitance of the gate bus lines is large.

3.3 Modified Example

Figure 25:
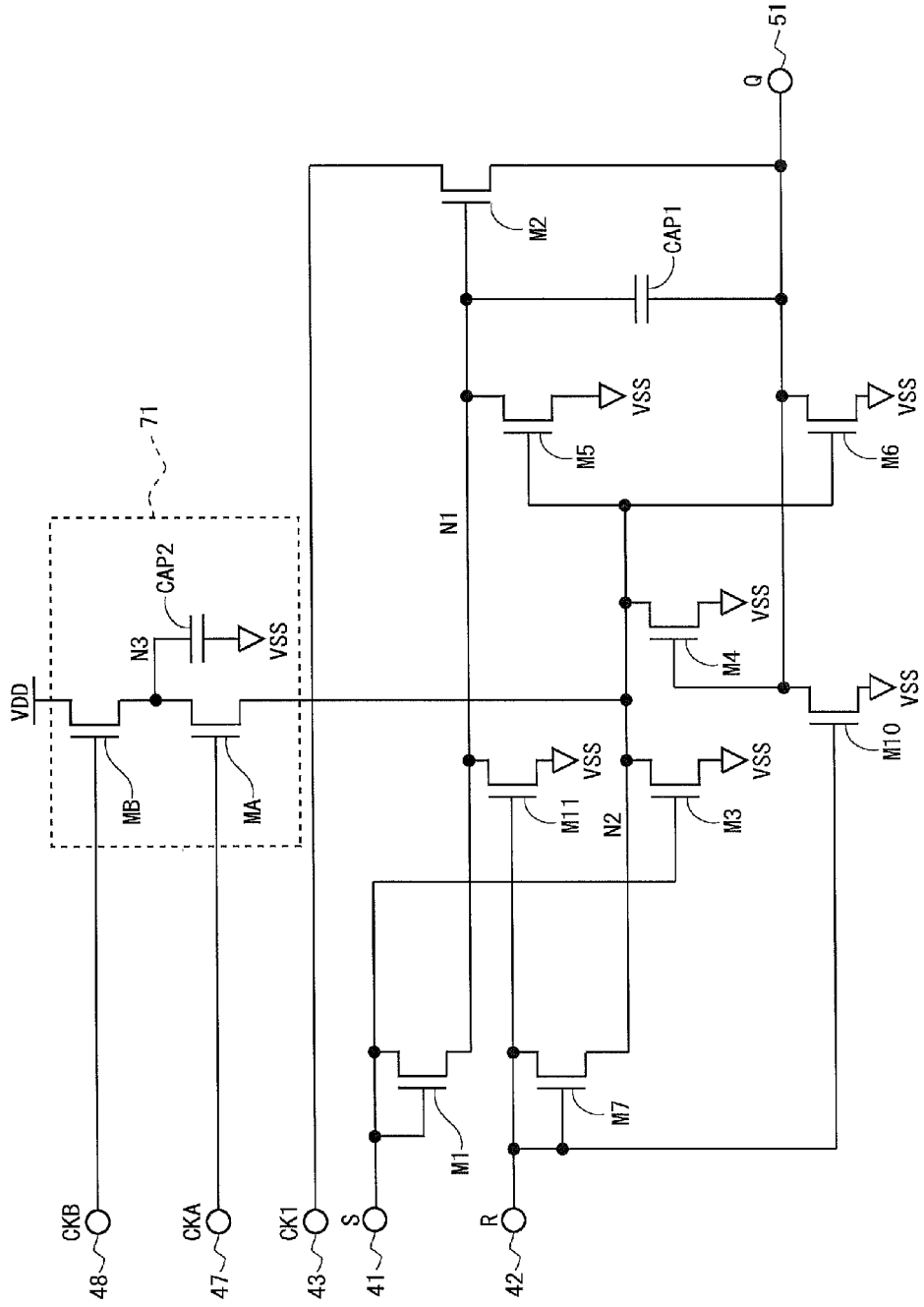
FIG. 25 is a circuit diagram showing a configuration of a bistable circuit according to a modified example of the third embodiment.

FIG. 25 is a circuit diagram showing a configuration of a bistable circuit according to a modified example of the third embodiment. In this modified example, the bistable circuit is provided with a thin-film transistor M11, in addition to the components illustrated in FIG. 24. For the thin-film transistor M11, a gate terminal is connected to the input terminal 42, a drain terminal is connected to the first-node N1, and a source terminal is connected to the input terminal for the DC power supply potential VSS. The thin-film transistor M11 functions so as to change the potential of the first-node N1 to the VSS potential when the reset signal R is at the high level. The thin-film transistor M11 realizes a second first-node turnoff switching element. Alternatively, it is possible to employ a configuration in which the thin-film transistor M11 is provided in addition to the components of the first embodiment illustrated in FIG. 1.

In the first embodiment and the second embodiment, in the reset period, the potential of the second-node N2 changes from the low level to the high level by the reset signal R changing from the low level to the high level and the thin-film transistor M7 being turned to the ON state. Then, the potential of the first-node N1 decreases down to the low level by the potential of the second-node N2 changing from the low level to the high level and the thin-film transistor M5 being turned to the ON state. By contrast, according to this modified example, the thin-film transistor M11 is turned to the ON state by the reset signal R changing from the low level to the high level. Accordingly, the potential of the first-node N1 decreases to the VSS potential directly by the reset signal R changing from the low level to the high level. In addition, in this modified example, the two thin-film transistors M5 and M11 function so as to decrease the potential of the first-node N1 during the reset period. Accordingly, it is possible to reliably decrease the potential of the first-node N1 down to the low level during the reset period even in a case in which the circuit is operated at high speed. With this, the stability of the circuit operation when the circuit is operated at high speed is improved.

4. Fourth Embodiment

4.1 Configuration of Bistable Circuit

Figure 26:
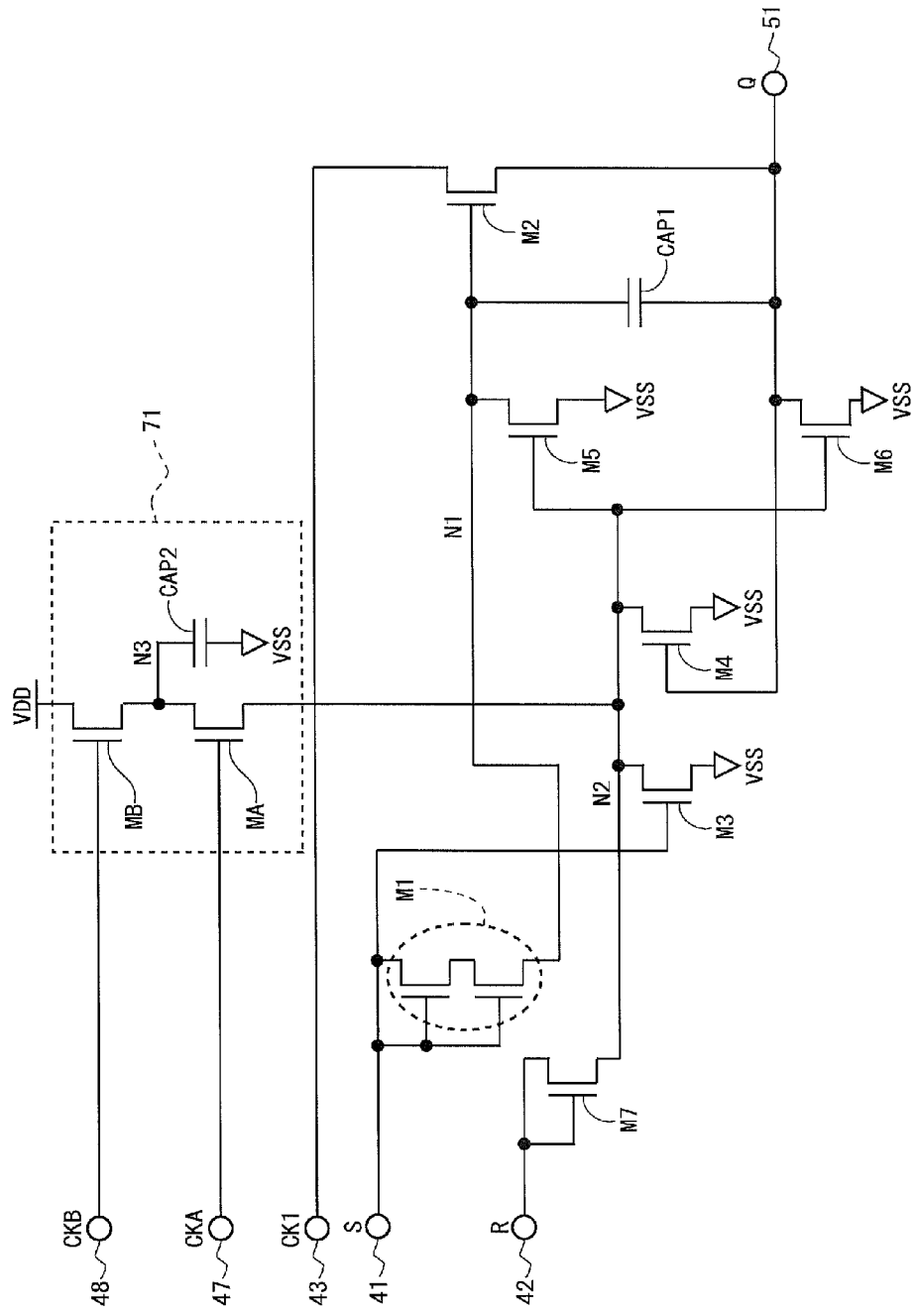
FIG. 26 is a circuit diagram showing a configuration of a bistable circuit according to a fourth embodiment of the present invention.

FIG. 26 is a circuit diagram showing a configuration of a bistable circuit according to a fourth embodiment of the present invention. Here, an overall configuration and an operation of a liquid crystal display device and a configuration and an operation of a gate driver are the same as those in the first embodiment, and therefore descriptions for these are omitted.

In the first to the third embodiment, the first-node N1 is precharged based on the change of the set signal S from the low level to the high level during the set period. Here, as for the first clock for operation control CK1, when a high level potential is the VDD potential and a low level potential is the VSS potential, a potential Vn of the first-node N1 immediately before the set period ends theoretically becomes a value expressed by an expression (1). Here, Vth is a threshold voltage of the thin-film transistor M1.

$$Vn = VDD - Vth \qquad (1)$$

In the selection period, the first clock for operation control CK1 changes from the low level to the high level. Because there is a parasitic capacitance between the gate and the drain of the thin-film transistor M2 as described above, the potential of the first-node N1 increases as the potential of the input terminal 43 increases. Then, the potential Vn of the first-node N1 immediately before the selection period ends theoretically becomes a value expressed by an expression (2).

$$Vn = 2 \times VDD - Vth \qquad (2)$$

In the meantime, when employing a thin-film transistor using a material having high mobility such as microcrystalline silicon (μc-Si) or oxide semiconductor (e.g., IGZO) for its semiconductor layer, it is possible to sufficiently drive the gate bus lines without increasing the potential of the first-node N1 up to a level as shown by the expression (2). In this regard, an increase of the potential of the first-node N1 based on the parasitic capacitance between the gate and the drain of the thin-film transistor M2 is inevitable. Therefore, in this embodiment, as illustrated in FIG. 26, the configuration is such that the thin-film transistor M1 for increasing the potential of the first-node N1 based on the set signal S is multigated. According to this configuration, when the first-node N1 is precharged during the set period, the potential Vn of the first-node N1 theoretically becomes a value expressed by an expression (3). Here, n is a number of the gate electrodes of the thin-film transistor M1.

$$Vn = VDD - n*Vth \qquad (3)$$

4.2 Effects

As can be seen from the expression (1) and the expression (3), according to this embodiment, the potential of the first-node N1 immediately after the precharge in the set period is lower as compared to the first to the third embodiment. Accordingly, comparing this embodiment with the first to the third embodiment, the potential of the first-node N1 immediately before the selection period ends is lower in this embodiment than in the first to the third embodiment. With this, a voltage supplied to the gate terminal of the thin-film transistor M2 decreases, and breakdown of the gate insulation layer in the thin-film transistor M2 is suppressed. In particular, for a thin-film transistor using oxide semiconductor (e.g., IGZO) for the semiconductor layer, as its pressure resistance is relatively low, it is possible to effectively suppress breakdown of the gate insulation layer in the thin-film transistor M2 by employing the configuration according to this embodiment.

4.3 Modified Example

Figure 27:
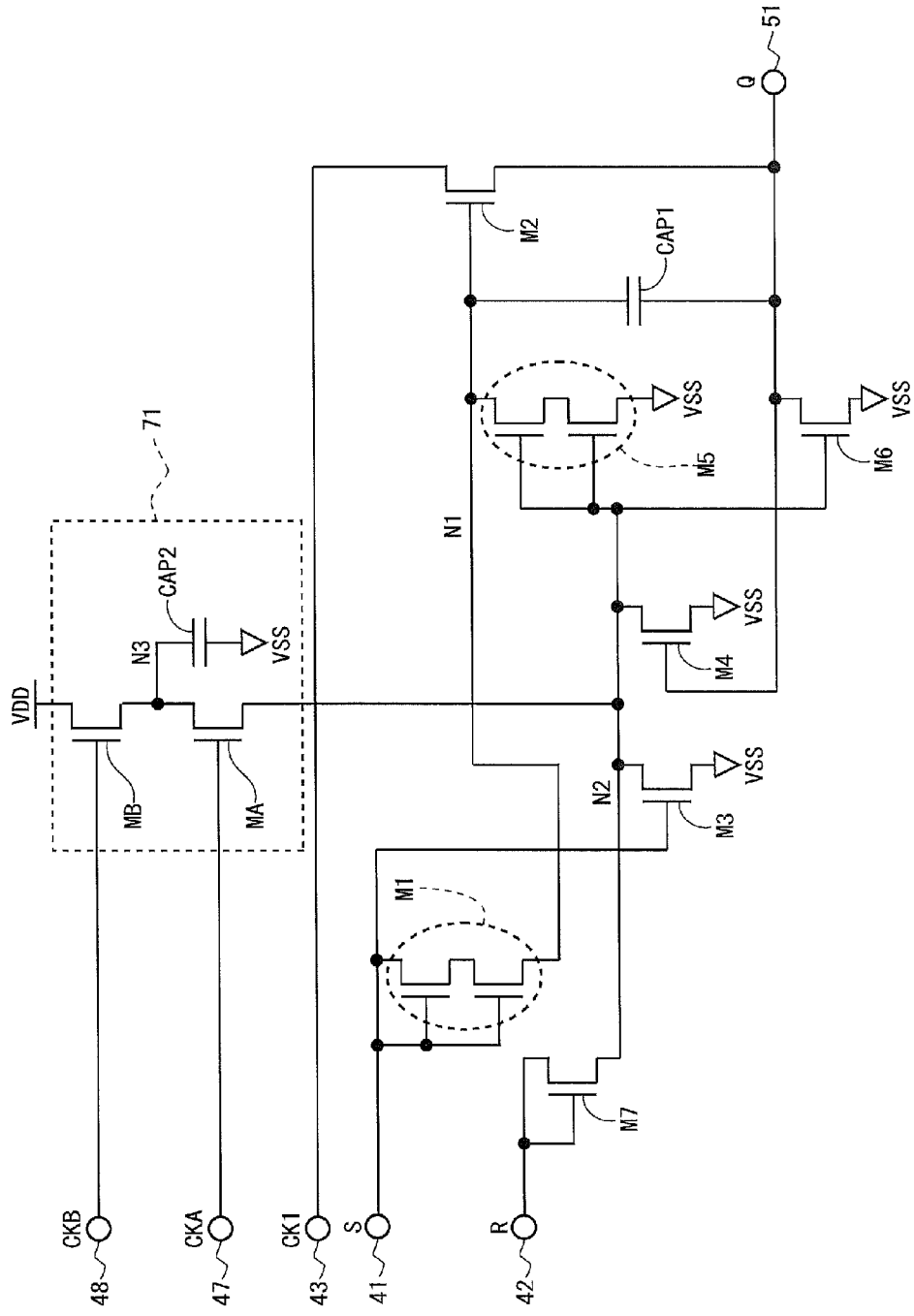
FIG. 27 is a circuit diagram showing a configuration of a bistable circuit according to a modified example of the fourth embodiment.

FIG. 27 is a circuit diagram showing a configuration of a bistable circuit according to a modified example of the fourth embodiment. In this modified example, the thin-film transistor M5 is multigated in addition to the thin-film transistor M1.

In the first to the third embodiment, when a thin-film transistor having a large leak current when a high voltage is applied between the drain and the source (a leak current when the voltage between the gate and the source is 0V) is employed, there is a concern that the potential of the first-node N1 possibly decreases during the selection period. Reasons of this are described below. As can be seen from FIG. 1 and FIG. 6, in the selection period, the voltages between the drains and the sources of the thin-film transistors M1 and M5 increase. While the potential of the set signal S and the potential of the second-node N2 are at the low level in the selection period, current leakages occur in the thin-film transistors M1 and M5 and the potential of the first-node N1 decreases during the selection period. When the potential of the first-node N1 decreases in the selection period in this manner, there is a possibility that the potential of the state signal Q may not increase up to the high level potential of the first clock for operation control CK1. Additionally, the potential of the state signal Q decreases by an electric charge flowing from a side of the output terminal 51 to a side of the input terminal 43 via the thin-film transistor M2 in the reset period, and time required for the potential of the state signal Q to decrease down to the low level becomes longer if the potential of the first-node N1 connected to the gate terminal of the thin-film transistor M2 is low. Thus, in this modified example, as illustrated in FIG. 27, the configuration is such that the thin-film transistors M1 and M5 whose drain terminal or the source terminal is connected to the first-node N1 are multigated.

According to this modified example, OFF currents of the thin-film transistors M1 and M5 are relatively small. Accordingly, even when employing a thin-film transistor using, for example, microcrystalline silicon (μc-Si) for its semiconductor layer, that is, a thin-film transistor having a large leak current, it is possible to sufficiently increase the potential of the state signal Q during the selection period, as well as to quickly decrease the potential of the state signal Q during the reset period.

5. Fifth Embodiment

5.1 Configuration of Bistable Circuit

Figure 28:
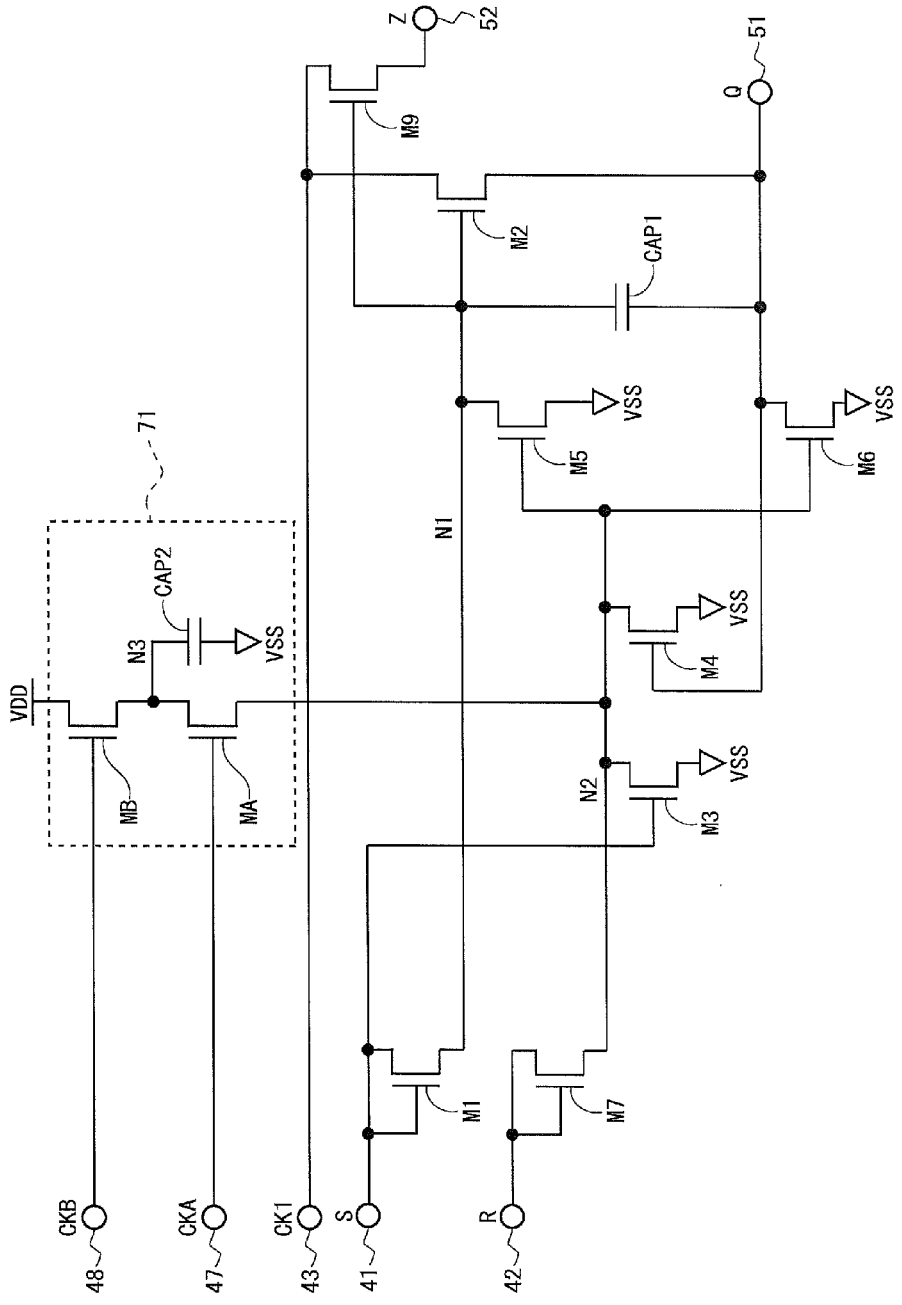
FIG. 28 is a circuit diagram showing a configuration of a bistable circuit according to a fifth embodiment of the present invention.
Figure 29:
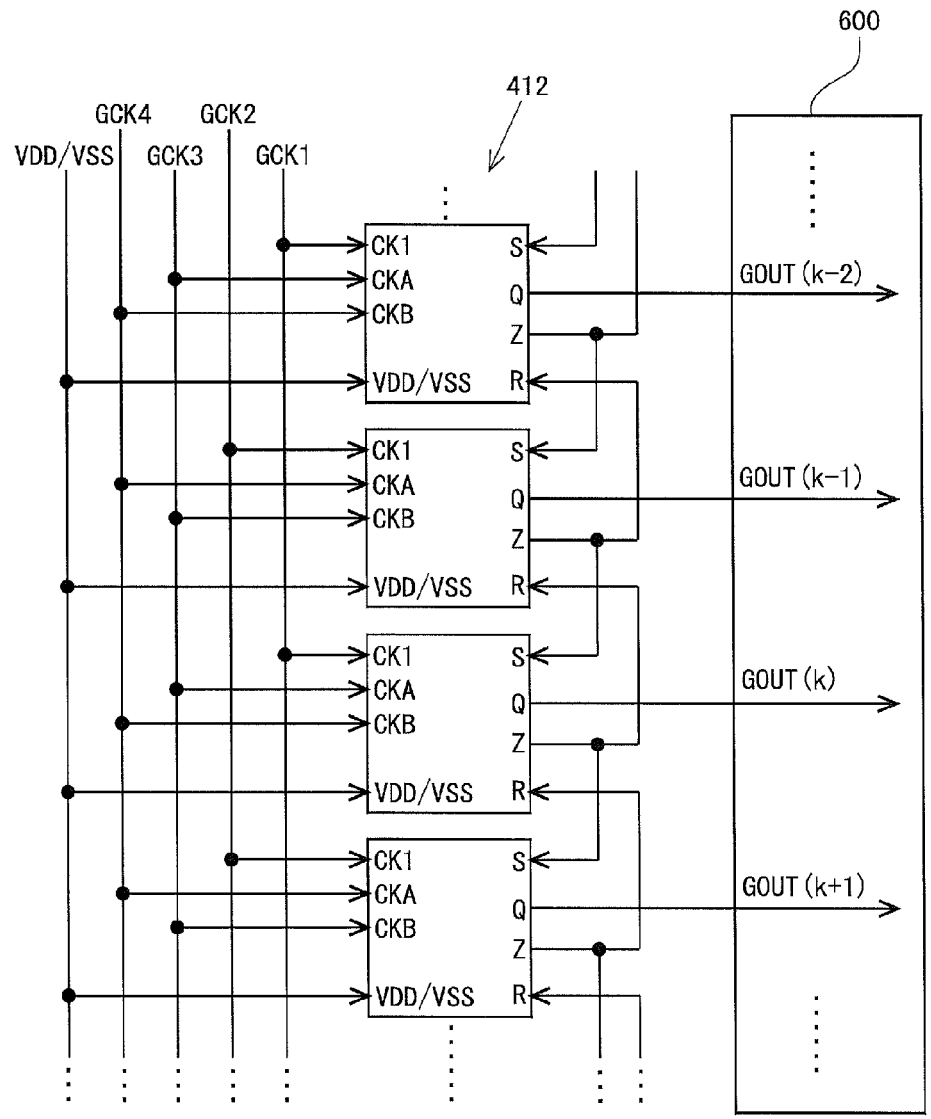
FIG. 29 is a block diagram showing a configuration of a shift register within a gate driver according to the fifth embodiment.

FIG. 28 is a circuit diagram showing a configuration of a bistable circuit according to a fifth embodiment of the present invention. According to this embodiment, the bistable circuit is provided with a thin-film transistor M9 and an output terminal 52, in addition to the components of the first embodiment illustrated in FIG. 1. The thin-film transistor M9 realizes a second output control switching element, and the output terminal 52 realizes a second-output-node. A signal outputted from the output terminal 52 of each bistable circuit is supplied, as a signal (hereinafter referred to as a "different stage control signal") Z for controlling an operation of a bistable circuit of a stage different from the each bistable circuit, to the bistable circuit of the different stage. Further, according to this embodiment, a shift register 412 is configured as illustrated in FIG. 29. Specifically, the different stage control signal Z outputted from the output terminal 52 of each stage of the shift register 412 is supplied to a previous stage as the reset signal R, and to a next stage as the set signal S. The state signal Q outputted from the output terminal 51 of each stage of the shift register 412 is used only for driving a gate bus line connected to this output terminal 51.

5.2 Effects

According to this embodiment, for each stage of the shift register 412, the signal for driving a gate bus line corresponding to this stage and the signal for controlling operations of a previous stage and a next stage of this stage are different. Accordingly, it is possible to make waveform bluntness of the set signal S and the reset signal R small in each bistable circuit. With this, even when a load capacitance of the gate bus line is large, the operation based on the set signal S and the operation based on the reset signal R are quickly performed in each bistable circuit, and the stability of the circuit operation is improved.

5.3 Modified Example

5.3.1 First Modified Example

Figure 30:
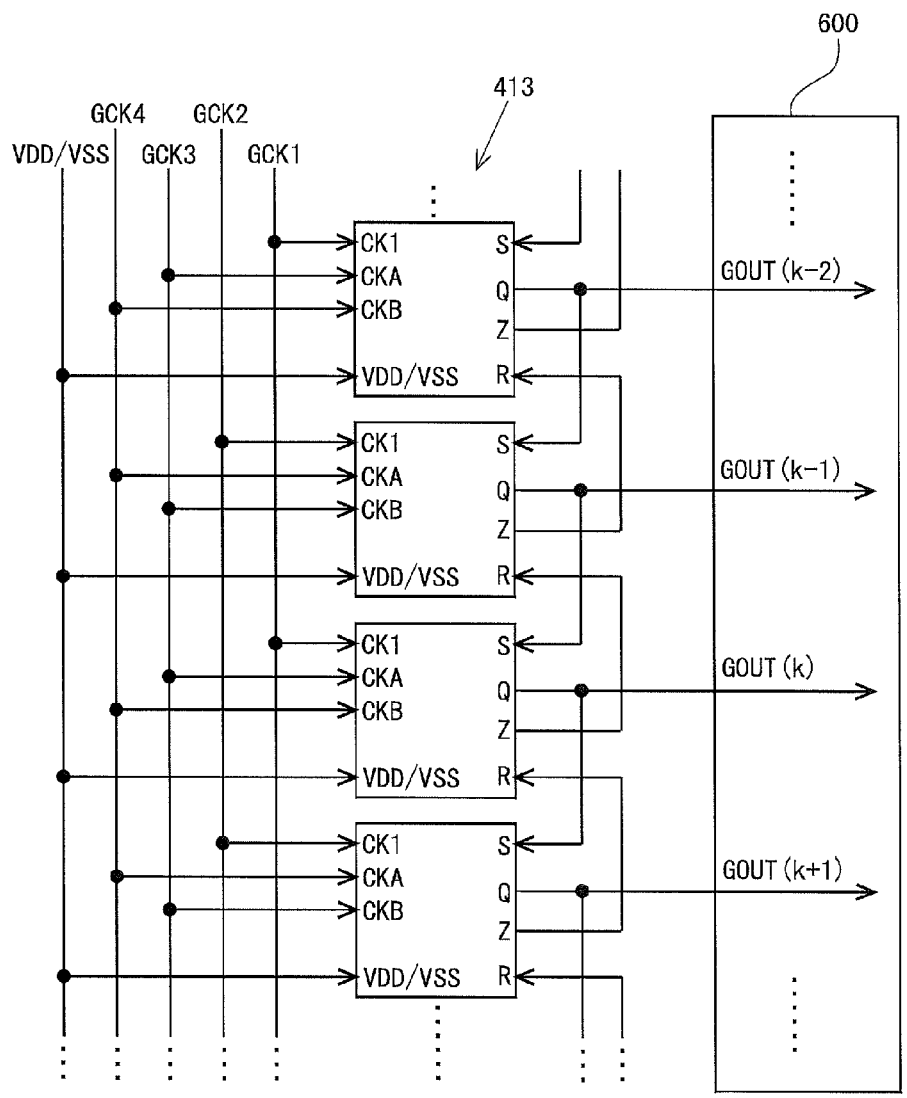
FIG. 30 is a block diagram showing a configuration of a shift register within a gate driver according to a first modified example of the fifth embodiment.

FIG. 30 is a block diagram showing a configuration of a shift register 413 within the gate driver 400 according to a first modified example of the fifth embodiment. Unlike the fifth embodiment, in this modified example, the different stage control signal Z outputted from the bistable circuit is not supplied to the next stage as the set signal S. Specifically, in this modified example, the different stage control signal Z outputted from the bistable circuit is used only as the reset signal R. Accordingly, the state signal Q outputted from the bistable circuit is used as the set signal S for controlling the operation of the next stage, in addition to as the signal for driving the gate bus line.

As can be seen from FIG. 6, as for the set period, it is sufficient if the potential of the first-node N1 increases up to a sufficient level until a time point at which the set period ends. Further, as for the reset period, the potential of the state signal Q should quickly decrease down to the low level after the reset period starts. Considering the points stated above, in terms of the circuit operation, the waveform bluntness occurring in the set signal S is more unfavorable than the waveform bluntness occurring in the reset signal R. Therefore, by employing the configuration in which the different stage control signal Z is used only as the reset signal R as in this modified example, a load applied to the output terminal 52 is reduced as compared to the fifth embodiment, and a rise time of the reset signal R in each stage of the shift register 413 is reduced. With this, the potential of the state signal Q quickly decreases down to the low level after the selection period ends, and the reliability of the circuit operation is improved.

5.3.2 Second Modified Example

Figure 31:
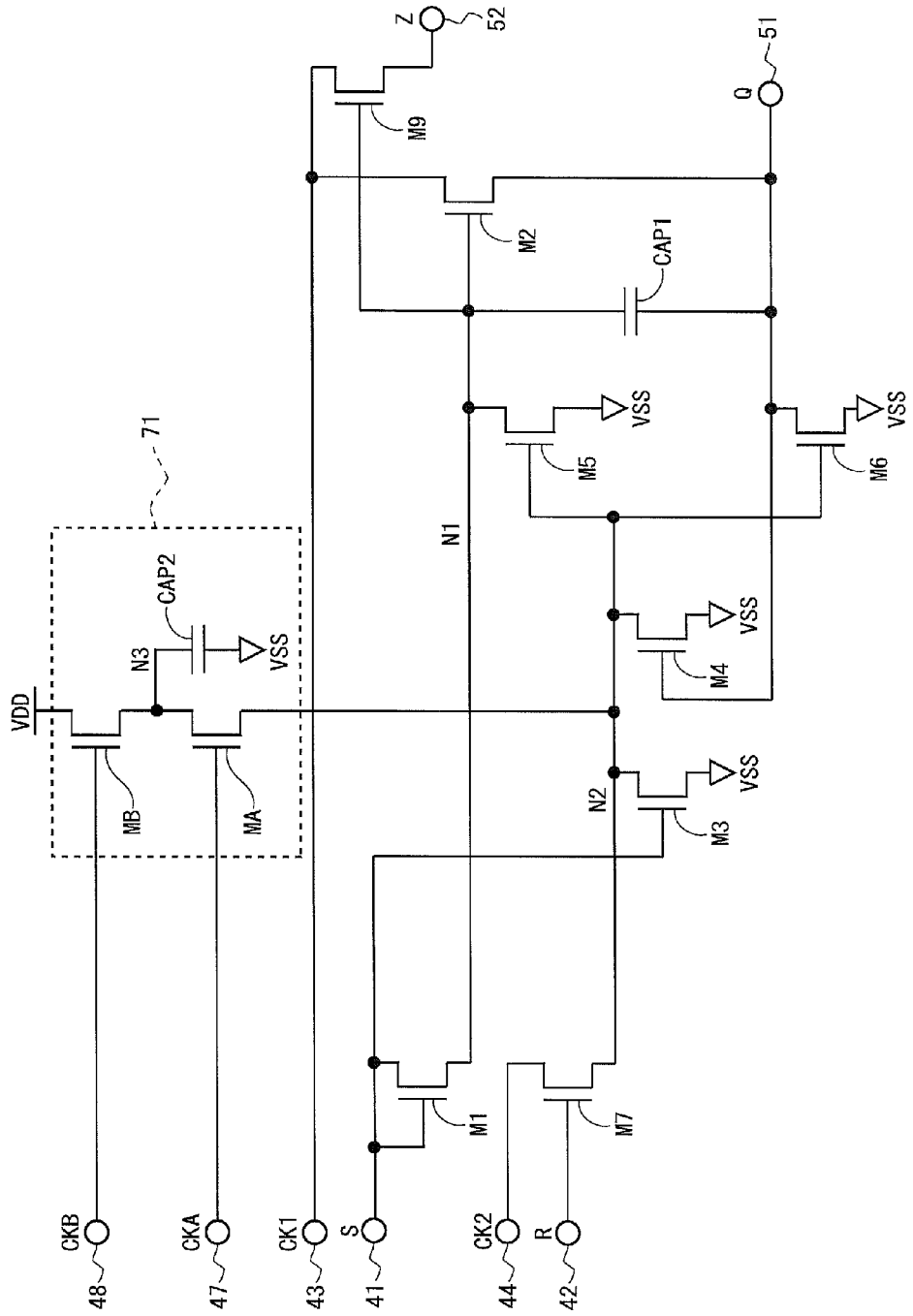
FIG. 31 is a circuit diagram showing a configuration of a bistable circuit according to a second modified example of the fifth embodiment.
Figure 32:
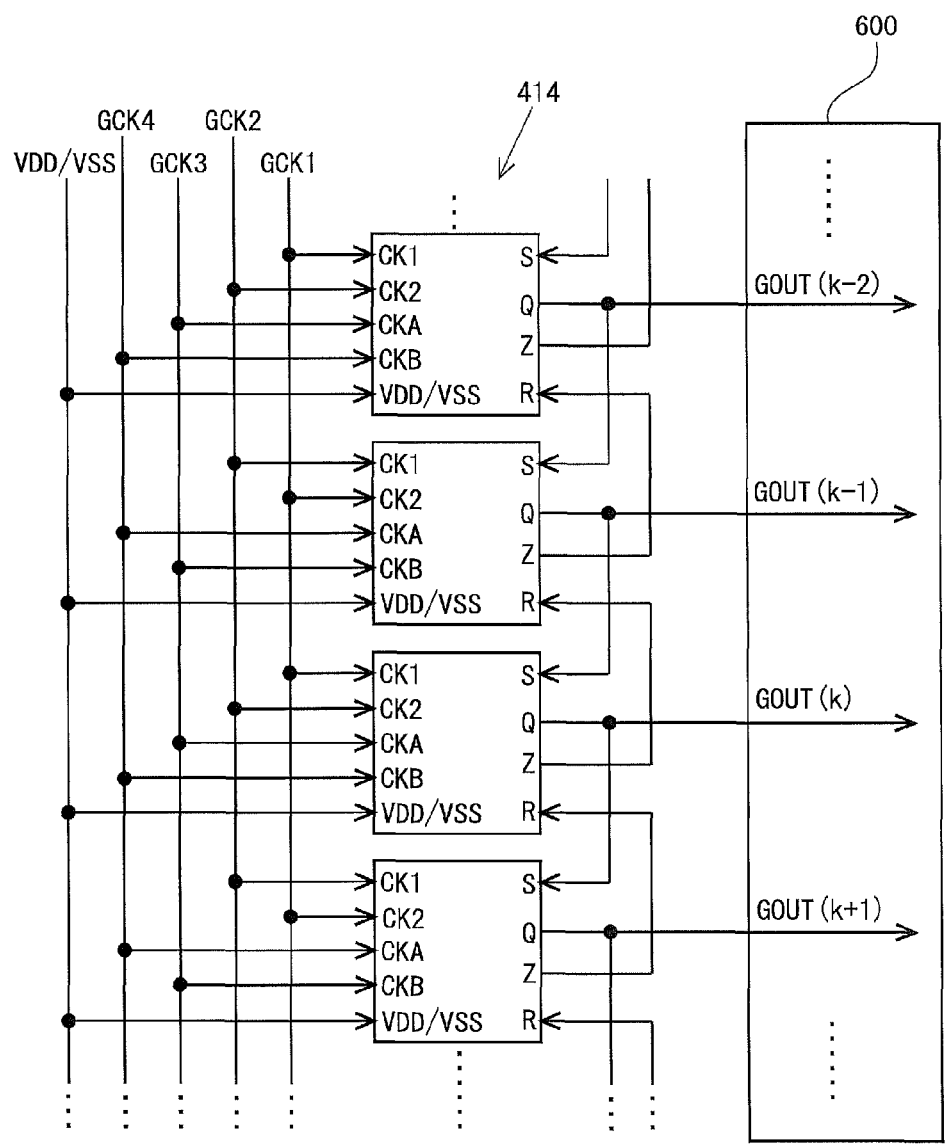
FIG. 32 is a block diagram showing a configuration of a shift register within a gate driver according to the second modified example of the fifth embodiment.

FIG. 31 is a circuit diagram showing a configuration of a bistable circuit according to a second modified example of the fifth embodiment. In this modified example, the drain terminal of the thin-film transistor M7 is connected to the input terminal 44 for receiving the second clock for operation control CK2. When this configuration is employed, a shift register 414 is configured as illustrated in FIG. 32, so that the first clock for operation control CK1 and the second clock for operation control CK2 that are alternately turned to the high level every other single horizontal scanning period as illustrated in FIG. 9 are supplied to the bistable circuit.

In this modified example, as the drain terminal of the thin-film transistor M7 is supplied with the second clock for operation control CK2, the power supply voltage becomes an electric charge supply source of the second-node N2. Further, a load applied to the input terminal 42 is reduced. Accordingly, as compared to the fifth embodiment, a flow of an electric charge from the input terminal 42 to the second-node N2 is prevented, and the potential of the input terminal 42 quickly increases.

In the third modified example of the first embodiment (see FIG. 12), while rise timing of the reset signal R and rise timing of the second clock for operation control CK2 are substantially the same, it takes longer until the reset signal R fully rises than the second clock for operation control CK2 does. This also applies when these signals fall. This is because the state signal Q outputted from the bistable circuit is not only used as the reset signal R of the previous stage but also as the scanning signal for driving the gate bus line and the set signal S of the next stage, and thus the load applied to the gate bus line is large. Therefore, the reset signal R is more susceptible to waveform bluntness than the second clock for operation control CK2. Accordingly, during a period starting from time t5 and thereafter in FIG. 9, the potential of the gate terminal of the thin-film transistor M7 often becomes higher than the VSS potential after the potential of the drain terminal of the thin-film transistor M7 decreases down to the VSS potential. As a result, there is a concern that the potential of the second-node N2 decreases during the period starting from time t5 and thereafter. By contrast, according to this modified example, the signal used as the reset signal R and the signal used as the scanning signal and the set signal S are different. Specifically, the different stage control signal Z outputted from the output terminal 52 of each stage of the shift register 414 is used as the reset signal R for the previous stage of the each stage, and the state signal Q outputted from the output terminal 51 of each stage of the shift register 414 is used as the scanning signal for driving the gate bus line corresponding to the each stage and the set signal S for the next stage of the each stage. With this, the signal outputted from the output terminal 52 having relatively small load (the different stage control signal Z) becomes the reset signal R, and therefore the waveform bluntness of the reset signal R is suppressed. Thus, a decrease of the potential of the second-node N2 in the period after the reset period ends is suppressed.

5.3.3 Third Modified Example

Figure 33:
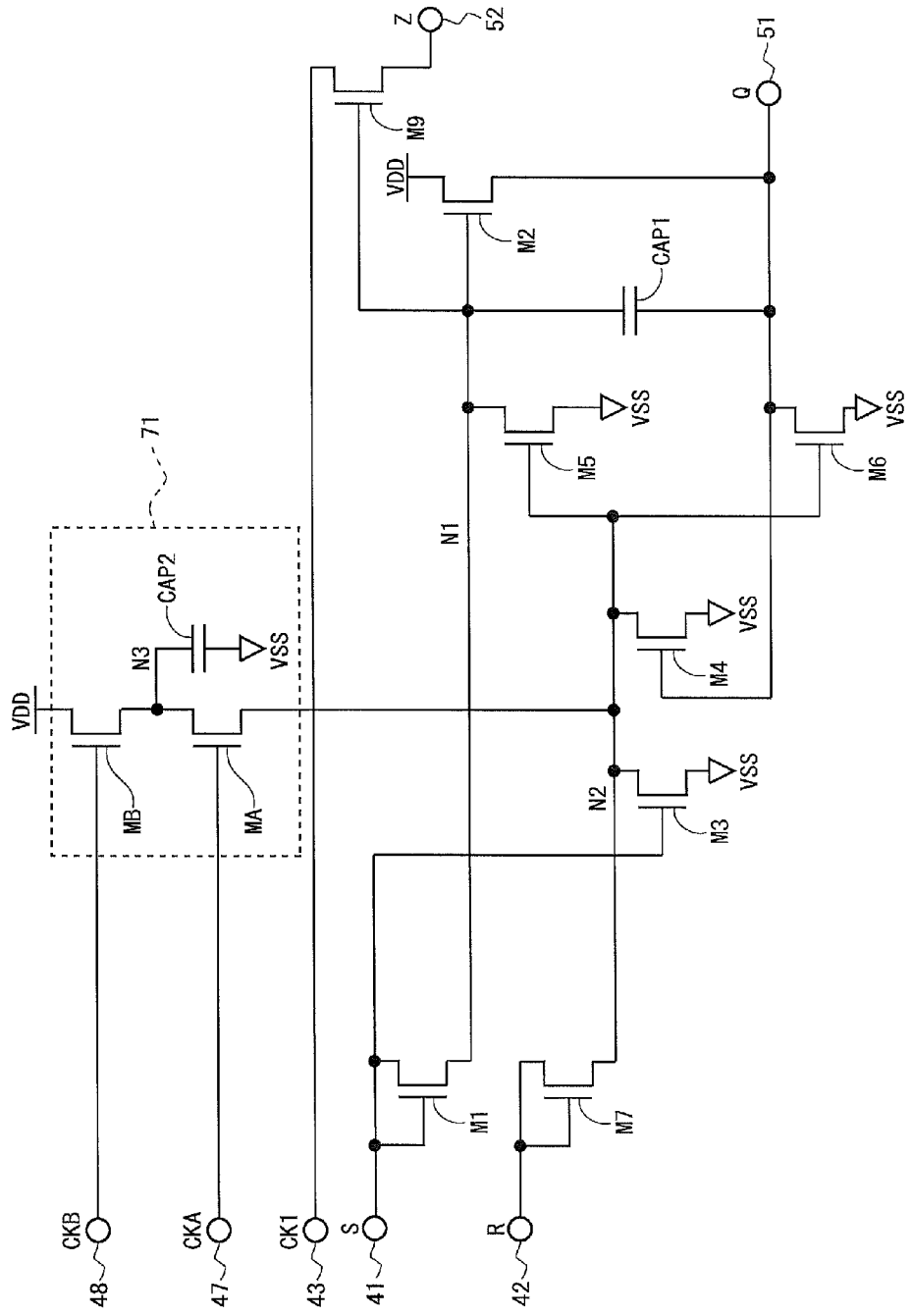
FIG. 33 is a circuit diagram showing a configuration of a bistable circuit according to a third modified example of the fifth embodiment.
Figure 34:
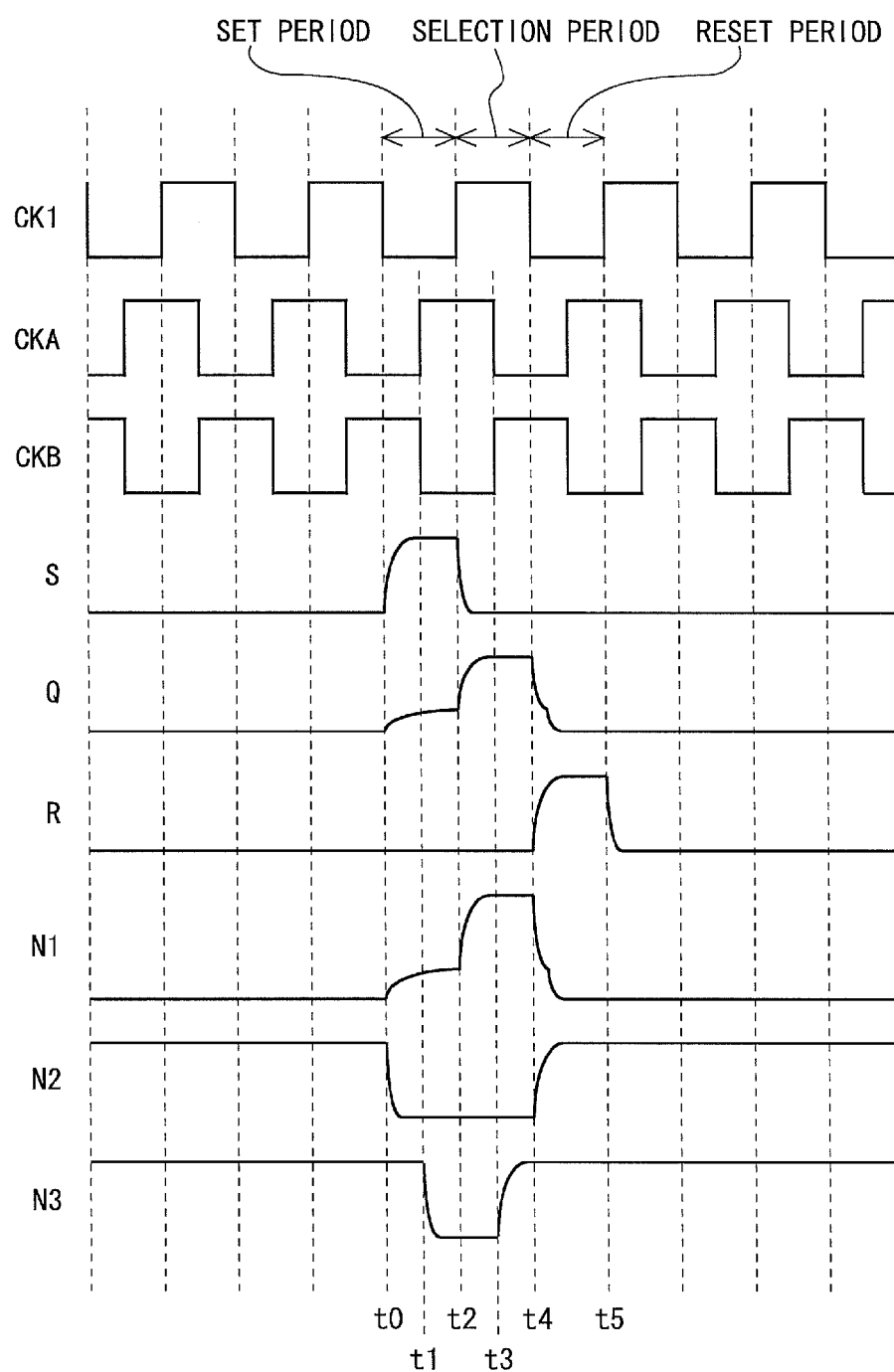
FIG. 34 is a signal waveform diagram for illustration of an operation of the bistable circuit according to the third modified example of the fifth embodiment.

FIG. 33 is a circuit diagram showing a configuration of a bistable circuit according to a third modified example of the fifth embodiment. In this modified example, the drain terminal of the thin-film transistor M2 is connected to the input terminal for the high-level DC power supply potential VDD. According to this modified example, the bistable circuit operates during the set period and the selection period as described below (see FIG. 34).

In the set period (at time t0), the set signal S changes from the low level to the high level. With this, the thin-film transistor M1 is turned to the ON state, and the capacitor CAP1 is charged (here, precharged). Accordingly, the potential of the first-node N1 changes from the low level to the high level, the thin-film transistors M2 and M9 are turned to the ON state. As the drain terminal of the thin-film transistor M2 is supplied with the VDD potential, the potential of the state signal Q increases by the thin-film transistor M2 being turned to the ON state. The potential of the different stage control signal Z is maintained at the low level, as the first clock for operation control CK1 is at the low level in the set period. Further, by the set signal S being driven to the high level, the thin-film transistor M3 is turned to the ON state and the potential of the second-node N2 is turned to the low level. At time t1, while the thin-film transistor MA is turned to the ON state, the potential of the third-node N3 decreases down to the low level similarly to the first embodiment.

In the selection period (at time t2), the set signal S changes from the high level to the low level. With this, similarly to the first embodiment, the first-node N1 is turned to the floating state. Here, at time t2, the first clock for operation control CK1 changes from the low level to the high level. As there is a parasitic capacitance between the gate and the drain of the thin-film transistor M9, the potential of the first-node N1 increases as the potential of the input terminal 43 increases. As a result, the thin-film transistors M2 and M9 are fully turned to the ON state. By the thin-film transistor M2 being fully turned to the ON state, the potential of the state signal Q increases up to the VDD potential. Additionally, by the thin-film transistor M2 being fully turned to the ON state, the potential of the different stage control signal Z increases up to the high level potential of the first clock for operation control CK1. It should be noted that the potential of the second-node N2 is maintained at the low level similarly to the first embodiment. In addition, in the period from time t2 to time t3, while the thin-film transistor MA is in the ON state, the potential of the third-node N3 is maintained at the low level similarly to the first embodiment.

According to this modified example, the potential of the state signal Q starts to increase in the set period. Accordingly, the gate bus line is quickly turned to the selected state in the selection period, and charging time of the pixel capacitance is sufficiently ensured. Further, as the configuration is such that the drain terminal of the thin-film transistor M2 is supplied with the VDD potential instead of the clock signal, a load applied to the wiring for the clock signal is reduced. Accordingly, an occurrence of the waveform bluntness in the clock signal is suppressed, and the power consumption is reduced.

Further, in this modified example, a voltage source for scanning signals and a voltage source for driving circuits are different systems. Accordingly, it is possible to set a potential VGH on a high level side of the scanning signal (a potential for turning the thin-film transistor whose gate terminal is connected to the gate bus line through which the scanning signal is transmitted to the ON state) and a potential VCK on a high level side of the clock signal at different potentials. Here, the scanning signal requires a voltage amplitude with which the pixel capacitance is sufficiently charged, regardless of the magnitude of the video signal voltage. Accordingly, in general, the voltage amplitude of the scanning signal is greater than a voltage amplitude required for switching a thin-film transistor. According to this modified example, it is sufficient as long as the voltage amplitude of the clock signal is set to a magnitude required for switching a thin-film transistor. As described above, it is possible to reduce the power consumption as compared to the conventional configuration in which the voltage amplitude of the clock signal is as large as that of the scanning signal.

In the meantime, it is preferable that relation between the potential VGH on the high level side of the scanning signal and the potential VCK on the high level side of the clock signal satisfies expressions (4) and (5).

$$VCK \geq VGH/2 \quad (4)$$

$$VCK \leq VGH \quad (5)$$

It is preferable to satisfy the expression (4) because of the following reason. During the selection period, the potential of the scanning signal should increase sufficiently so that the thin-film transistor 60 (see FIG. 2) in each pixel formation portion within a display unit 600 is turned to the ON state. Accordingly, the potential of the first-node N1 should be as high as VGH during the selection period. Here, in the selection period, the potential of the first-node N1 ideally becomes two times as high as VCK. Accordingly, when VCK is made lower than a half of VGH, the potential of the first-node N1 does not become higher than VGH during the selection period. As a result, the potential of the scanning signal for driving each gate bus line does not sufficiently increase in the selection period.

More specifically, where a reference potential is 0V, an increased voltage of the first-node N1 during the selection period is A×VCK, a threshold voltage of the thin-film transistor M1 is V1$th$, and a threshold voltage of the thin-film transistor M2 is V2$th$, it is preferable that an expression (6) be established.

$$(1+A) \times VCK - V1th - V2th \geq VGH \qquad (6)$$

The expression (6) can be modified as an expression (7).

$$VCK \geq (VGH + V1th + V2th)/(1+A) \qquad (7)$$

Where the threshold voltages V1$th$ and V2$th$ are 0 and A is 1 in the expression (7), the expression (4) is derived.

Further, It is preferable to satisfy the expression (5) because of the following reason. In general, a power consumption W of electrical signals is proportional to a product of the square of a voltage (amplitude) V, a capacitance C, and a frequency f. Here, as the frequency f is relatively large for the clock signal and the power consumption W is proportional to the square of the voltage V, the power consumption W can be reduced to a large extent by decreasing the voltage V of the clock signal, that is the potential VCK on the high level side of the clock signal. Therefore, it is preferable that the expression (5) be established. It should be noted that, according to this modified example, the thin-film transistor M2 having a relatively large parasitic capacitance is not supplied with the clock signal. Accordingly, the capacitance C that influences a magnitude of the power consumption W of the clock signal is made smaller even when the expression (5) is not established, and therefore it is possible to obtain an effect of power consumption reduction.

6. Sixth Embodiment

6.1 Configuration of Bistable Circuit

Figure 35:
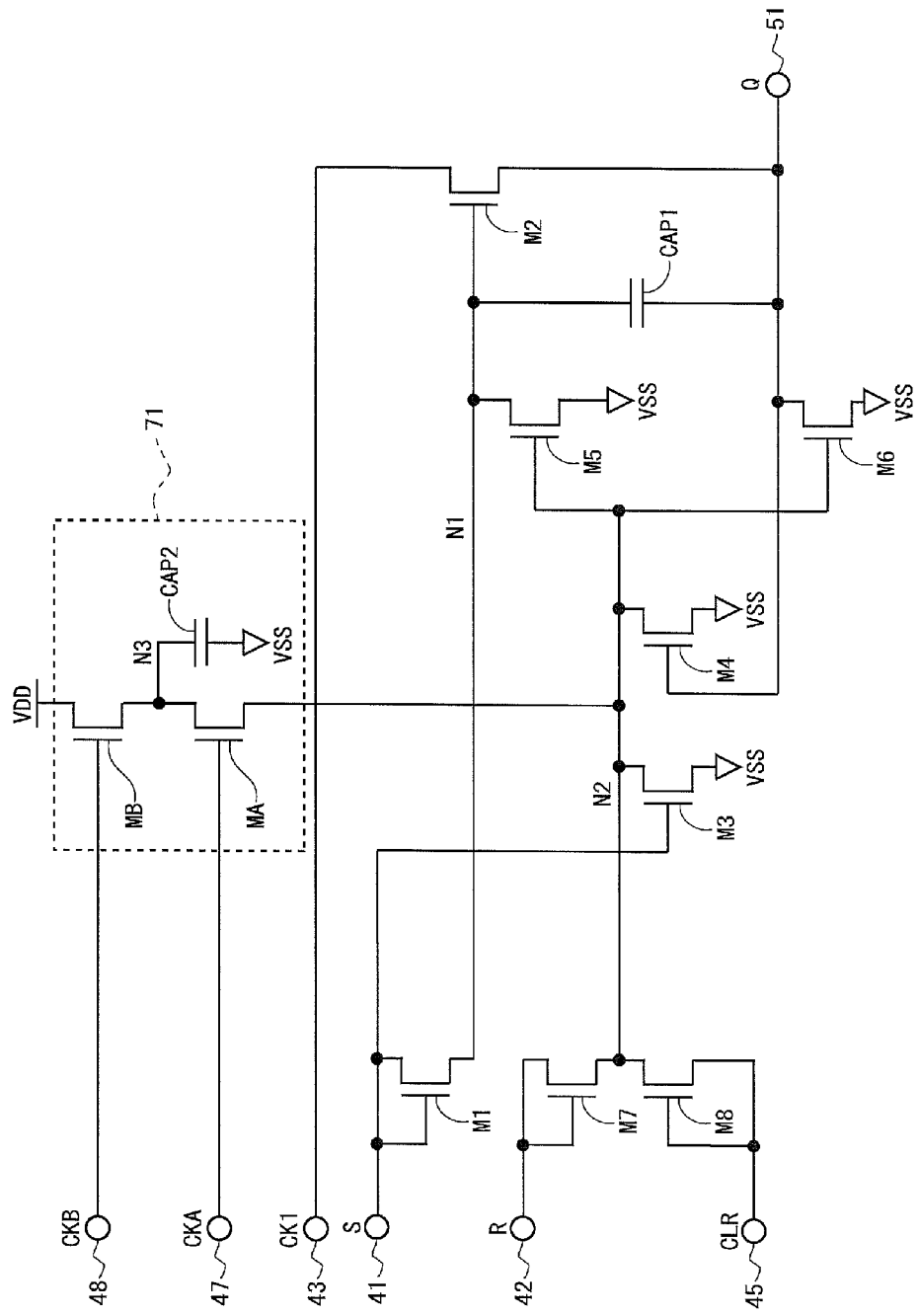
FIG. 35 is a circuit diagram showing a configuration of a bistable circuit according to a sixth embodiment of the present invention.
Figure 36:
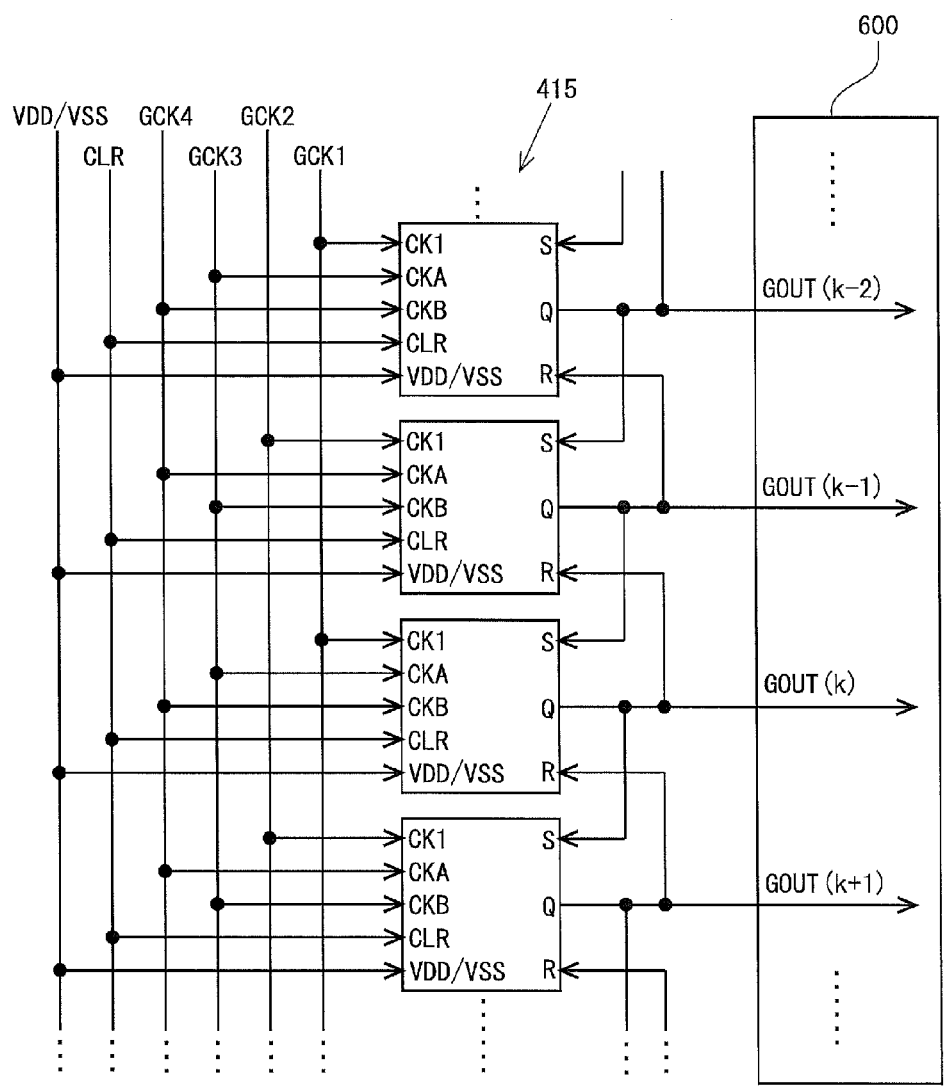
FIG. 36 is a block diagram showing a configuration of a shift register within a gate driver according to the sixth embodiment.
Figure 37:
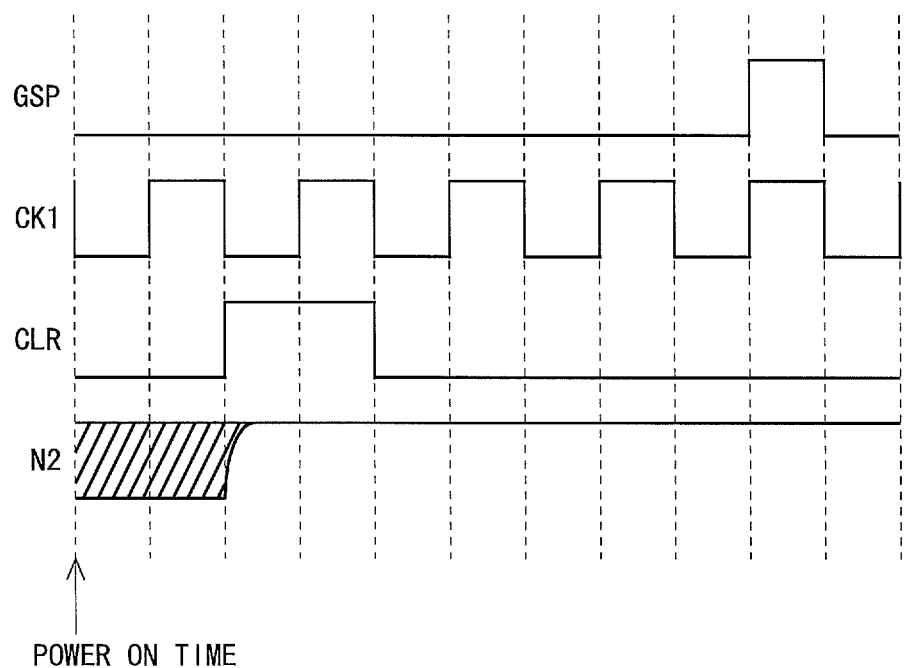
FIG. 37 is a signal waveform diagram for illustration of an operation of the bistable circuit according to the sixth embodiment.

FIG. 35 is a circuit diagram showing a configuration of a bistable circuit according to a sixth embodiment of the present invention. According to this embodiment, the bistable circuit is provided with a thin-film transistor M8 in addition to the components of the first embodiment illustrated in FIG. 1. The thin-film transistor M8 realizes a second second-node turnon switching element. For the thin-film transistor M8, a gate terminal and a drain terminal are connected to an input terminal 45 for receiving a clear signal CLR for initializing each bistable circuit, and a source terminal is connected to the second-node N2. Here, the input terminal 45 realizes a third-input-node. The thin-film transistor M8 functions so as to change the potential of the second-node N2 to the high level when the clear signal CLR is at the high level. When this configuration is employed, a shift register 415 is configured as illustrated in FIG. 36 so that each bistable circuit is supplied with the clear signal CLR. It should be noted that as illustrated in FIG. 37, the clear signal CLR is turned to the high level only during a certain period before an initial pulse of the gate start pulse signal GSP is generated out of the period after the power of the device is turned on, and turned to the low level other than this period. Further, while timing at which the clear signal CLR changes synchronizes with timing at which the first clock for operation control CK1 changes in FIG. 37, it is not necessary that these timing synchronize with each other.

As the thin-film transistors MA and MB are not turned to the ON state at the same time, the charge of the second-node N2 via the third-node N3 is carried out relatively in a moderate manner. In the first to the fifth embodiment, the second-node N2 is changed to the high level mainly by the reset signal R. Accordingly, after the power of the device is turned on, in each bistable circuit, during a period until the reset signal R is first driven to the high level, it takes a certain period of time until the potential of the second-node N2 reaches the high level. During this period, the potential of the second-node N2 is indeterminate. For example, when the potential of the second-node N2 after the power of the device is turned on is the VSS potential, the thin-film transistors M5 and M6 are turned to the OFF state during a certain period immediately after the power of the device is turned on. Accordingly, when a noise is generated in the first-node N1 due to the presence of the parasitic capacitance between the gate and the drain of the thin-film transistor M2, the potential of the state signal Q that should be essentially maintained at the low level is not maintained at the low level.

By contrast, according to this embodiment, the clear signal CLR is at the high level during a period after the power of the device is turned on until an operation of the shift register 415 starts. The thin-film transistor M8 is diode-connected as illustrated in FIG. 35, and therefore the thin-film transistor M8 is turned to the ON state by the clear signal CLR driven to the high level, and the potential of the second-node N2 changes to the high level from an indeterminate state. Accordingly, the thin-film transistors M5 and M6 are turned to the ON state before the operation of the shift register 415 starts. With this, at a time point at which the operation of the shift register 415 starts, the potential of the first-node N1 and the potential of the state signal Q are at the low level in all the bistable circuits, and thus the stability of the circuit operation is improved.

Figure 38:
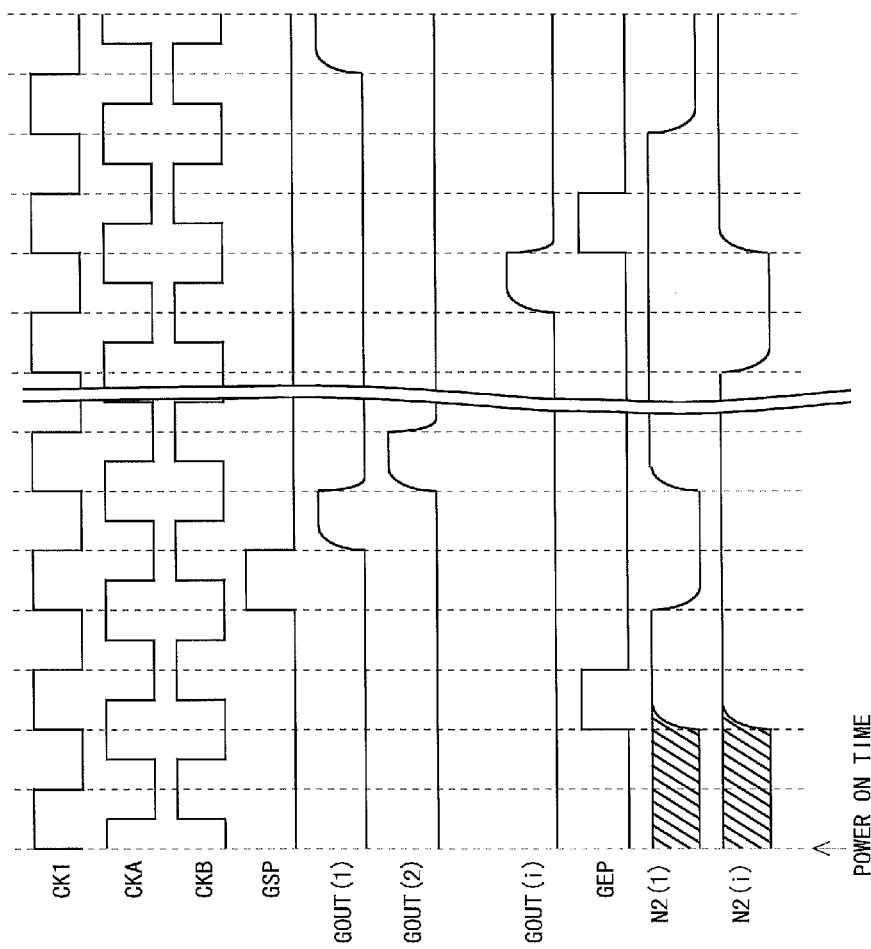
FIG. 38 is a signal waveform diagram for illustration of a preferred driving method when using the gate end pulse signal as a clear signal according to the sixth embodiment.

It should be noted that it is preferable that there be a period in which the clear signal CLR is at the high level during a vertical blanking interval (a period from a pulse of the gate end pulse signal GEP is generated until a pulse of the gate start pulse signal GSP is generated). With this, the potential of the first-node N1 and the potential of the state signal Q are turned to the low level in all of the bistable circuits every single vertical scanning period, and therefore the stability of the circuit operation is further improved. Further, the gate end pulse signal GEP can be used as the clear signal CLR. With this, the stability of the circuit operation is further improved while reducing a number of signals. Moreover, when the gate end pulse signal GEP is used as the clear signal CLR, it is preferable that driving of the shift register start according to an oscillation of the gate end pulse signal GEP as illustrated in FIG. 38.

6.2 Modified Example

6.2.1 First Modified Example

Figure 39:
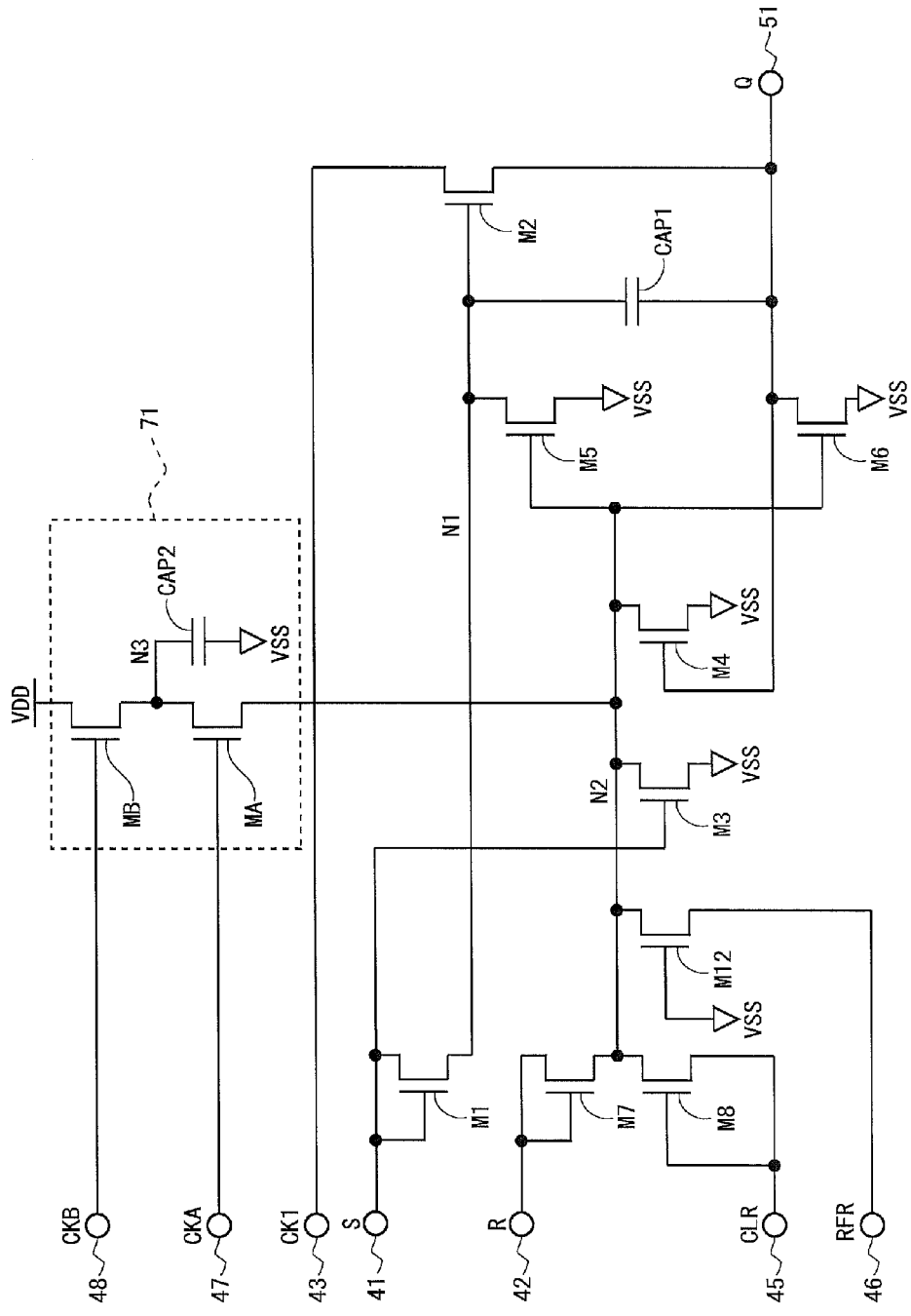
FIG. 39 is a circuit diagram showing a configuration of a bistable circuit according to a first modified example of the sixth embodiment.

FIG. 39 is a circuit diagram showing a configuration of a bistable circuit according to a first modified example of the sixth embodiment. In this modified example, a thin-film transistor M12 is provided in addition to the components of the sixth embodiment illustrated in FIG. 35. The thin-film transistor M12 realizes a second-node level lowering switching element. For the thin-film transistor M12, a gate terminal is connected to the input terminal for the DC power supply potential VSS at the low level, a drain terminal is connected to the second-node N2, and a source terminal is connected to an input terminal 46 for receiving a refresh signal RFR for decreasing the potential of the second-node N2 down to a potential lower than the VSS potential. Here, the input terminal 46 realizes a fourth-input-node.

Figure 40:
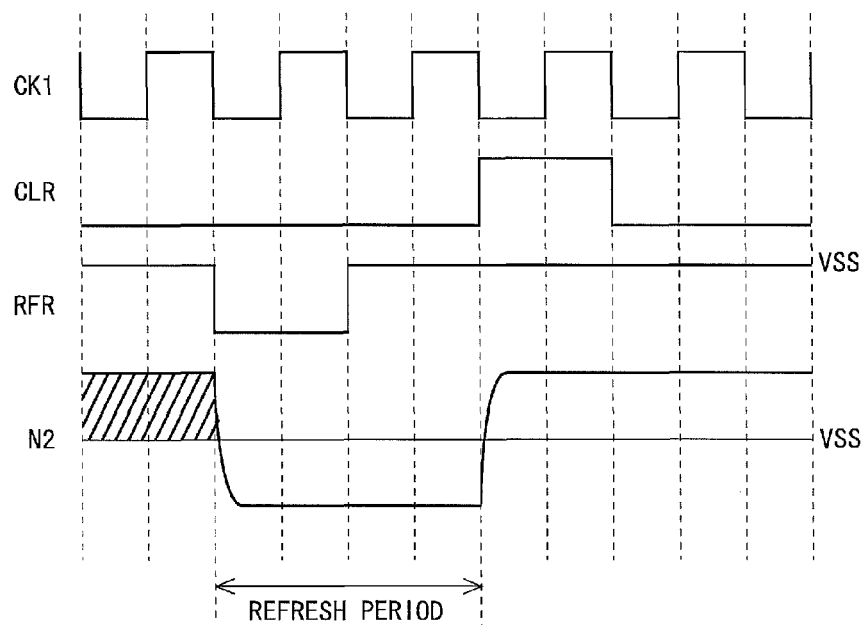
FIG. 40 is a signal waveform diagram for illustration of an operation of the bistable circuit according to the first modified example of the sixth embodiment.

As illustrated in FIG. 40, the refresh signal RFR is maintained at the VSS potential during a period excluding a certain period. Specifically, it is set to a potential lower than the VSS potential only during a certain period before the clear signal CLR is set to the high level. It should be noted that while timing at which the refresh signal RFR changes synchronizes with the timing at which the first clock for operation control CK1 changes in FIG. 40, it is not necessary that these timing synchronize with each other.

In the first to the sixth embodiment, the potential of the second-node N2 is maintained at the high level for most periods. Accordingly, for the most period, the thin-film transistors M5 and M6 are in the ON state. Therefore, as for the thin-film transistors M5 and M6, there is a concern that the characteristic may deteriorate due to a threshold shift. By contrast, according to this modified example, the potential of the second-node N2 is maintained at a potential lower than the VSS potential during a period (a refresh period in FIG. 40) from a time point at which the potential of the refresh signal RFR becomes lower than the VSS potential until a time point at which the clear signal CLR changes from the low level to the high level. Accordingly, during this period, a negative voltage is applied between the gates and the sources of the thin-film transistors M5 and M6. With this, during the operation of the shift register, it is possible to prevent or suppress the threshold shift of the thin-film transistors M5 and M6. It should be noted that, it is preferable that the refresh period be provided in the vertical blanking interval (the period from a pulse of the gate end pulse signal GEP is generated until a pulse of the gate start pulse signal GSP is generated).

In the meantime, as the thin-film transistors M5 and M6 are turned to the OFF state during the refresh period, there is a concern that the potential of the first-node N1 increases due to fluctuation of the potential of the first clock for operation control CK1. Therefore, it is preferable to maintain the first gate clock signal GCK1 and the second gate clock signal GCK2 at the low level during the refresh period. With this, in the refresh period, the first clock for operation control CK1 supplied to each bistable circuit is turned to the low level, and the potential of the first-node N1 is maintained at low level even when the thin-film transistors M5 and M6 are in the OFF state. As a result, the stability of the circuit operation is further improved.

6.2.2 Second Modified Example

Figure 41:
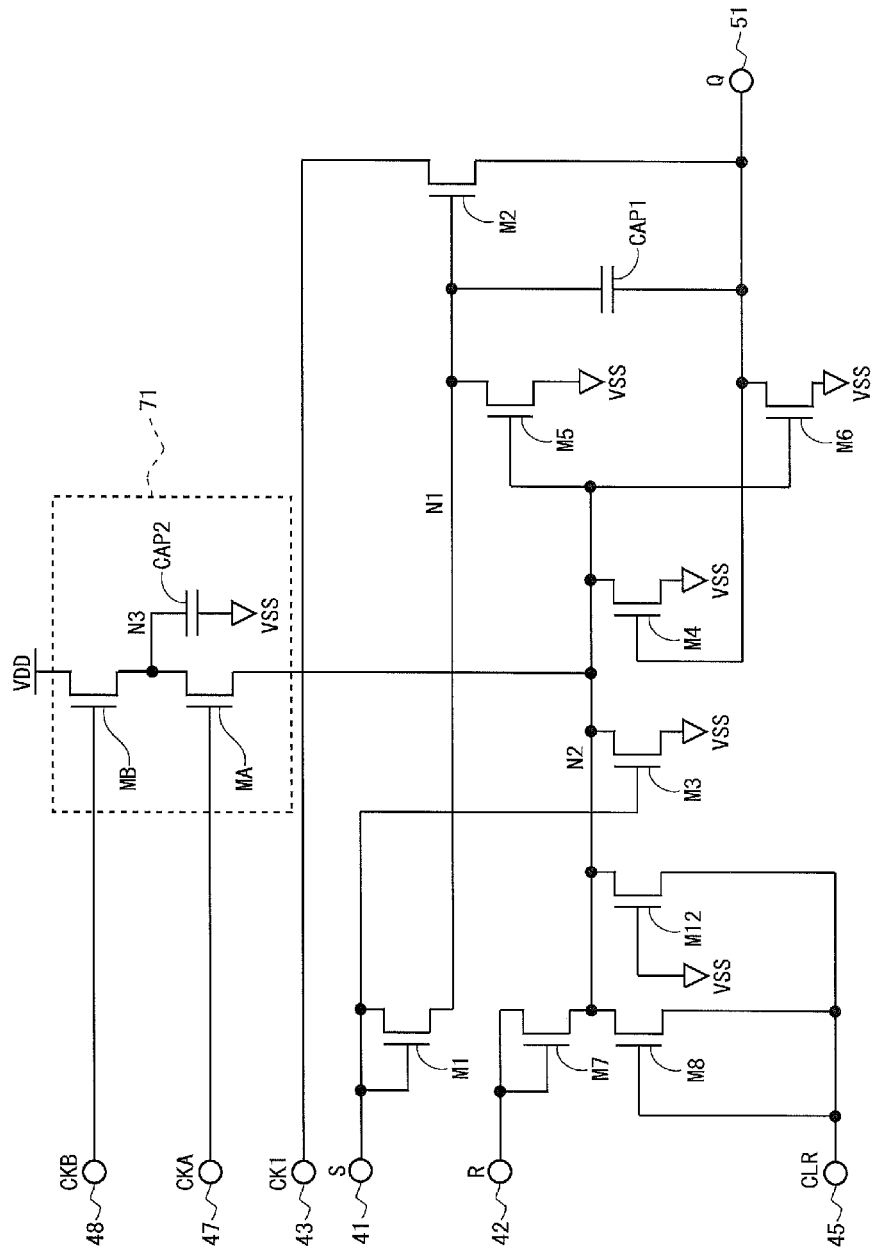
FIG. 41 is a circuit diagram showing a configuration of a bistable circuit according to a second modified example of the sixth embodiment.

FIG. 41 is a circuit diagram showing a configuration of a bistable circuit according to a second modified example of the sixth embodiment. Similarly to the first modified example, in this modified example, the thin-film transistor M12 is provided in addition to the components of the sixth embodiment illustrated in FIG. 35. In the meantime, in the first modified example, the bistable circuit is configured such that the gate terminal and the drain terminal of the thin-film transistor M8 are supplied with the clear signal CLR, and the source terminal of the thin-film transistor M12 is supplied with the refresh signal RFR. By contrast, in this modified example, the bistable circuit is configured such that the gate terminal and the drain terminal of the thin-film transistor M8, and the source terminal of the thin-film transistor M12 are supplied with the clear signal CLR.

Figure 42:
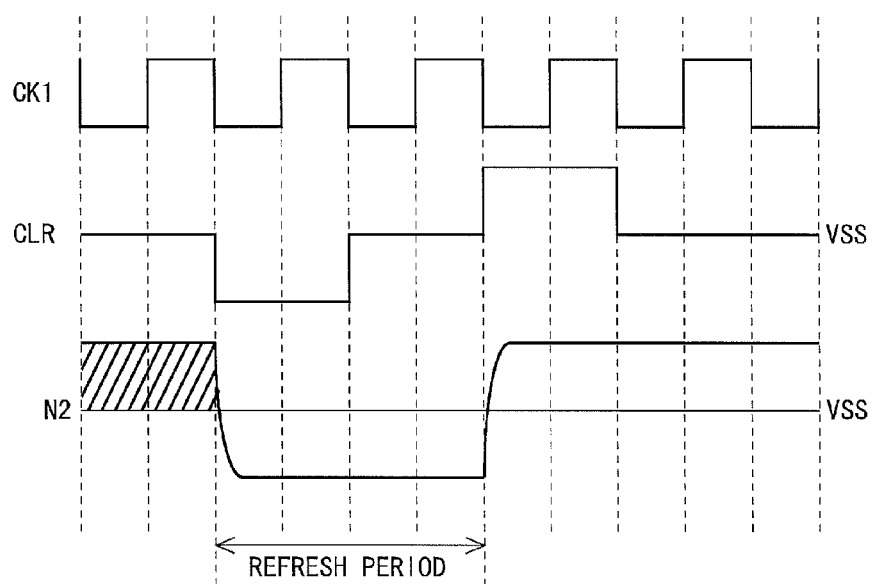
FIG. 42 is a signal waveform diagram for illustration of an operation of the bistable circuit according to the second modified example of the sixth embodiment.

In this modified example, as illustrated in FIG. 42, the clear signal CLR is turned to a potential lower than the VSS potential during one period, turned to a potential higher than the VSS potential during a different period, and maintained at the VSS potential during a period (most period) other than these periods. Specifically, the potential of the clear signal CLR is turned to the potential lower than the VSS potential during a certain period before the period during which the potential of the clear signal CLR is higher than the VSS potential. It is preferable that the periods during which the potential of the clear signal CLR is turned to the potential other than the VSS potential are provided in the vertical blanking interval (the period from a pulse of the gate end pulse signal GEP is generated until a pulse of the gate start pulse signal GSP is generated). It should be noted that while timing at which the clear signal CLR changes synchronizes with timing at which the first clock for operation control CK1 changes in FIG. 42, it is not necessary that these timing synchronize with each other.

According to this modified example, when the potential of the clear signal CLR becomes lower than the VSS potential, the thin-film transistor M12 is turned to the ON state, and the potential of the second-node N2 decreases down to a potential lower than the VSS potential. Further, when the potential of the clear signal CLR becomes higher than the VSS potential, the thin-film transistor M8 is turned to the ON state, and the potential of the second-node N2 is turned to the high level. As described above, according to this modified example, it is possible to obtain the same effect as that of the first modified example without using the refresh signal RFR according to the first modified example.

7. Seventh Embodiment

7.1 Configuration of Bistable Circuit

Figure 43:
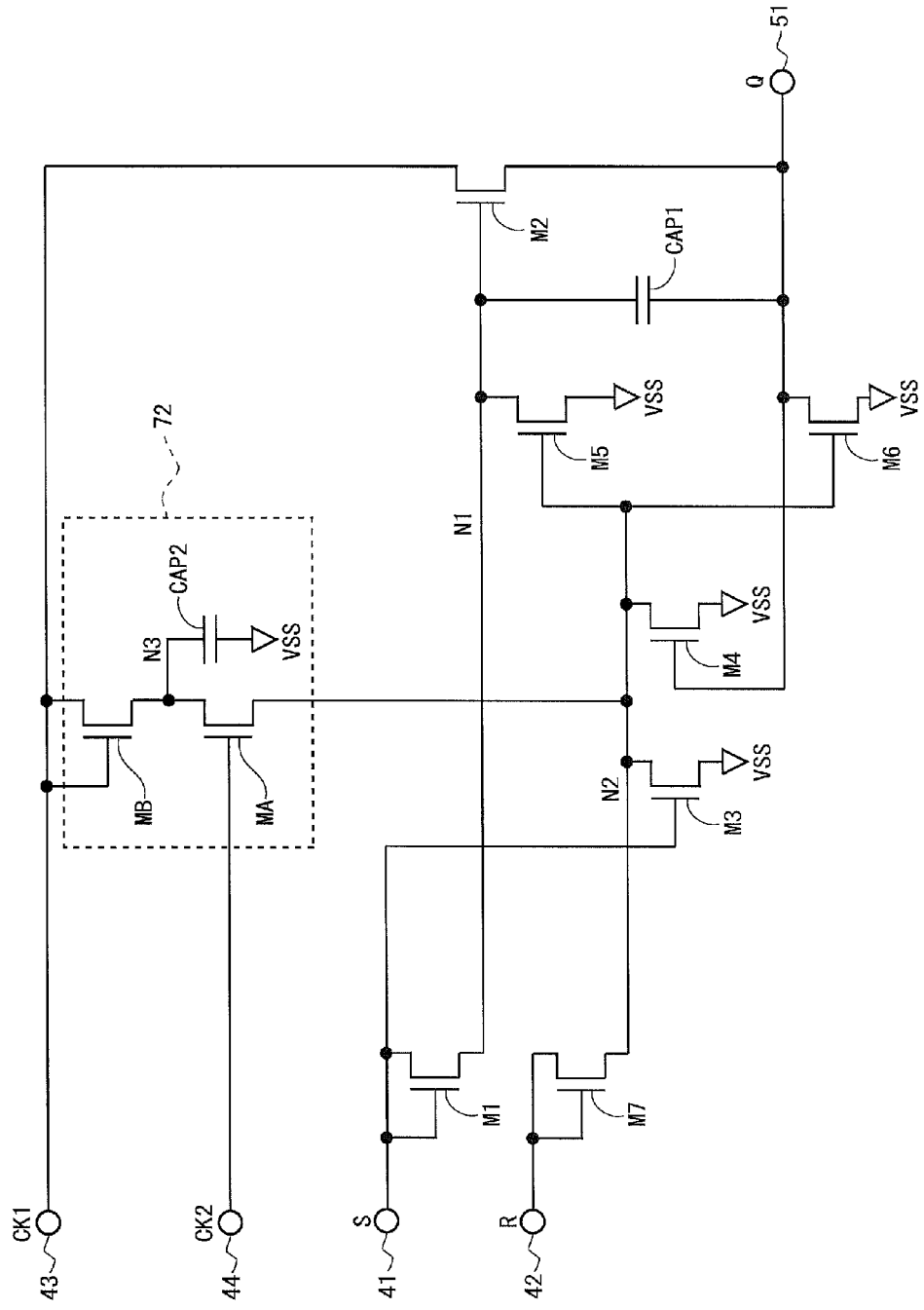
FIG. 43 is a circuit diagram showing a configuration of a bistable circuit according to a seventh embodiment of the present invention.
Figure 44:
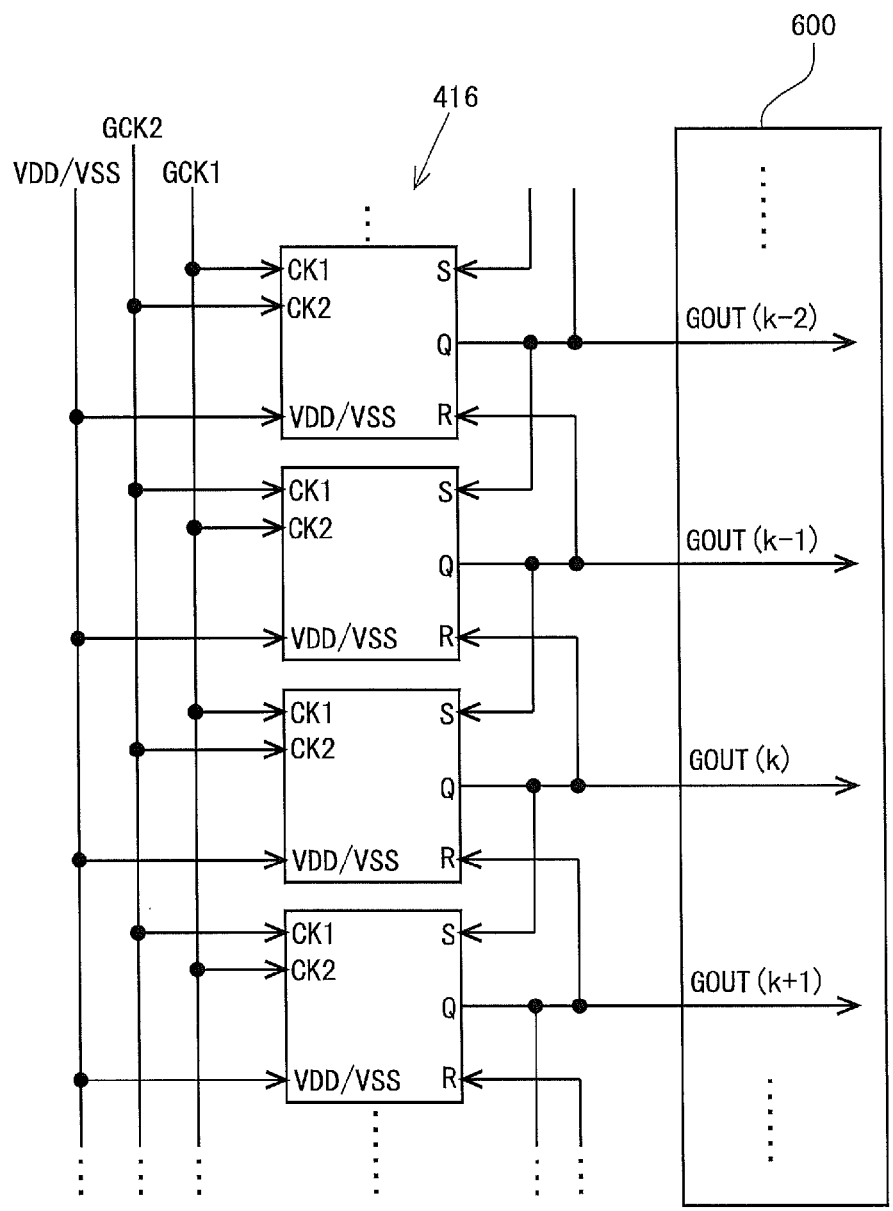
FIG. 44 is a block diagram showing a configuration of a shift register within a gate driver according to the seventh embodiment.

FIG. 43 is a circuit diagram showing a configuration of a bistable circuit according to a seventh embodiment of the present invention. In this embodiment, the gate terminal of the thin-film transistor MA is connected to the input terminal 44, and the gate terminal and the drain terminal of the thin-film transistor MB are connected to the input terminal 43. Specifically, the gate terminal of the thin-film transistor MA is supplied with the second clock for operation control CK2, and the gate terminal and the drain terminal of the thin-film transistor MB are supplied with the first clock for operation control CK1, similarly to the drain terminal of the thin-film transistor M2. As described above, a charge replenishment circuit 72 according to this embodiment is configured differently from the charge replenishment circuit 71 according to the first to the sixth embodiment. When the configuration illustrated in FIG. 43 is employed, a shift register 416 is configured as illustrated in FIG. 44, as the first clock for operation control CK1 and the second clock for operation control CK2 are sufficient as clock signals to be supplied to each bistable circuit.

7.2 Operation of Bistable Circuit

Figure 45:
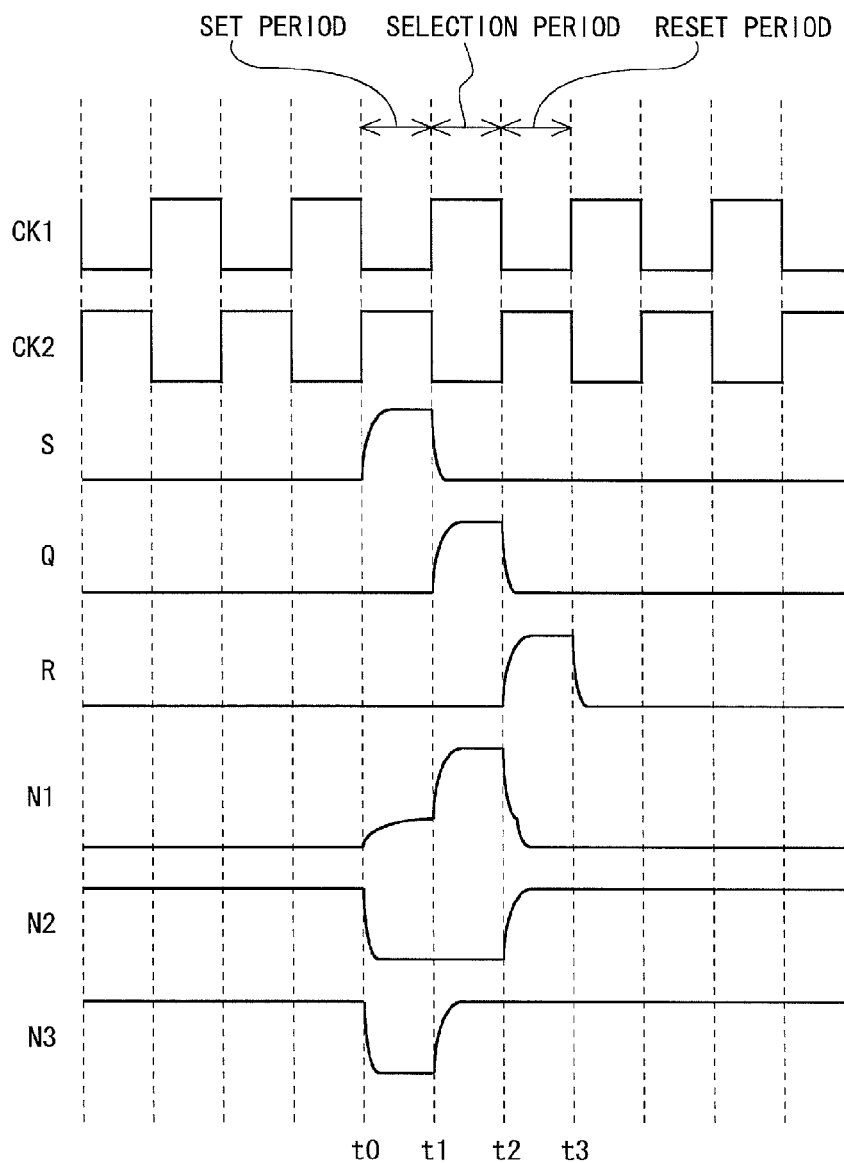
FIG. 45 is a signal waveform diagram for illustration of an operation of the bistable circuit according to the seventh embodiment.

Next, an operation of the bistable circuit according to this embodiment will be described with reference to FIG. 43 and FIG. 45. Here, in FIG. 45, a period from time t1 to time t2 corresponds to the selection period.

During the normal operation period (periods before time t0 and after time t3), similarly to the first embodiment, the potential of the first-node N1 and the potential of the state signal Q are maintained at the low level. Further, in the normal operation period, the first clock for operation control CK1 and the second clock for operation control CK2 are turned to the high level alternately every single horizontal scanning period. With this, the thin-film transistor MA and the thin-film transistor MB are alternately turned to the ON state. When the thin-film transistor MB is in the ON state, the capacitor CAP2 is charged. By contrast, when the thin-film transistor MA is in the ON state, the electric charge accumulated in the capacitor CAP2 is supplied to the second-node N2. Accordingly, even when the potential of the second-node N2 decreases due to a current leakage at a thin-film transistor (e.g., the thin-film transistor M3), the potential of the second-node N2 increases during a period in which the second clock for operation control CK2 is at the high level. Therefore, in the normal operation period, the potential of the second-node N2 is reliably maintained at the high level.

In the set period (period from time t0 to time t1), similarly to the first embodiment, the potential of the first-node N1 changes from the low level to the high level, the potential of the state signal Q is maintained at the low level, and the potential of the second-node N2 changes from the high level to the low level. In the set period, as the second clock for operation control CK2 is at the high level, the thin-film transistor MA is turned to the ON state. At this time, as the thin-film transistor M3 is in the ON state, the capacitor CAP2 is fully discharged and the potential of the third-node N3 decreases down to the low level, unlike the normal operation period.

In the selection period (period from time t1 to time t2), similarly to the first embodiment, the potential of the state signal Q increases up to a level sufficient for turning a gate bus line connected to the output terminal 51 of this bistable circuit to the selected state. Further, in the selection period, the thin-film transistor MA is turned to the OFF state as the second clock for operation control CK2 changes from the high level to the low level, and the thin-film transistor MB is turned to the ON state as the first clock for operation control CK1 changes from the low level to the high level. With this, the capacitor CAP2 is charged, and the potential of the third-node N3 increases up to the high level.

In the reset period (period from time t2 to time t3), similarly to the first embodiment, the potential of the first-node N1 and the potential of the state signal Q decreases down to the low level.

7.3 Effects

According to this embodiment, a clock supplied to the drain terminal of the thin-film transistor M2 and a clock supplied to the gate terminal of the thin-film transistor MB are shared. Accordingly, it is possible to reduce a number of clock signals required for driving the shift register as compared to the first to the sixth embodiment. In addition, during the selection period in which the thin-film transistor M5 is to be reliably turned to the OFF state so that the potential of the first-node N1 is maintained at the high level, the thin-film transistor MA is turned to the OFF state as the second clock for operation control CK2 is turned to the low level. Accordingly, during the selection period, an electric charge is not supplied from the charge replenishment circuit 72 to the second-node N2. With this, the potential of the second-node N2 is reliably maintained at the low level during the selection period, and the stability of the circuit operation is improved.

Further, the thin-film transistor MA is turned to the ON state during the set period and the reset period, and the thin-film transistor MB is turned to the ON state and during the selection period, in the bistable circuits of all stages. As an electric charge is supplied to the second-node in the same manner in all of the bistable circuits, it is possible to suppress an occurrence of display unevenness.

8. Eighth Embodiment

8.1 Configuration of Bistable Circuit

Figure 46:
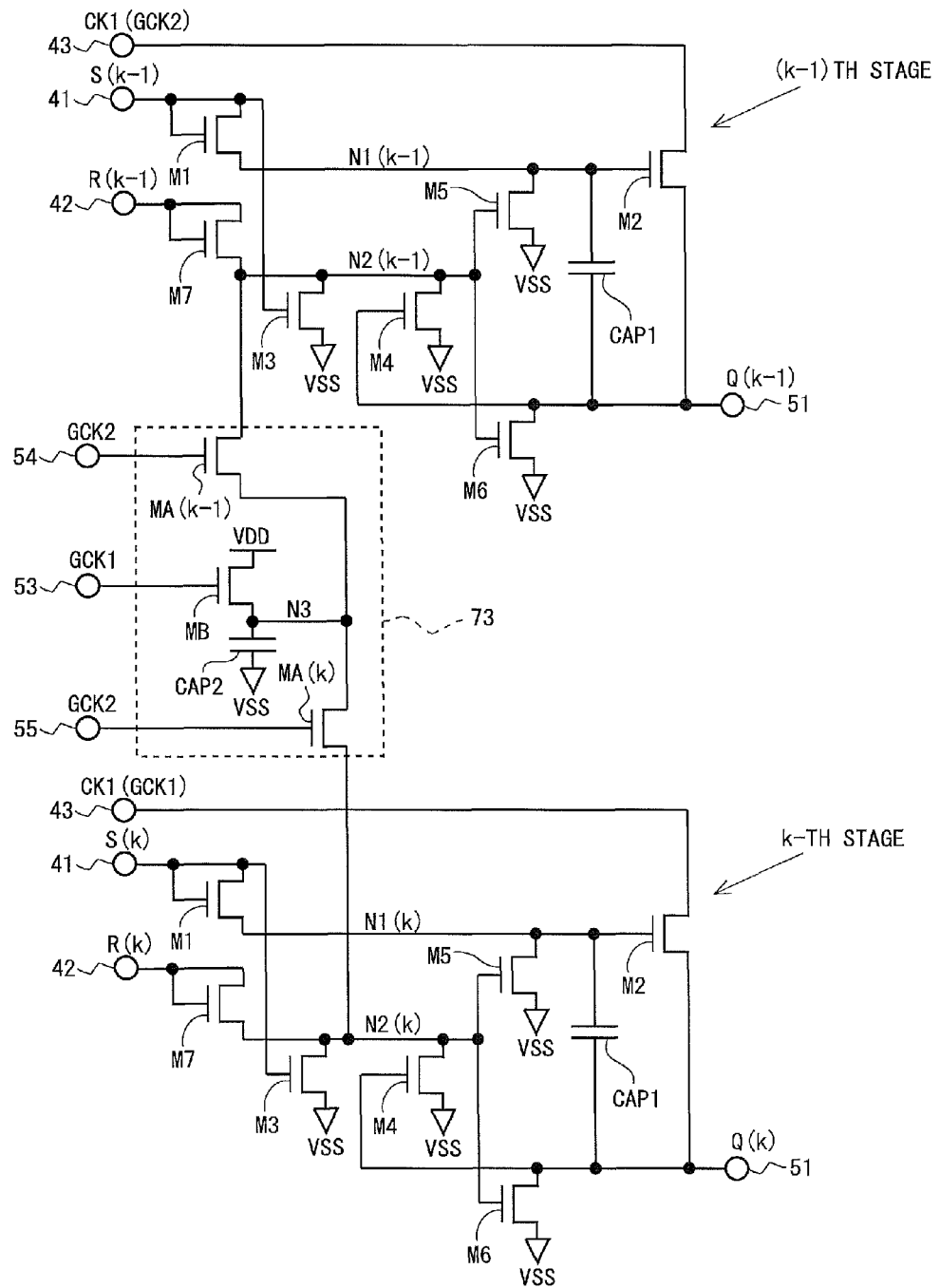
FIG. 46 is a circuit diagram showing a configuration of bistable circuits of two stages according to an eighth embodiment of the present invention.

FIG. 46 is a circuit diagram showing a configuration of bistable circuits of two stages according to an eighth embodiment of the present invention. Here, in FIG. 46, it is assumed that an upper one of the circuits is a (k−1) th stage bistable circuit and a lower one of the circuits is a k-th stage bistable circuit, where k is an even number. According to this embodiment, the drain terminal of the thin-film transistor MA of the (k−1) th stage (herein indicated by a reference numeral 'MA(k−1)') is connected to the drain terminal of the thin-film transistor MA of the k-th stage (herein indicated by a reference numeral 'MA(k)'), and the thin-film transistor MB and the capacitor CAP2 are shared between the (k−1) th stage and the k-th stage. Specifically, in this embodiment, a charge replenishment circuit 73 including the thin-film transistor MA(k−1), the thin-film transistor MA(k), the thin-film transistor MB, and the capacitor CAP2 is formed using an odd-numbered stage and even-numbered stage. It should be noted that in FIG. 46, an input terminal connected to the gate terminal of the thin-film transistor MB is indicated by a reference numeral 53, an input terminal connected to the gate terminal of the thin-film transistor MA(k−1) is indicated by a reference numeral 54, and an input terminal connected to the gate terminal of the thin-film transistor MA(k) is indicated by a reference numeral 55.

As illustrated in FIG. 46, the input terminal 43 of the (k−1)th stage is supplied with the second gate clock signal GCK2 as the first clock for operation control CK1, and the input terminal 43 of the k-th stage is supplied with the first gate clock signal GCK1 as the first clock for operation control CK1. Further, the input terminal 53 is supplied with the first gate clock signal GCK1, the input terminal 54 is supplied with the second gate clock signal GCK2, and the input terminal 55 is supplied with the second gate clock signal GCK2.

As described above, in this embodiment, a bistable circuit of the odd-numbered stage and a bistable circuit of the even-numbered stage constitute a single bistable-circuit pair.

8.2 Operation of Bistable Circuit

Figure 47:
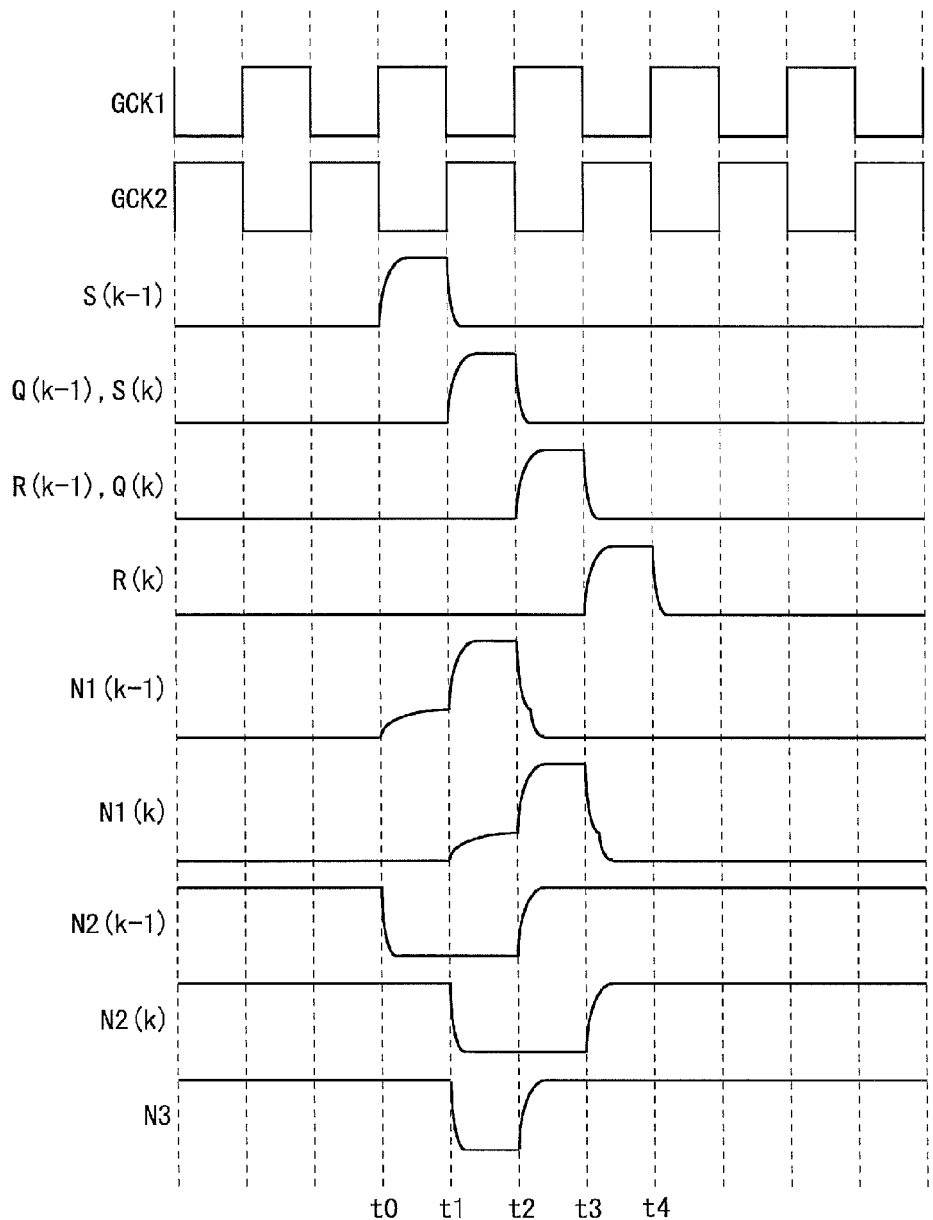
FIG. 47 is a signal waveform diagram for illustration of an operation of the bistable circuit according to the eighth embodiment.

Next, an operation of the bistable circuits according to this embodiment will be described with reference to FIG. 46 and FIG. 47. In FIG. 47, a period from time t0 to time t1 corresponds to the set period of the (k−1)th stage, a period from time t1 to time t2 corresponds to the selection period of the (k−1)th stage and the set period of the k-th stage, a period from time t2 to time t3 corresponds to the reset period of the (k−1)th stage and the selection period of the k-th stage, and a period from time t3 to time t4 corresponds to the reset period of the k-th stage.

During periods before time t0 and after time t4, the potential of the second-node is maintained at the high level in both the (k−1)th stage and the k-th stage. Accordingly, the thin-film transistors M5 and M6 are in the ON state in both the (k−1)th stage and the k-th stage. As there is a parasitic capacitance between the gate and the drain of the thin-film transistor M2, a noise is generated at the first-node in each of the (k−1)th stage and the k-th stage due to fluctuation of a waveform of the second gate clock signal GCK2 in the (k−1)th stage and due to fluctuation of a waveform of the first gate clock signal GCK1 in the k-th stage. However, as the thin-film transistor M5 is in the ON state, the potential of the first-node is pulled to the low level. Further, a noise also occurs in the state signal Q (the output terminal 51) due to the noise generated at the first-node or the fluctuation of the video signal voltage. However, as the thin-film transistor M6 is in the ON state, the potential of the state signal Q is pulled to the low level. Thus, the potential of the first-node and the potential of the state signal Q are maintained at the low level both in the (k−1) th stage and the k-th stage during this period.

Further, the thin-film transistor MB is in the ON state during the period in which the first gate clock signal GCK1 is at the high level, and the thin-film transistor MA(k−1) and the thin-film transistor MA(k) are in the ON state during the period in which the second gate clock signal GCK2 is at the high level. When the thin-film transistor MB is in the ON state, the capacitor CAP2 is charged. By contrast, when the thin-film transistor MA(k−1) and the thin-film transistor MA(k) are in the ON state, the electric charge accumulated in the capacitor CAP2 is supplied to the second-nodes in the (k−1)th stage and the k-th stage. Accordingly, both in the (k−1)th stage and the k-th stage, even when the potential of the second-node decreases due to a current leakage at a thin-film transistor (e.g., the thin-film transistor M3), the potential of the second-node N2 increases during a period in which the second gate clock signal GCK2 is at the high level. Therefore, in the periods before time t0 and after time t4, the potential of the second-node N2 is reliably maintained at the high level both in the (k−1)th stage and the k-th stage.

At time t0, a set signal S(k−1) of the (k−1)th stage changes from the low level to the high level. With this, in the (k−1)th stage, similarly to the first embodiment, the potential of the first-node N1(k−1) changes from the low level to the high level, the potential of the state signal Q(k−1) is maintained at the low level, and the potential of the second-node N2(k−1) changes from the high level to the low level. It should be noted that during the period from time t0 to time t1, as the thin-film transistor MA(k−1) and the thin-film transistor MA(k) are in the OFF state and the thin-film transistor MB is in the ON state, the potential of the third-node N3 is maintained at the high level.

At time t1, a set signal S(k) of the k-th stage changes from the low level to the high level. With this, in the (k)th stage, similarly to the first embodiment, the potential of the first-node N1(k) changes from the low level to the high level, the potential of the state signal Q(k) is maintained at the low level, and the potential of the second-node N2(k) changes from the high level to the low level. In addition, at time t1, in the (k−1)th stage, similarly to the first embodiment, the potential of the state signal Q(k−1) increases up to a level sufficient for turning a gate bus line connected to the output terminal 51 to the selected state, as the second gate clock signal GCK2 changes from the low level to the high level and the set signal S (k−1) of the (k−1)th stage changes from the high level to the low level. Additionally, during the period from time t1 to time t2, as the second gate clock signal GCK2 is at the high level, the thin-film transistor MA(k−1) and the thin-film transistor MA(k) are turned to the ON state. At this time, as the potential of the state signal Q(k−1) of the (k−1) th stage is at the high level, the thin-film transistor M4 of the (k−1) th stage is in the ON state. Therefore, the capacitor CAP2 is fully discharged, and the potential of the third-node N3 decreases down to the low level.

At time t2, in the k-th stage, similarly to the first embodiment, the potential of the state signal Q(k) increases up to a level sufficient for turning a gate bus line connected to the output terminal 51 to the selected state, as the first gate clock signal GCK1 changes from the low level to the high level and the set signal S(k) of the k-th stage changes from the high level to the low level. In addition, at time t2, in the (k−1)th stage, similarly to the first embodiment, the potential of the first-node N1(k−1) and the potential of the state signal Q(k−1) decrease down to the low level, as the second gate clock signal GCK2 changes from the high level to the low level and the reset signal of the (k−1)th stage changes from the low level to the high level. Additionally, at time t2, the capacitor CAP2 is charged and the potential of the third-node N3 increases up to the high level, as the thin-film transistor MA(k−1) and the thin-film transistor MA(k) are turned to the OFF state and the thin-film transistor MB is turned to the ON state.

At time t3, in the k-th stage, similarly to the first embodiment, the potential of the first-node N1(k) and the potential of the state signal Q(k) decrease down to the low level, as the first gate clock signal GCK1 changes from the high level to the low level, and the reset signal of the k-th stage changes from the low level to the high level.

8.3 Effects

In this embodiment, a bistable circuit of the odd-numbered stage and a bistable circuit of the even-numbered stage constitute a bistable-circuit pair, and the thin-film transistor MA(k−1), the thin-film transistor MA(k), the thin-film transistor MB, and the capacitor CAP2 constitute a single charge replenishment circuit 73 in each bistable-circuit pair (i.e., bistable circuits of two stages). In the first to the seventh embodiment, the thin-film transistor MA, the thin-film transistor MB, and the capacitor CAP2 are required to constitute a charge replenishment circuit for a bistable circuit of a single stage. Thus, according to this embodiment, it is possible to supply an electric charge to the second-node N2 every predetermined period and to improve the stability of the circuit operation using a smaller number of elements as compared to the first to the seventh embodiment. As the number of necessary elements is reduced in this manner, it is possible to obtain effects such as an improvement of a yield ratio and reduction of an area for mounting.

8.4 Modified Example

Figure 48:
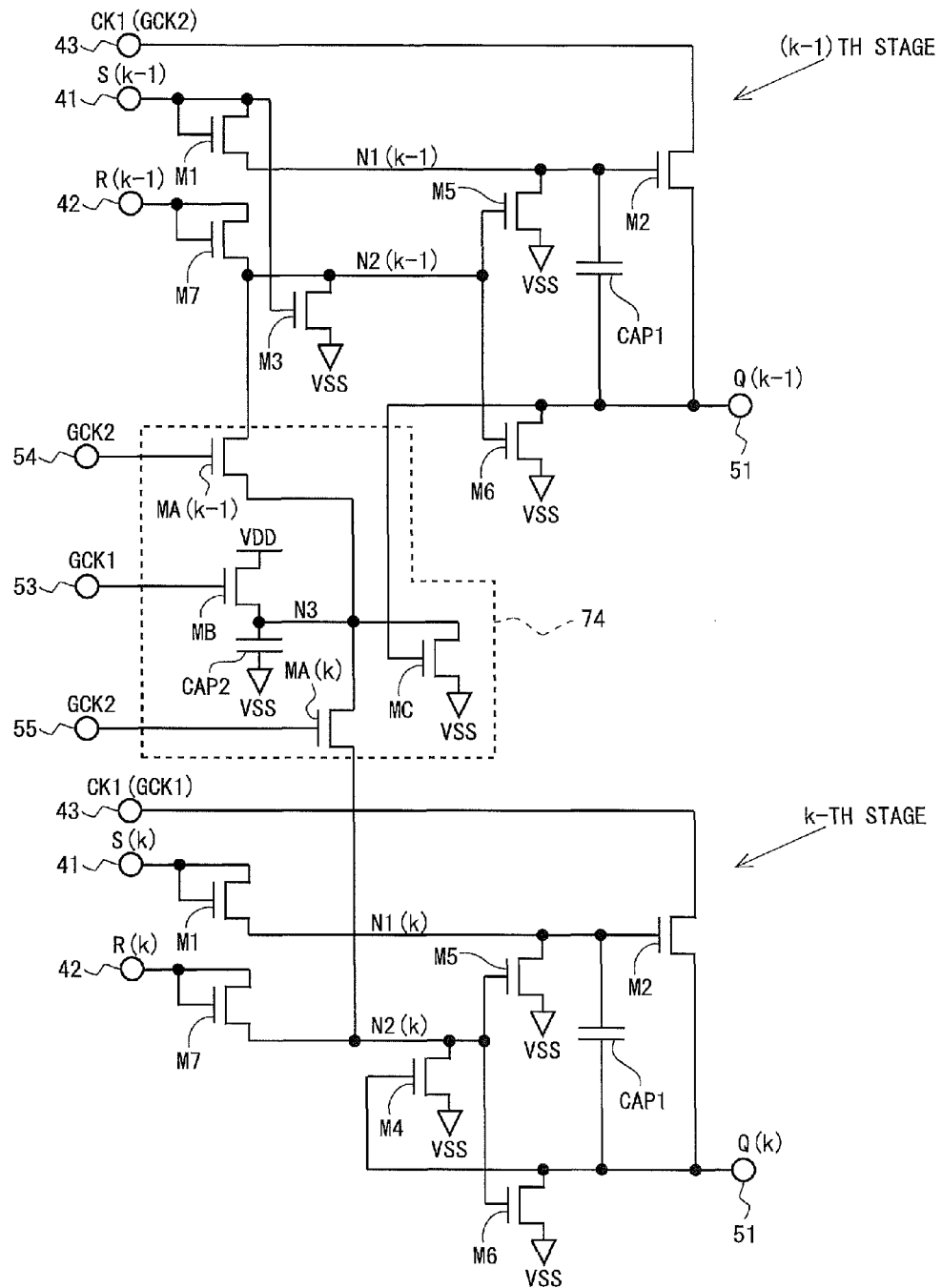
FIG. 48 is a circuit diagram showing a configuration of bistable circuits of two stages according to a modified example of the eighth embodiment.

FIG. 48 is a circuit diagram showing a configuration of bistable circuits of two stages according to a modified example of the eighth embodiment. In this modified example, a charge replenishment circuit 74 is provided with a thin-film transistor MC, in addition to the components of the eighth embodiment illustrated in FIG. 46. For the thin-film transistor MC, a gate terminal is connected to the output terminal 51 of the (k−1)th stage, a drain terminal is connected to the third-node N3, and a source terminal is connected to the input terminal for the DC power supply potential VSS. The thin-film transistor MC functions so as to change the potential of the third-node N3 to the VSS potential when the potential of the state signal Q (k−1) of the (k−1) th stage is at the high level. The thin-film transistor MC realizes a fourth second-node turnon switching element. In addition, in this modified example, the (k−1) th stage is not provided with the thin-film transistor M4, and the k-th stage is not provided with the thin-film transistor M3.

In the meantime, according to the eighth embodiment (see FIG. 46), during the period from time t1 to time t2, in the (k−1) th stage, the potential of the second-node N2(k−1) is maintained at the low level by the potential of the state signal Q(k−1) being turned to the high level and the thin-film transistor M4 being turned to the ON state. In addition, during this period, in the k-th stage, the potential of the second-node N2(k) changes from the high level to the low level by the set signal S(k) being turned to the high level and the thin-film transistor M3 being turned to the ON state.

By contrast, in this modified example, during the period from time t1 to time t2 (see FIG. 47), the thin-film transistor MC is turned to the ON state as the potential of the state signal Q (k−1) of the (k−1) th stage is at the high level. In addition, during this period, as the first gate clock signal GCK1 is at the low level and the second gate clock signal GCK2 is at the high level, the thin-film transistor MA(k−1) and the thin-film transistor MA(k) are turned to the ON state and the thin-film transistor MB is turned to the OFF state. By the thin-film transistor MA(k−1) being turned to the ON state, by the thin-film transistor MB being turned to the OFF state, and by the thin-film transistor MC being turned to the ON state, the potential of the second-node N2(k−1) of the (k−1)th stage is maintained at the low level. Additionally, by the thin-film transistor MA(k) being turned to the ON state, by the thin-film transistor MB being turned to the OFF state, and by the thin-film transistor MC being turned to the ON state, the potential of the second-node N2(k) of the k-th stage changes from the high level to the low level.

As described above, according to this embodiment, only by providing the thin-film transistor MC in addition to the components of the eighth embodiment, the potential of the second-node N2(k−1) can be maintained at the low level during the selection period without providing the thin-film transistor M4 in the (k−1)th stage, and the potential of the second-node N2(k) can be decreased down to the low level during the set period without providing the thin-film transistor M3 in the k-th stage. Thus, it is possible to supply an electric charge to the second-node N2 every predetermined period and to improve the stability of the circuit operation using a further smaller number of elements as compared to the eighth embodiment.

9. Ninth Embodiment

9.1 Configuration of Bistable Circuit

Figure 49:
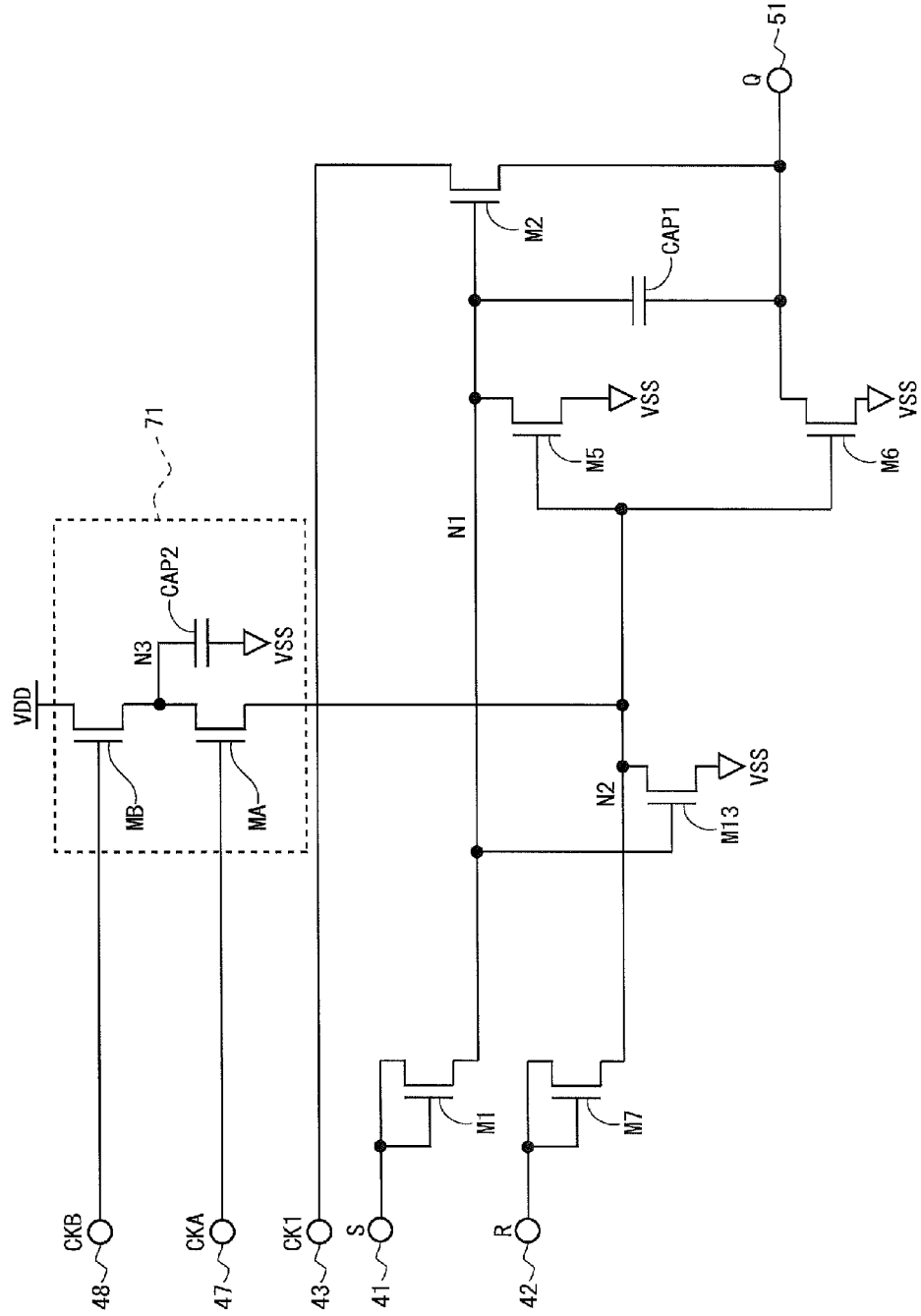
FIG. 49 is a circuit diagram showing a configuration of a bistable circuit according to a ninth embodiment of the present invention.
Figure 50:
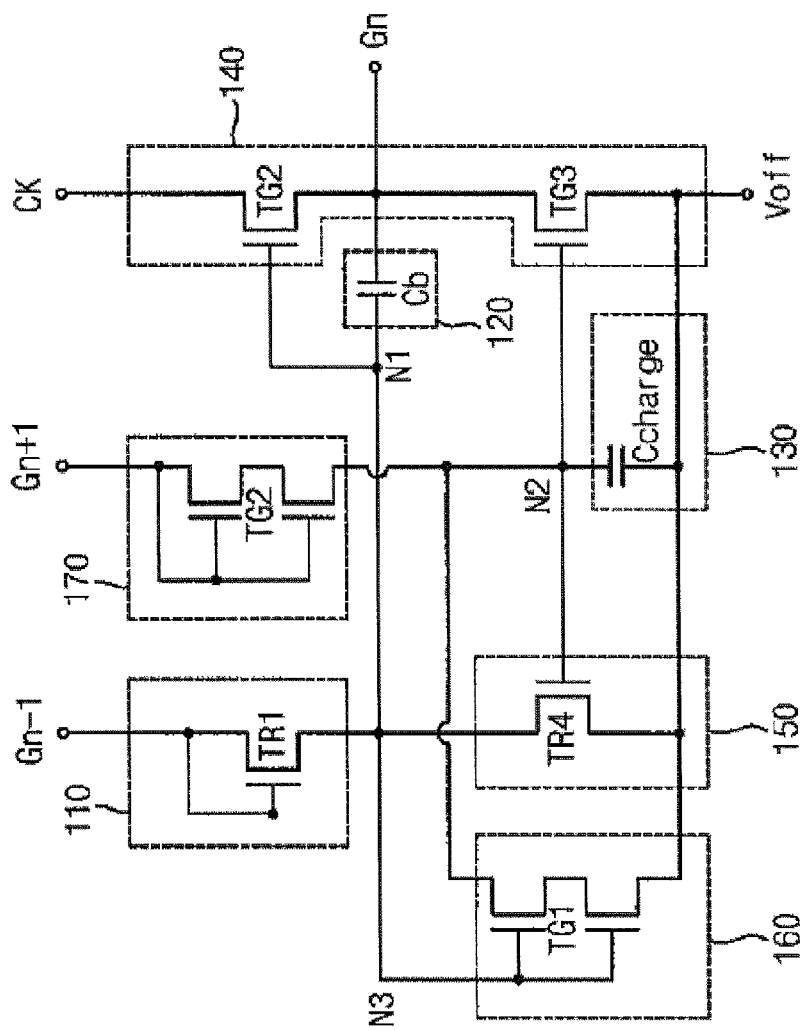
FIG. 50 is a circuit diagram showing one example of a configuration of a bistable circuit included in a shift register according to the conventional display device.
Figure 51:
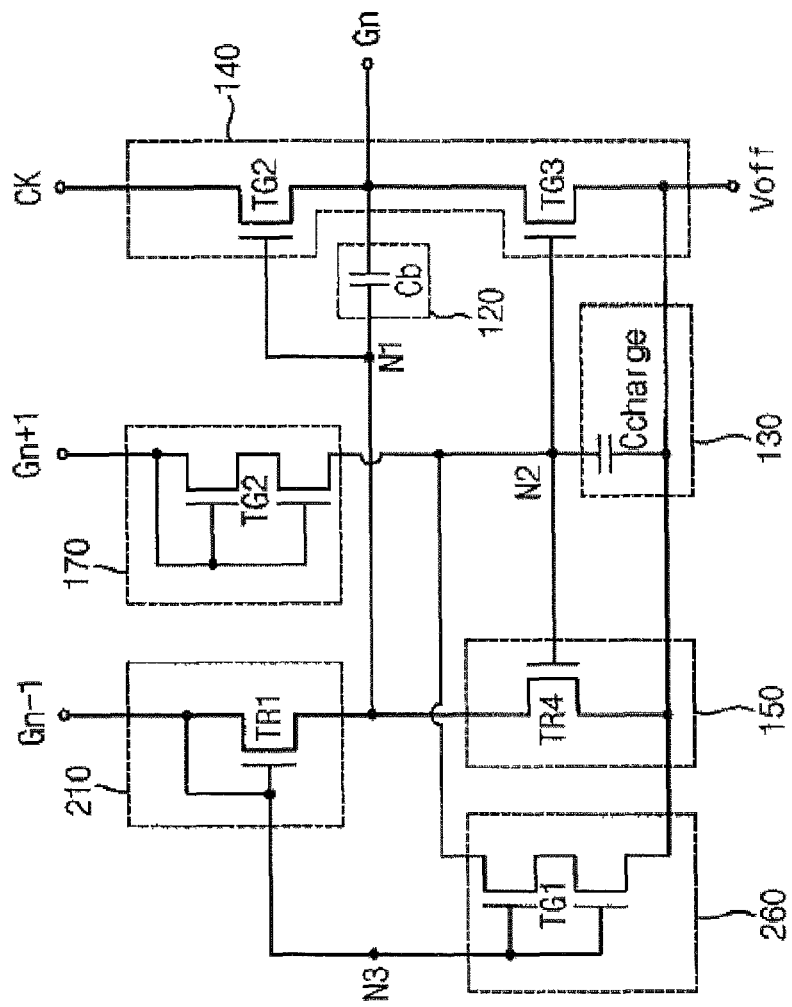
FIG. 51 is a circuit diagram showing another example of the configuration of the bistable circuit included in the shift register according to the conventional display device.

FIG. 49 is a circuit diagram showing a configuration of a bistable circuit according to a ninth embodiment of the present invention. Here, an overall configuration and an operation of a liquid crystal display device and a configuration and an operation of a gate driver are the same as those in the first embodiment, and therefore descriptions for these are omitted.

Unlike such as the first embodiment (see FIG. 1), in this embodiment, the bistable circuit is provided with a thin-film transistor M13 as a component for change the potential of the second-node N2 to the VSS potential. For the thin-film transistor M13, a gate terminal is connected to the first-node N1, a drain terminal is connected to the second-node N2, and a source terminal is connected to the input terminal for the DC power supply potential VSS. The thin-film transistor M13 changes the potential of the second-node N2 to the VSS potential when the potential of the first-node N1 is at the high level. The thin-film transistor M13 realizes a third second-node turnon switching element.

9.2 Effects

According to this embodiment, the gate terminal of the thin-film transistor M13 is supplied with the potential of the first-node N1. Accordingly, the thin-film transistor M13 is turned to the ON state during the set period and the selection period (see FIG. 6). With this, the potential of the second-node N2 is reliably turned to the low level during the set period and the selection period, and the stability of the circuit operation is improved.

10. Others

While the above embodiments have been described taking the liquid crystal display device as an example, the present invention is not limited to this. The present invention can be applied to display devices such as organic EL (Electro Luminescence).

DESCRIPTION OF REFERENCE CHARACTERS

40(1)-40(i): Bistable Circuit
41-48: Input Terminal (of Bistable Circuit)
51, 52: Output Terminal (of Bistable Circuit)
71-74: Charge Replenishment Circuit
300: Source Driver (Video Signal Line Drive Circuit)
400: Gate Driver (Scanning Signal Line Drive Circuit)
410-417: Shift Register
600: Display Unit
CAP1, CAP2: Capacitor (Capacitative Element)
M1-M13, MA, MB, MC: Thin-Film Transistor
N1, N2, N3: First-Node, Second-Node, Third-Node
GL1-Gli: Gate Bus Line
SL1-Slj: Source Bus Line
GCK1-GCK4: First Gate Clock Signal to Fourth Gate Clock Signal
CK1, CK2: First Clock for Operation Control, Second Clock for Operation Control
CKA, CKB: First Clock for Charge Replenishment, Second Clock for Charge Replenishment
S: Set Signal
R: Reset Signal
Q: State Signal
Z: Different Stage Control Signal
GOUT: Scanning Signal
VDD: High-Level DC Power Supply Potential
VSS: Low-Level DC Power Supply Potential

The invention claimed is:

1. A scanning signal line drive circuit of a display device, that drives a plurality of scanning signal lines which are arrayed in a display unit, the circuit comprising:
   a shift register having a plurality of bistable circuits connected in series with each other, outputted signals from the plurality of bistable circuits being sequentially driven active based on a plurality of clock signals that are externally inputted and cyclically repeat a first level and a second level, wherein
   each bistable circuit includes:
      a first-input-node configured to receive an outputted signal from a bistable circuit of a stage before the each bistable circuit as a set signal;
      a first-output-node connected to the scanning signal line and configured to output an outputted signal from the each bistable circuit as a scanning signal for driving the scanning signal line;
      a first output control switching element having a second electrode supplied with one of the plurality of clock signals as a first clock for operation control and a third electrode connected to the first-output-node;
      a first-node turnon switching element configured to change a level of a first-node to an ON level based on the set signal, the first-node being connected to a first electrode of the first output control switching element;
      at least one of a first first-node turnoff switching element and a first first-output-node turnoff switching element, the first first-node turnoff switching element having a second electrode connected to the first-node and being configured to change the level of the first-node to an OFF level, the first first-output-node turnoff switching element having a second electrode connected to the first-output-node, having a third electrode supplied with an OFF level potential, and being configured to change a level of the first-output-node to the OFF level;

a second-node turnoff switching element having a second electrode connected to a second-node, having a third electrode supplied with an OFF level potential, and configured to turn the second-node to the OFF level during a period in which the first-node is to be maintained at the ON level, the second-node being connected to a first electrode of at least one of the first first-node turnoff switching element and the first first-output-node turnoff switching element;

a first charge replenishment switching element having a first electrode supplied with one of the plurality of clock signals as a first clock for charge replenishment and having a third electrode connected to the second-node;

a capacitative element having one end connected to a third-node connected to a second electrode of the first charge replenishment switching element; and a second charge replenishment switching element having a third electrode connected to the third-node, having a first electrode supplied with one of the plurality of clock signals as a second clock for charge replenishment, and configured to charge the capacitative element based on the second clock for charge replenishment, the first charge replenishment switching element is turned to an ON state when the first clock for charge replenishment is at the first level, the second charge replenishment switching element is turned to an ON state when the second clock for charge replenishment is at the first level, and when the first clock for charge replenishment is at the first level, the second clock for charge replenishment is at the second level.

2. The scanning signal line drive circuit according to claim 1, wherein
each bistable circuit includes, as the second-node turnoff switching element:
a first second-node turnoff switching element having a first electrode connected to the first-input-node, a second electrode connected to the second-node, and a third electrode supplied with an OFF level potential; and
a second second-node turnoff switching element having a first electrode connected to the first-output-node, a second electrode connected to the second-node, and a third electrode supplied with an OFF level potential.

3. The scanning signal line drive circuit according to claim 1, wherein
each bistable circuit includes, as the second-node turnoff switching element, a third second-node turnoff switching element having a first electrode connected to the first-node, a second electrode connected to the second-node, and a third electrode supplied with an OFF level potential.

4. The scanning signal line drive circuit according to claim 1, wherein
each bistable circuit further includes:
a second-input-node configured to receive an outputted signal from a bistable circuit of a stage after the each bistable circuit as a reset signal; and
a first second-node turnon switching element configured to change a level of the second-node to the ON level based on the reset signal.

5. The scanning signal line drive circuit according to claim 1, wherein
in each bistable circuit, a potential of the second-node is maintained at a substantially constant potential based on a high-level DC power supply potential during a period in which the first-node is to be maintained at the OFF level.

6. The scanning signal line drive circuit according to claim 1, wherein
each bistable circuit includes the first first-node turnoff switching element, and
a third electrode of the first first-node turnoff switching element is connected to the first-output-node.

7. The scanning signal line drive circuit according to claim 1, wherein
each bistable circuit further includes:
a second-input-node configured to receive an outputted signal from a bistable circuit of a stage after the each bistable circuit as a reset signal; and
a second first-output-node turnoff switching element having a first electrode connected to the second-input-node, a second electrode connected to the first-output-node, and a third electrode supplied with an OFF level potential.

8. The scanning signal line drive circuit according to claim 1, wherein
each bistable circuit further includes:
a second-input-node configured to receive an outputted signal from a bistable circuit of a stage after the each bistable circuit as a reset signal; and
a second first-node turnoff switching element having a first electrode connected to the second-input-node, a second electrode connected to the first-node, and a third electrode supplied with an OFF level potential.

9. The scanning signal line drive circuit according to claim 1, wherein
the first-node turnon switching element is a thin-film transistor having a multichannel structure.

10. The scanning signal line drive circuit according to claim 1, wherein
each bistable circuit includes the first first-node turnoff switching element, and
the first first-node turnoff switching element is a thin-film transistor having a multichannel structure.

11. The scanning signal line drive circuit according to claim 1, wherein
each bistable circuit further includes:
a second-input-node configured to receive an outputted signal from a bistable circuit of a stage after the each bistable circuit as a reset signal;
a second-output-node configured to output an outputted signal from the each bistable circuit as a different stage control signal for controlling an operation of a bistable circuit other than the each bistable circuit; and
a second output control switching element having a first electrode connected to the first-node, a second electrode connected to the second electrode of the first output control switching element, and a third electrode connected to the second-output-node, wherein
the different stage control signal outputted from each bistable circuit is supplied to a bistable circuit of a stage before the each bistable circuit as the reset signal.

12. The scanning signal line drive circuit according to claim 11, wherein
each bistable circuit further includes:
a second-input-node configured to receive an outputted signal from a bistable circuit of a stage after the each bistable circuit as a reset signal; and
a first second-node turnon switching element configured to change a level of the second-node to the ON level based on the reset signal, wherein
a second electrode of the first second-node turnon switching element is supplied with one of the plurality of clock signals that is different from a signal supplied to the second electrode of the first output control switching element.

13. The scanning signal line drive circuit according to claim 11, wherein
the second electrode of the first output control switching element is supplied with a DC power supply potential in place of one of the plurality of clock signals.

14. The scanning signal line drive circuit according to claim 13, wherein
the following expression is satisfied, where an amplitude voltage of the plurality of clock signals is VCK, and a voltage of the scanning signal when the scanning signal line is driven taking a potential on a low level side of the plurality of clock signals as a reference is VGH $$VGH \geq VCK \geq VGH/2.$$

15. The scanning signal line drive circuit according to claim 1, wherein
each bistable circuit further includes:
a second-output-node configured to output an outputted signal from the each bistable circuit as a different stage control signal for controlling an operation of a bistable circuit other than the each bistable circuit; and
a second output control switching element having a first electrode connected to the first-node, a second electrode connected to the second electrode of the first output control switching element, and a third electrode connected to the second-output-node, wherein
the different stage control signal outputted from each bistable circuit is supplied to a bistable circuit of a stage after the each bistable circuit as the set signal.

16. The scanning signal line drive circuit according to claim 1, wherein
each bistable circuit further includes:
a third-input-node configured to receive a signal externally supplied as a clear signal; and
a second second-node turnon switching element configured to change a level of the second-node to the ON level based on the clear signal.

17. The scanning signal line drive circuit according to claim 16, wherein
each bistable circuit further includes:
a second-input-node configured to receive an outputted signal from a bistable circuit of a stage after the each bistable circuit as a reset signal; and
a first second-node turnon switching element configured to change the level of the second-node to the ON level based on the reset signal, wherein
a last stage bistable circuit out of the plurality of bistable circuits is supplied with the clear signal as the reset signal.

18. The scanning signal line drive circuit according to claim 16, wherein
each bistable circuit further includes:
a fourth-input-node configured to receive a signal externally supplied as a refresh signal; and
a second-node level lowering switching element configured to change the level of the second-node to a level lower than the OFF level based on the refresh signal.

19. The scanning signal line drive circuit according to claim 1, wherein
each bistable circuit further includes:
a third-input-node configured to receive a signal externally supplied as a clear signal;
a second second-node turnon switching element configured to change a level of the second-node to the ON level based on the clear signal; and
a second-node level lowering switching element configured to change the level of the second-node to a level lower than the OFF level based on the clear signal.

20. The scanning signal line drive circuit according to claim 1, wherein
depending on the clock signal inputted to each bistable circuit as the first clock for operation control, the clock signal inputted to the each bistable circuit as the first clock for charge replenishment and the clock signal inputted to the each bistable circuit as the second clock for charge replenishment are determined.

21. The scanning signal line drive circuit according to claim 20, wherein
the clock signal inputted to each bistable circuit as the first clock for operation control is inputted to the each bistable circuit as the second clock for charge replenishment, and a clock signal out of phase with the first clock for operation control by 180 degrees is inputted to the each bistable circuit as the first clock for charge replenishment.

22. The scanning signal line drive circuit according to claim 1, wherein
the plurality of bistable circuits are configured by a plurality of bistable-circuit pairs connected in series with each other, each bistable-circuit pair being constituted by two consecutive stages of bistable circuits, and
in the bistable-circuit pair,
the second electrode of the first charge replenishment switching element included in the bistable circuit of a previous stage is connected to the second electrode of the first charge replenishment switching element in the bistable circuit of a next stage,
the capacitative element and the second charge replenishment switching element are shared between the previous stage bistable circuit and the next stage bistable circuit.

23. The scanning signal line drive circuit according to claim 22, wherein
the previous stage bistable circuit in the bistable-circuit pair includes, as the second-node turnoff switching element, a first second-node turnoff switching element having a first electrode connected to the first-input-node, a second electrode connected to the second-node, and a third electrode supplied with an OFF level potential,
the next stage bistable circuit in the bistable-circuit pair includes, as the second-node turnoff switching element, a second second-node turnoff switching element having a first electrode connected to the first-output-node, a second electrode connected to the second-node, and a third electrode supplied with an OFF level potential, and the bistable-circuit pair includes a fourth second-node turnoff switching element having a first electrode connected to the first-output-node of the previous stage bistable circuit, a second electrode connected to the third-node, and a third electrode supplied with an OFF level potential.

24. The scanning signal line drive circuit according to claim 23, wherein
in the previous stage bistable circuit, a level of the second-node changes to the OFF level by the first charge replenishment switching element and the fourth second-node turnoff switching element being turned to the ON state during a period in which an outputted signal from this bistable circuit is active, and
in the next stage bistable circuit, the level of the second-node changes to the OFF level by the first charge replenishment switching element and the fourth second-node turnoff switching element being turned to the ON state during the period in which an outputted signal from the previous stage bistable circuit is active.

25. The scanning signal line drive circuit according to claim 1, wherein
all of the switching elements included in each bistable circuit are respectively constituted by thin-film transistors of an identical channel.

26. A display device, comprising:
the display unit; and
the scanning signal line drive circuit according to claim 1.

27. The scanning signal line drive circuit according to claim 1, wherein
each of the switching elements included in each bistable circuit is a thin-film transistor using IGZO for semiconductor layer.

28. A method of driving a plurality of scanning signal lines which are arrayed in a display unit by a scanning signal line drive circuit including a shift register, outputted signals from a plurality of bistable circuits being sequentially driven active based on a plurality of clock signals that are externally inputted and cyclically repeat a first level and a second level, the method comprising:
a first switching element control step of changing a state of a first switching element included in each bistable circuit; and
a second switching element control step of changing a state of a second switching element included in each bistable circuit,
wherein
each bistable circuit includes:
a first-input-node configured to receive an outputted signal from a bistable circuit of a stage before the each bistable circuit as a set signal;
a first-output-node connected to the scanning signal line and configured to output an outputted signal from the each bistable circuit as a scanning signal for driving the scanning signal line;
a first output control switching element having a second electrode supplied with one of the plurality of clock signals as a first clock for operation control and a third electrode connected to the first-output-node;
a first-node turnon switching element configured to change a level of a first-node to an ON level based on the set signal, the first-node being connected to a first electrode of the first output control switching element;
at least one of a first first-node turnoff switching element and a first first-output-node turnoff switching element, the first first-node turnoff switching element having a second electrode connected to the first-node and being configured to change the level of the first-node to the OFF level, the first first-output-node turnoff switching element having a second electrode connected to the first-output-node, having a third electrode supplied with an OFF level potential, and being configured to change a level of the first-output-node to the OFF level;
a second-node turnoff switching element having a second electrode connected to a second-node, having a third electrode supplied with an OFF level potential, and configured to turn the second-node to the OFF level during a period in which the first-node is to be maintained at the ON level, the second-node being connected to a first electrode of at least one of the first first-node turnoff switching element and the first first-output-node turnoff switching element;
the first switching element having a first electrode supplied with one of the plurality of clock signals as a first clock for charge replenishment and a third electrode connected to the second-node;
a capacitative element having one end connected to a third-node connected to a second electrode of the first switching element; and
the second switching element having a third electrode connected to the third-node, having a first electrode supplied with one of the plurality of clock signals as a second clock for charge replenishment, and configured to charge the capacitative element based on the second clock for charge replenishment,
the first switching element control step includes:
a first switching element turnon step of turning the first switching element to an ON state by turning the first clock for charge replenishment to the first level; and
a first switching element turnoff step of turning the first switching element to an OFF state by turning the first clock for charge replenishment to the second level,
the second switching element control step includes:
a second switching element turnon step of turning the second switching element to an ON state by turning the second clock for charge replenishment to the first level; and
a second switching element turnoff step of turning the second switching element to an OFF state by turning the second clock for charge replenishment to the second level,
during a period after the first switching element turnon step is performed until the first switching element turnoff step is performed, the second switching element turnon step and the second switching element turnoff step are not performed, and
during a period after the second switching element turnon step is performed until the second switching element turnoff step is performed, the first switching element turnon step and the first switching element turnoff step are not performed.

* * * * *